United States Patent [19]
Yamazaki et al.

[11] Patent Number: 5,897,347
[45] Date of Patent: *Apr. 27, 1999

[54] SEMICONDUCTOR, SEMICONDUCTOR DEVICE, AND METHOD FOR FABRICATING THE SAME

[75] Inventors: Shunpei Yamazaki, Tokyo; Yasuhiko Takemura, Kanagawa; Hongyong Zhang, Kanagawa; Toru Takayama, Kanagawa; Hideki Uochi, Atsugi, all of Japan

[73] Assignee: Semiconductor Energy Laboratory Co., Ltd., Kanagawa, Japan

[ * ] Notice: This patent issued on a continued prosecution application filed under 37 CFR 1.53(d), and is subject to the twenty year patent term provisions of 35 U.S.C. 154(a)(2).

This patent is subject to a terminal disclaimer.

[21] Appl. No.: 08/718,895

[22] Filed: Sep. 24, 1996

Related U.S. Application Data

[62] Division of application No. 09/196,856, Feb. 15, 1994, Pat. No. 5,639,698.

[30] Foreign Application Priority Data

Feb. 15, 1993 [JP] Japan ................................ 5-48531
Feb. 15, 1993 [JP] Japan ................................ 5-48533
Feb. 15, 1993 [JP] Japan ................................ 5-485354

[51] Int. Cl.$^6$ .......................... H01L 21/00; H01L 21/322
[52] U.S. Cl. .......................................... 438/166; 438/477
[58] Field of Search ................................ 437/10, 11, 13, 437/40; 148/DIG. 1, DIG. 3, DIG. 16, DIG. 24, DIG. 60–61, DIG. 91–93; 117/8, 930; 438/166, 477

[56] References Cited

U.S. PATENT DOCUMENTS

| Re. 28,385 | 4/1975 | Mayer | 437/13 |
|---|---|---|---|
| Re. 28,386 | 4/1975 | Heiman et al. | 437/13 |
| 3,783,049 | 1/1974 | Sandera | 437/142 |
| 4,231,809 | 11/1980 | Schmidt | 437/13 |
| 5,010,037 | 4/1991 | Lin et al. | 117/930 |

(List continued on next page.)

FOREIGN PATENT DOCUMENTS

| 62-33417 | 2/1987 | Japan | 117/930 |
|---|---|---|---|
| 2140915 | 5/1990 | Japan | 437/21 |
| 5-58789 | 3/1993 | Japan | 117/930 |
| 5-190020 | 11/1993 | Japan | 117/930 |

OTHER PUBLICATIONS

C. Hayzelden et al., "In Situ Transmission Electron Microscopy Studies of Silicide-Mediated Crystallization of Amorphous Silicon" ( 3 pages).

A.V. Dvurechenskii et al., "Transport Phenomena in Amorphous Silicon Doped by Ion Implantation of 3d Metsls", *Akademikian Lavrentev Prospekt* 13, 630090 Novosibirsk 90, USSR, pp. 635–640.

T. Hempel et al., "Needle-Like Crystallization of Ni Doped Amorphous Silicon Thin Films", *Solid State Communications*, vol. 85, No. 11, pp. 921–924, 1993.

(List continued on next page.)

*Primary Examiner*—Jey Tsai
*Assistant Examiner*—Michael S. Lebentritt
*Attorney, Agent, or Firm*—Sixbey, Friedman, Leedom & Ferguson, P.C.; Gerald J. Ferguson, Jr.; Jeffrey L. Costellia

[57] ABSTRACT

Method of fabricating semiconductor devices such as thin-film transistors by annealing a substantially amorphous silicon film at a temperature either lower than normal crystallization temperature of amorphous silicon or lower than the glass transition point of the substrate so as to crystallize the silicon film. Islands, stripes, lines, or dots of nickel, iron cobalt, or platinum, silicide, acetate, or nitrate of nickel, iron, cobalt, or platinum, film containing various salts, particles, or clusters containing at least one of nickel, iron, cobalt, and platinum are used as starting materials for crystallization. These materials are formed on or under the amorphous silicon film.

60 Claims, 22 Drawing Sheets

U.S. PATENT DOCUMENTS

| | | | |
|---|---|---|---|
| 5,075,259 | 12/1991 | Moran | 437/230 |
| 5,147,826 | 9/1992 | Liu et al. | 437/233 |
| 5,225,355 | 7/1993 | Sugino et al. | 437/13 |
| 5,244,819 | 9/1993 | Yue | 437/11 |
| 5,264,383 | 11/1993 | Young | 437/40 TFT |
| 5,275,851 | 1/1994 | Fonash et al. | 427/578 |
| 5,298,075 | 3/1994 | Lagendijk et al. | 134/2 |
| 5,300,187 | 4/1994 | Lesk et al. | 437/13 |
| 5,403,772 | 4/1995 | Zhang et al. . | |
| 5,422,311 | 6/1995 | Woo | 437/967 |
| 5,426,064 | 6/1995 | Zhang et al. . | |
| 5,481,121 | 1/1996 | Zhang et al. . | |
| 5,488,000 | 1/1996 | Zhang et al. . | |
| 5,492,843 | 2/1996 | Adachi et al. . | |
| 5,501,989 | 3/1996 | Takayama et al. . | |
| 5,508,533 | 4/1996 | Takemura . | |
| 5,529,937 | 6/1996 | Zhang et al. . | |
| 5,534,716 | 7/1996 | Takemura . | |
| 5,543,352 | 8/1996 | Ohtani et al. . | |
| 5,563,426 | 10/1996 | Zhang et al. . | |
| 5,569,610 | 10/1996 | Zhang et al. . | |
| 5,569,936 | 10/1996 | Zhang et al. . | |
| 5,580,792 | 12/1996 | Zhang et al. . | |
| 5,585,291 | 12/1996 | Ohtani et al. . | |
| 5,589,694 | 12/1996 | Takayama et al. . | |
| 5,595,923 | 1/1997 | Zhang et al. . | |
| 5,595,944 | 1/1997 | Zhang et al. . | |
| 5,604,360 | 2/1997 | Zhang et al. . | |
| 5,605,846 | 2/1997 | Ohtani et al. . | |
| 5,606,179 | 2/1997 | Yamazaki et al. . | |
| 5,608,232 | 3/1997 | Yamazaki et al. . | |
| 5,612,250 | 3/1997 | Ohtani et al. . | |
| 5,614,426 | 3/1997 | Funada et al. . | |
| 5,614,733 | 3/1997 | Zhang et al. . | |
| 5,616,506 | 4/1997 | Takemura . | |
| 5,620,910 | 4/1997 | Teramoto . | |
| 5,621,224 | 4/1997 | Yamazaki et al. . | |
| 5,624,851 | 4/1997 | Takayama et al. . | |
| 5,637,515 | 6/1997 | Takemura . | |
| 5,639,698 | 6/1997 | Yamazaki et al. . | |
| 5,643,826 | 7/1997 | Ohtani et al. . | |
| 5,646,424 | 7/1997 | Zhang et al. . | |
| 5,654,203 | 8/1997 | Ohtani et al. . | |
| 5,656,825 | 8/1997 | Kusumoto et al. . | |
| 5,663,077 | 9/1997 | Adachi et al. . | |
| 5,677,549 | 10/1997 | Takayama et al. . | |
| 5,696,386 | 12/1997 | Yamazaki . | |
| 5,696,388 | 12/1997 | Funada et al. . | |
| 5,700,333 | 12/1997 | Yamazaki et al. . | |
| 5,705,829 | 1/1998 | Miyanaga et al. . | |
| 5,712,191 | 1/1998 | Nakajima et al. . | |
| 5,756,364 | 5/1998 | Tanaka et al. . | |

OTHER PUBLICATIONS

"Crystallized Si Films By Low–Temperature Rapid Thermal Annealing of Amorphous Silicon", R. Kakkad, J. Smith, W.S. Lau, S.J. Fonash, J. Appl. Phys. 65 (5), Mar. 1, 1989, 1989 American Institute of Physics, p. 2069–2072.

"Polycrystalline Silicon Thin Film Transistors on Corning 7059 Glass Substrates Using Short Time, Low Temperature Processing", G. Liu, S.J. Fonash, Appl. Phys. Lett. 62 (20), May 17, 1993, 1993 American Institute of Physics, pp. 2554–2556.

"Selective Area Crystallization of Amorphous Silicon Films by Low–Temperature Rapid Thermal Annealing", Gang Liu and S.J. Fonash, Appl. Ohys. Lett. 55 (7), Aug. 14, 1989, 1989 American Institute of Physics, pp. 660–662.

"Low Temperature Selective Crystallization of Amorphous Silicon", R. Kakkad, G. Liu, S.J. Fonash, Journal of Non–Crystalline Solids, vol. 115, (1989), pp. 66–68.

Kawazu et al., "Low–Temperature Crystallization of Hydrogenated Amorphous Silicon Induced by Nickel Silicide Formation", Jap. Journal of Applied Physics, vol. 29, No. 12, Dec. 1990, pp. 2698–2704.

Fortuna et al., In Situ Study of Ion Beam Induced Si Crystallization From a Silicide Interface, Applied Surface Science 73 (1993) pp. 264–267.

S. Wolf, "Silicon Processing for the VLSI ERA" vol. II, pp. 144–46, Jun. 1990.

S.–W. Lee, et al. *Appl. Phys. Lett.*, 66(13) (1995) 1672, "Pd Induced Lateral Crystallization of a–Si . . . ", Mar. 1995.

S. Caune et al., Appl. Surf. Sci., 36(1989) 597 "Combined CW Laser and furnace annealing of a–Si . . . in contact with some metals", 1989.

J.M.Green et al., IBM Tech. Discl. Bulletin, 16(5) (1973) 1612, "Method to purify semiconductor wafers", Oct. 1973.

S.–W. Lee, et al., AM–LCD '95 Proceedings, Page 113, ". . . by Ni Induced Lateral Crytallization of a–Si . . . ", Aug. 1995.

S.F. Gong, et al., *J.Appl. Phys.*, 68(9) (1990) (4542), ". . . Solid State Si–Metal Interactions . . . ", Nov. 1990.

P.H. Robinson, et al., "Use of HCI Gettering in Silicon Device Processing,"J. Electrochem. Soc., V. 118, No. 1, pp. 141–143, Jan., 1971.

SEMICONDUCTOR, SEMICONDUCTOR DEVICE, AND METHOD FOR FABRICATING THE SAME

This is a divisional application of Ser. No. 08/196,856, filed Feb. 15, 1994 now U.S. Pat. No. 5,639,698.

BACKGROUND OF THE INVENTION

This invention relates to a method for obtaining crystalline semiconductors for use in thin film devices such as thin film insulator gate type field effect transistors (Thin Film Transistor, or TFTs).

Conventionally, crystalline silicon semiconductor thin films used in thin film devices such as thin film insulator gate type field effect transistors (TFTs) have been manufactured by forming an amorphous silicon film on an insulating surface such as an insulator substrate by plasma CVD or thermal CVD and then crystallizing this film in an electric furnace or the like at a temperature of above 600° C. over a long period of twelve hours or more. In order to obtain particularly good performance (high field effect mobility and high reliability), heat treatment for even longer periods has been required.

However, there have been numerous problems associated with this kind of conventional method. One problem has been that throughput is low and therefore costs are high. For example, if 24 hours are required for this crystallization process, and if the treatment time for each substrate is 2 minutes, it has been necessary to treat 720 substrates at the same time. However, for example, in a commonly used tube furnace the number of substrates that can be treated at one time is 50 at the most, and when one only apparatus (reaction tube) is used the time taken per substrate has been as long as 30 minutes. In other words, in order to make the treatment time per substrate 2 minutes, it has been necessary to use as many as 15 reaction tubes. This has meant that the scale of the required capital investment has been great and that the depreciation on that investment has been large and has kept the cost of the product high.

Another problem has been the temperature of the heat treatment. Substrates commonly used in the manufacture of TFTs can be generally divided into those which consist of pure silicon oxide, like quartz glassy and no-alkali borosilicate glass types, like Corning Co.'s No. 7052 (hereinafter referred to as Corning 7059). Of these two classes, in the case of the former, because they have excellent resistance to heat and cam be handled in the same way that substrates are handled In ordinary semiconductor integrated circuit wafer processes, there are no problems relating to heat. However, they are expensive, and their cost rapidly increases exponentially along with increases in surface area. Therefore, at present, they are only being used in TFT integrated circuits of relatively small surface area.

No-alkali glass, on the other hand, is of satisfactorily low cost compared to quartz; however, its resistance to heat is a problem, and because its distortion point is generally about 550 to 650° C., and in the case of particularly easily acquired materials is below 600° C., with heat treatment at 600° C. problems of irreversible shrinkage and warping have arisen. These problems have been especially conspicuous with large substrates of over 10 inches in diagonal. For reasons like these it has been considered in connection with the crystallization of silicon semiconductor films that heat treatment conditions of below 550° C. and less than 4 hours are indispensable to reductions in cost. An object of this invention is to provide a method for manufacturing a semiconductor which clears these conditions and a method for manufacturing a semiconductor device in which such a semiconductor is used.

SUMMARY OF THE INVENTION

This invention is characterized in that a crystalline silicon film is obtained by forming a film, islandish film, dot line, particles or clusters or the like containing nickel, iron, cobalt, platinum or palladium on or underneath a silicon film in a disordered state of a kind which can be described as an amorphous state or a substantially amorphous state (for example a state in which portions having good crystallinity and amorphous portions exist together) and annealing this at a temperature which is lower, and preferably 20 to 150° C. lower, than the normal crystallization temperature of amorphous silicon, or at a temperature which is lower than the glass transition point of the substrate, for example at a temperature below 580° C.

With regard to conventional silicon film crystallization, methods wherein an island-shaped crystalline film is made to serve as a nucleus and solid phase epitaxial growth is brought about with this as a seed crystal have been proposed (for example Japanese Laid-Open Patent Publication H1-2124110). However, with this kind of method, at temperatures below 600° C almost no crystal growth progress has occurred. Moving a silicon substance from an amorphous state into a crystalline state generally involves a process wherein, with the state of the substance having been made such that the molecule chains in the amorphous state are cut and these cut molecules do not combine again with other molecules, these molecules are introduced to molecules having some crystalline character and rebuilt into constituent parts of crystals. However, in this process a large amount of energy is required for cutting the first molecule chains and maintaining the state wherein these cut molecules do not combine with other molecules, and this has been a barrier in the crystallization reaction. To provide this energy, several minutes at a temperature of about 1000° C. or several tens of hours at a temperature of about 600° C. are necessary, and because the time required varies exponentially in relation to the temperature (=energy), at temperatures below 600° C., for example 550° C., it has been almost impossible to observe any crystallization reaction progress at all The idea of conventional solid phase spit axial crystallization did not provide in answer to this problem.

The present inventors thought of reducing the barrier energy of the above process by means of the action of some kind of catalyst, completely separately from the conventional solid phase crystallization idea. The inventors noted that nickel, irons cobalt, platinum and palladium readily combine with silicon and for example in the case of nickel nickel slicides (chemical formula $NiSi_x$, $0.4 \leq x \leq 2.5$) are formed and that the lattice constants of nickel silicidles are close to those of silicon crystals. Accordingly, by simulating the energies, etc, of the ternary system crystalline silicon—nickel silicide—amorphous silicon, it was found that amorphous silicon readily reacts at an interface with nickel silicide and that the following reaction (1) occurs:

Amorphous Silicon (silicon A)+Nickel Silicide (silicon B)→Nickel Silicide (silicon A)+Crystalline Silicon (silicon B)

(A and B indicate the locations of the silicon)

The potential barrier of this reaction is satisfactorily low, and the temperature of the reaction is also low.

This reaction formula shows that nickel reconstructs amorphous silicon into crystalline silicon as it advances. In practice it was found that the reaction was started at under 580° C. and observed even at 450° C. Typically, it was shown that crystallization is possible at temperatures 20 to 150° C. lower than the normal crystallization temperature of amorphous silicon. Naturally, the higher the temperature the more quickly the reaction proceeds.

In the present invention, islands, stripes, lines or dots of nickel, iron, cobalt, platinum or palladium, silicide, acetate, or nitrate of nickel, iron, cobalt, platinum or palladium, film, particles, or clusters containing at least one of nickel, iron, cobalt, platinum, and palladium can be used as starting materials. As the above-described reaction progresses, nickel iron, cobalt, platinum or palladium expands around the starting material, thus enlarging the region of crystalline silicon. Oxides are not desired materials containing nickel, iron, cobalt, platinum or palladium because oxides are stable compounds and because they cannot initiate the reaction described above.

In this way, the crystalline silicon expanding from a certain location is different from the conventional solid phase epitaxy but has crystallinity of high continuity. The structure approximates a single crystal structure. This is advantageous to utilize semiconductor devices such as TFTs. Where a material containing nickel, iron, cobalt, platinum or palladium is dispersed uniformly over a substrate, innumerable starting points of crystallization exist. Therefore, it has been difficult to derive a good film of high crystallinity.

The lower the concentration of hydrogen in the amorphous silicon film which serves as the departure material in this crystallization, the better were the results (the crystallization speeds) that could be obtained. However, because hydrogen is expelled as crystallization progresses, there was not such a clear correlation between the hydrogen concentration in the silicon film obtained and the hydrogen concentration of the amorphous silicon film that was the departure material. The hydrogen concentration in crystalline silicon obtained according to this invention was typically from $1 \times 10^{15}$ atom.cm$^{-3}$ to 5 atomic %. Furthermore, in order to obtain good crystallinity the concentrations of carbon, nitrogen and oxygen in the amorphous silicon film should be as low as possible, and preferably should be below $1 \times 10^{19}$ cm$^{-3}$. Accordingly, this point should be taken into consideration in selecting the material containing nickel, iron, cobalt, platinum or palladium to be used in practicing this invention.

A feature of this invention is that Crystal growth progresses circularly. This is because the nickel of the reaction described above advances isotropically, and this is different than conventional crystallization wherein growth occurs linearly along the crystal lattice surfaces.

In particular, by setting the material containing nickel, iron, cobalt, platinum or palladium selectively, it is possible to control the direction of the crystal growth. Because, unlike crystalline silicon produced by conventional solid phase epitaxial growth, crystalline silicon obtained using this kind of technique has a structure in which the continuity of the crystallinity over long distances is good and which is close to being monocrystalline, it is well suited to use in semiconductor devices such as TFTs.

In the present invention, nickel iron, cobalt, platinum or palladium is used. These materials are not desirable for silicon which is used as a semiconductor material. If such a material is contained excessively in the silicon film, it is necessary to remove the material. With respect to nickel, when a growing crystal of nickel silicide arrives its final points, i.e., the crystallization has been completed, as a result of the above-described reaction, the nickel silicide is easily dissolved in hydrofluoric acid or hydrochloric acid. The nickel contained in the substrate can be reduced by treating the nickel with these acids.

In the case where a catalytic element such as nickel, iron, cobalt, platinum and palladium is diffused almost uniformly throughout the silicon film by the annealing for crystallization, a process wherein the nickel is removed is necessary. To perform this nickel removal, it has been found that annealing at 400 to 650° C. in an atmosphere containing chlorine atoms in the form of chlorine or a chloride is effective. An annealing time of 0.1 to 6 hours was suitable. The longer the annealing time was the lower the concentration of nickel in the silicon film became, but the annealing time may be decided according to the balance between the manufacturing cost and the characteristics required of the product. Examples of the chloride include hydrogen chloride, various kinds of methane chloride ($CH_3Cl$, $CH_2Cl_2$, $CHCl_3$), various kinds of ethane chloride ($C_2H_5Cl$, $C_2H_4Cl_2$, $C_2H_3Cl_3$, $C_2H_2Cl_4$, $C_2HCl_5$), and various kinds of ethylene chloride ($C_2H_3Cl$, $C_2H_2Cl_2$, $C_2HCl_3$). Especially, the material which can be used most easily is trichloroethylense ($C_2HCl_3$). We have discovered by SIMS that preferred concentration of nickel, iron, cobalt, platinum or palladium in the silicon film (e.g. a silicon film used for a semiconductor device such as a TFT) according to the present invention is $1 \times 10^{15}$ cm$^{-3}$ to 1 atomic %, more preferably $1 \times 10^{15}$ to $1 \times 10^{19}$ cm$^{-3}$. At less concentrations, the crystallization does not progress sufficiently. At higher concentrations, the characteristics and the reliability deteriorate.

Filmlike bodies containing nickel, iron, cobalt, platinum or palladium can be formed using various physical and chemical methods. For example methods requiring vacuum apparatus, such as vacuum vapor deposition, sputtering and CVD, and atmospheric pressure methods, such as spin coating and dipping, etc, (coating methods), doctor blade methods, screen printing and spray thermal decomposition.

Spin coating and dipping in particular, while not necessitating grand equipment, are techniques which offer excellent film thickness uniformity and with which fine concentration adjustment is possible. As solutions for use in these techniques, acetates and nitrates of nickels iron, cobalt platinum and palladium, or various types of carboxylic acid chloride or other organic acid chlorides dissolved or dispersed in water or some type of alcohol (low level or high level), or petroleum (saturated hydrocarbon or unsaturated hydrocarbon), etc, can be used.

However, there was concern that in this case oxygen and carbon contained in those salts might diffuse into the silicon film and cause its semiconductor characteristics to deteriorate. But, through research pursued using thermal balancing and differential thermal analysis it has been confirmed that suitable materials break down at temperatures below 450° C. to oxides or simple substances and thereafter there is almost no diffusion into the silicon film. In particular, when substances which are of lower order like acetates and nitrates were heated in a reducing atmosphere such as a nitrogen atmosphere they broke down at below 400° C. and became the simple metal. Similarly, it was observed that when they were heated in an oxygen atmosphere, first oxides were formed and then at higher temperatures oxygen broke away and left behind the simple metal.

A crystalline silicon film is fabricated according to the invention, and this film is used in a semiconductor device such as a TFT. As can be seen from the description made above, a large grain boundary exists at the ends of a growing crystal where the front ends of the growing material starting from plural points meet. Also, the concentration of nickel, iron, cobalt, platinum, or palladium is high. For these reasons, it is not desired to form a semiconductor device. Particularly, a channel of a TFT should not be provided in a region having such a large grain boundary.

The region from which the crystallization starts, that is, the region in which the substance containing nickel, iron, cobalt, platinum or palladium is provided has a large concentration of nickel, iron, cobalt, platinum or palladium. For this reason, attention should be paid to the formation of the semiconductor device. Further, such a region is readily etched by a solution containing a hydzofluoric acid group as compared with a silicon film which does not contain nickel, iron, cobalt, platinum or palladium. For this reason, such a region becomes a cause of formation of a defective contact. Accordingly, where a semiconductor device is fabricated by making use of the present invention, the pattern of a coating containing nickel, iron, cobalt, platinum, or palladium forming a starting point for crystallization and a pattern of the semiconductor device must be optimized.

In addition, the present invention provides a process which is characterized in that it comprises: forming, on an amorphous silicon film or on a film which has such a disordered crystalline state that it can be regarded as being amorphous (for example, a state which comprises crystalline portions and amorphous portions in a mixed state), a film, particles or clusters containing at least one of nickel, iron, cobalt, platinum or palladium (which are referred to hereinafter as catalytic materials); allowing the catalytic material to react with amorphous silicon at first, and removing the catalytic material which remained un-reacted; and annealing the resulting structure at a temperature lower than the normal crystallization temperature of a amorphous silicon by, preferably, 20 to 150° C., or at a temperature not higher than the glass transition temperature of the glass material conventionally used as a substrate, e.g., at 580° C. Or lower.

Even after the nickel, iron, cobalt, platinum or palladium atoms are removed from crystalline silicon, crystallization can be initiated by using as nuclei the remaining crystalline silicon which was formed by the reaction (1). As mentioned in the foregoing, the silicon crystals thus formed by the reaction has excellent crystallinity. Thus, it has been found that the crystallization of amorphous silicon can be accelerated by using these crystals as the nuclei. It has been shown that, typically, the crystallization can be effected at a temperature lower them the normal crystallization of amorphous silicon by 20 to 150° C. Furthermore, the time necessary for the crystal growth is found to be shortened. As a matter of course, the crystallization proceeds more rapidly with increasing the temperature. A similar reaction, though less actively to the case using nickel, is found to occur in the case using iron, cobalt, platinum or palladium.

DETAILED DESCRIPTION OF THE INVENTION

The present invention is illustrated in greater detail referring to non-limiting examples below. It should be understood, however, that the present invention is not to be construed as being limited thereto.

EXAMPLE 1

Figure 9B:
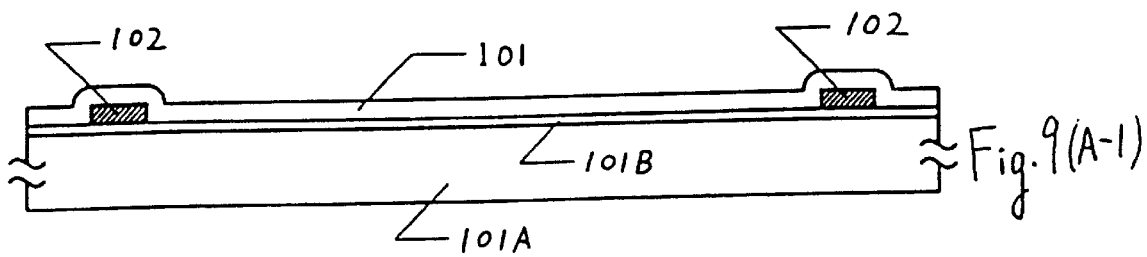
FIGS. 9(A-1), 9(A-2), 9(B), 9(C), and 9(D) are cross-sectional views of TFTs illustrating steps for selectively crystallizing a film according to the invention.
Figure 9B:
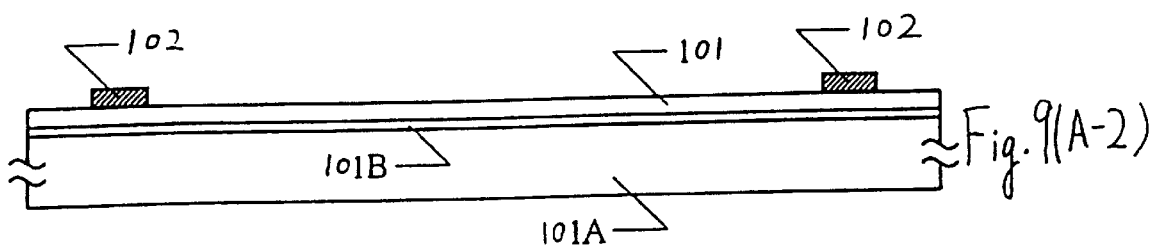
Figure 9B:
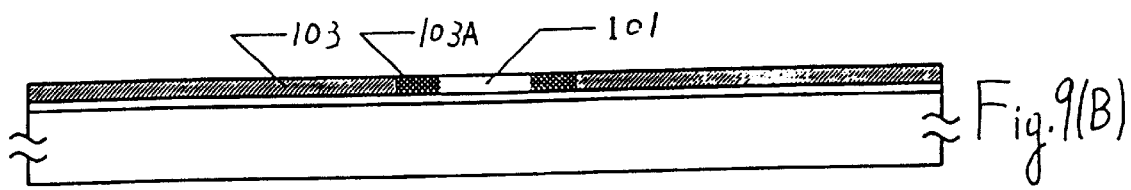
Figure 9C:
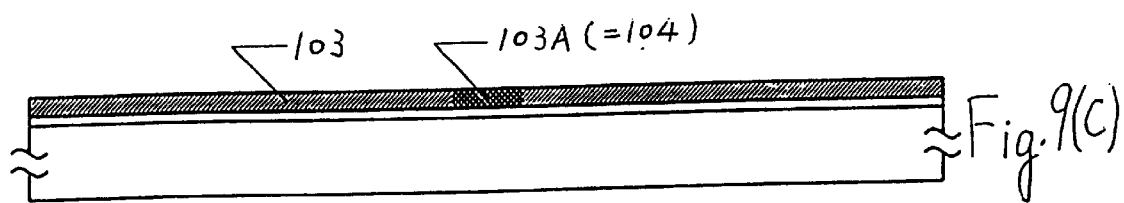
Figure 9D:
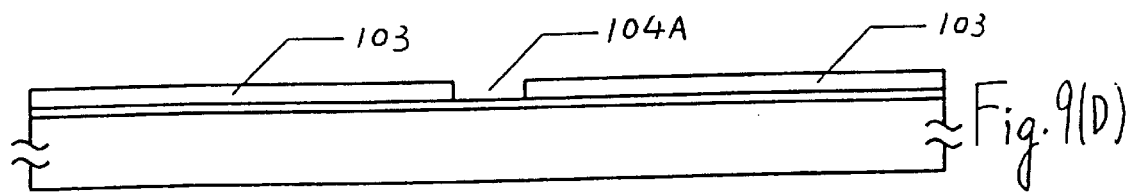
Figure 10A:
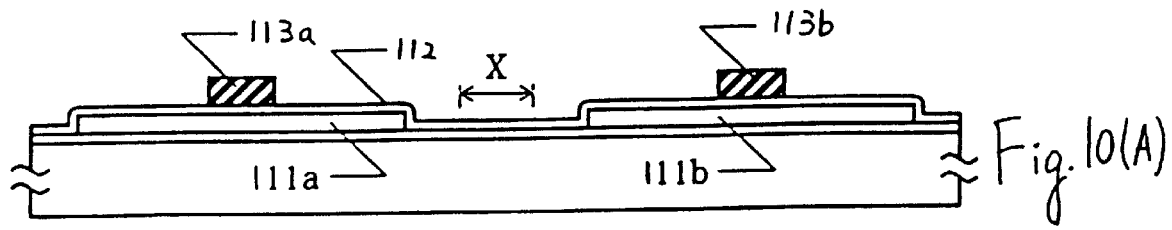
FIGS. 10(A) to 10(C) are cross-sectional views of TFTs illustrating steps of Example 5 of the invention.
Figure 10B:
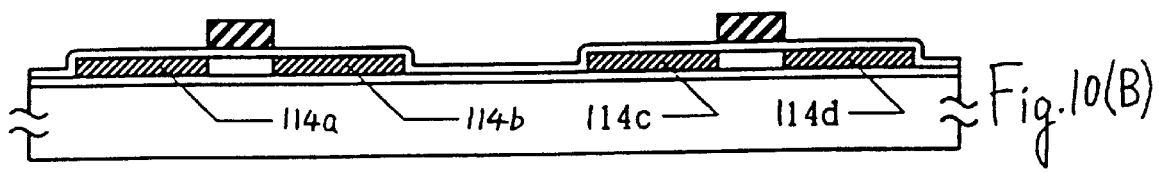
Figure 10C:
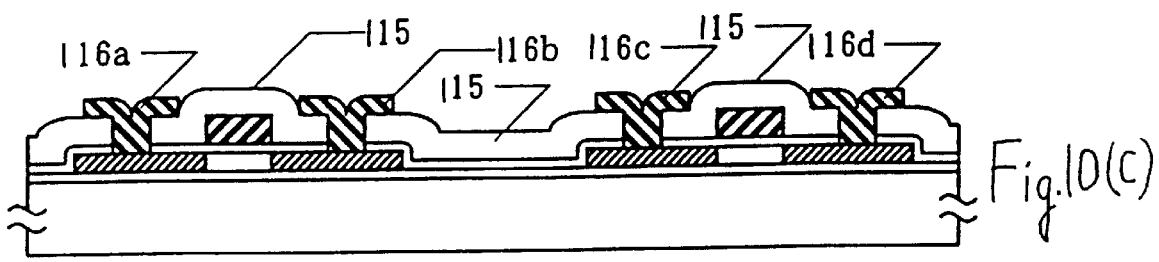
Figure 11A:
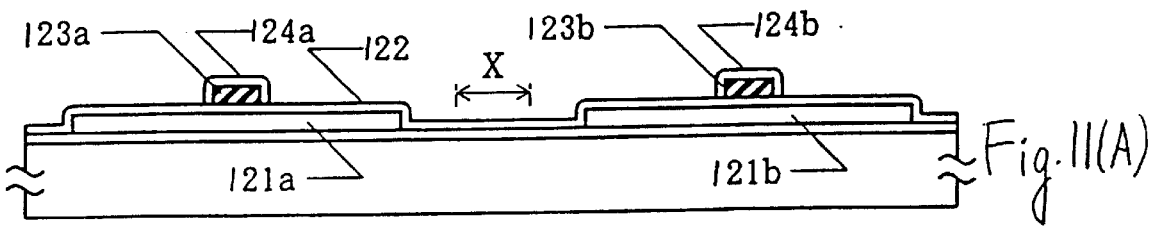
FIGS. 11(A) to 11(C) are cross-sectional views of other TFTs illustrating steps of Example 5 of the invention.
Figure 11B:
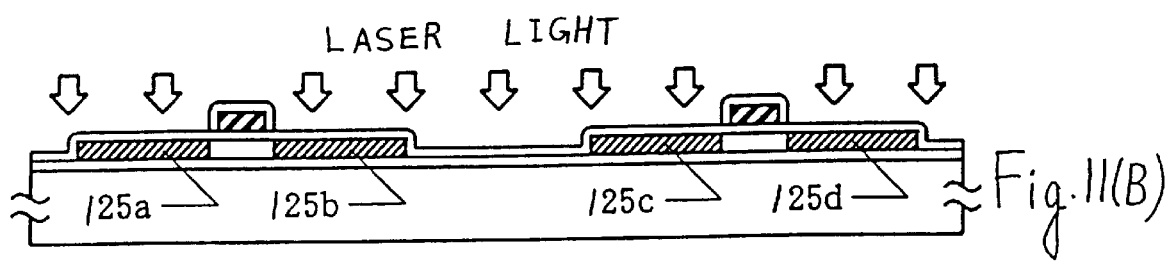
Figure 11C:
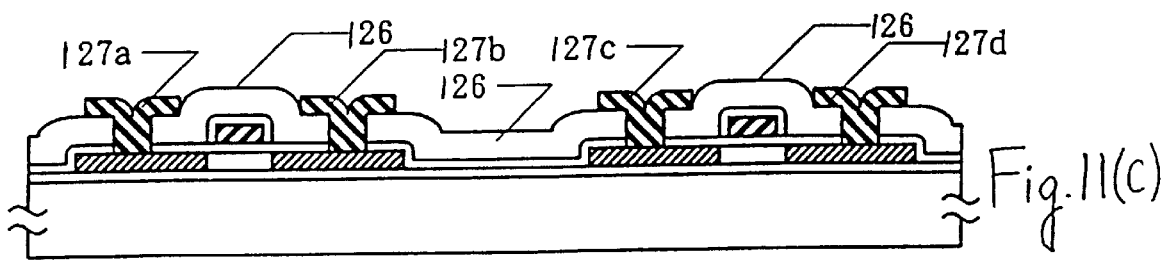
Figures 1, 9A:
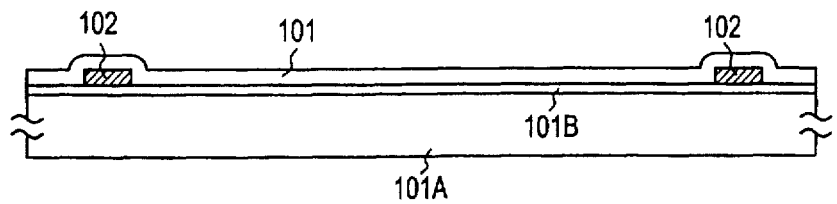

Referring to FIG. 1, a process for fabricating a crystalline silicon film by forming a nickel film on a Corning #7059 substrate, and crystallizing an amorphous silicon film using this nickel film is described below. By using plasma CVD, a 2,000 Å thick silicon oxide film 12 as a base film was deposited on the substrate 11, and further thereon an amorphous silicon film 13 at a thickness of from 500 to 3,000 Å, for example, at a thickness of 1,500 Å. After removing hydrogen from the film by keeping the film at a temperature of 430° C. for a duration of from 0.1 to 2 hours, for example, 0.5 hour, a nickel film 14 was deposited thereon by sputtering at a thickness of from 100 to 1,000 Å, for example, 500 Å. A favorable nickel film can be obtained by heating the substrate in the temperature range of from 100 to 500° C., preferably in the range of from 180 to 250° C., because a nickel film having an improved adhesion strength with respect to the silicon film formed as the base is obtained. A nickel silicide film can be used in the place of the nickel film.

Figure 1A:
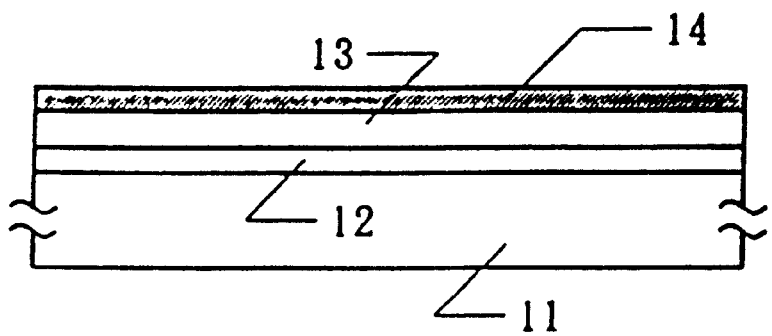
FIGS. 1(A) to 1(D) show schematically drawn step sequential cross section structures obtained in a process according to an embodiment of the present invention (Example 1)
Figure 1B:
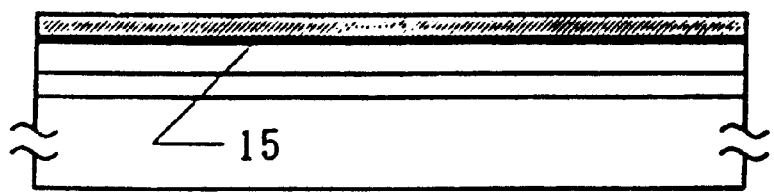

The resulting structure was then heated in the temperature range of from 450 to 580° C. for a duration of from 1 to 10 minutes to allow the nickel film 14 to react with the amorphous silicon film 13, thereby obtaining a thin crystalline silicon film 15. The thickness of the crystalline silicon film depends on the temperature and duration of the reaction, and a film about 300 Å in thickness can be obtained by a reaction performed at 550° C. for a duration of 10 minutes. The resulting structure is shown in FIG. 1(B).

Figure 1C:
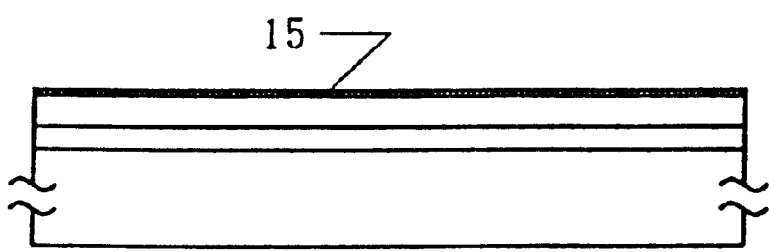
Figure 1D:
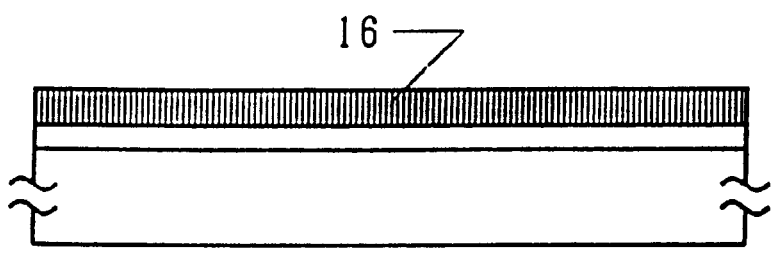

The nickel film and the nickel silicide film thus obtained from the nickel film through the reaction were subjected to etching using hydrochloric acid in a concentration of from 5 to 30%. No influence was found on crystalline silicon which has been formed by the reaction between amorphous silicon and nickel (silicide) by this treatment. Thus was obtained a structure shown in FIG. 1(C).

Figure 3:
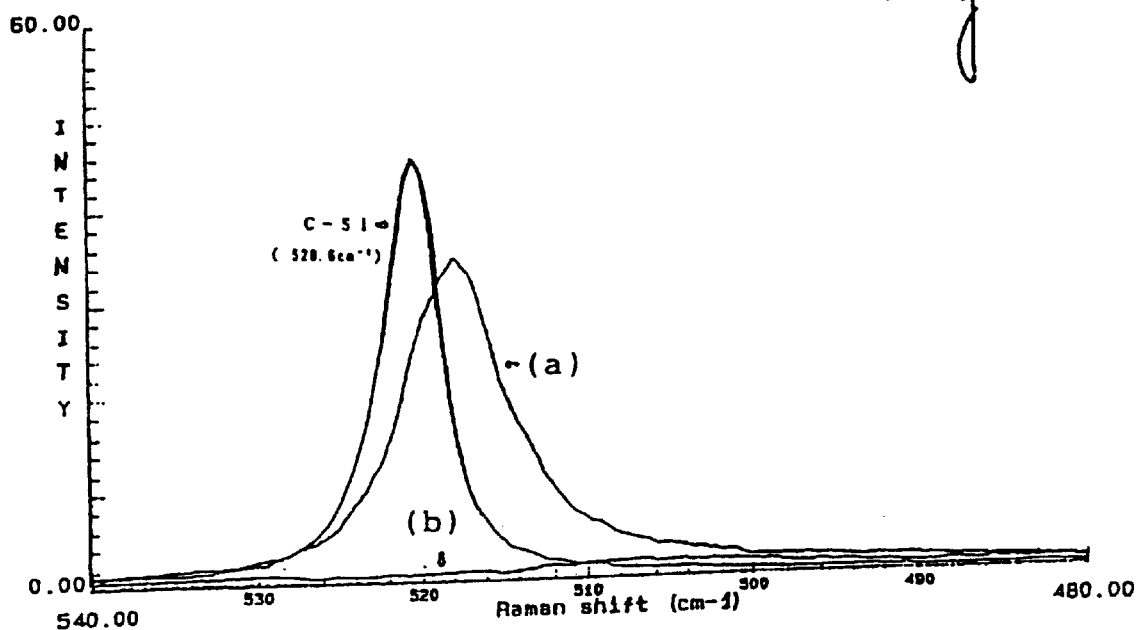
FIG. 3 shows the result of Raman scattering spectroscopy of a crystalline silicon film obtained in Example 1.
Figure 4:
FIG. 4 shows the X-ray diffraction pattern of a crystalline silicon film obtained in an Example.

The resulting structure was annealed under a nitrogen atmosphere in an annealing furnace whose temperature was kept in a range of from 450 to 580° C., for example, 550° C. , for a duration of 8 hours. A crystalline silicon film 16 was thus obtained in this step by crystallizing the amorphous silicon film. The Raman scattering spectrogram and the X-ray diffractogram of the resulting crystalline silicon film are each shown in FIG. 3 and FIG. 4. In FIG. 3, the curve indicated by C-Si corresponds to the Raman spectrum of a standard sample, i.e., single crystal silicon. The curves indicated by (a) and (b) each represent the Raman spectra for a silicon film obtained by the process according to the present invention, and a film obtained by annealing a conventional amorphous silicon by the conditions described above. It can be seen clearly from the results that the process according to the present invention provides a favorable silicon crystal.

EXAMPLE 2

Figure 2A:
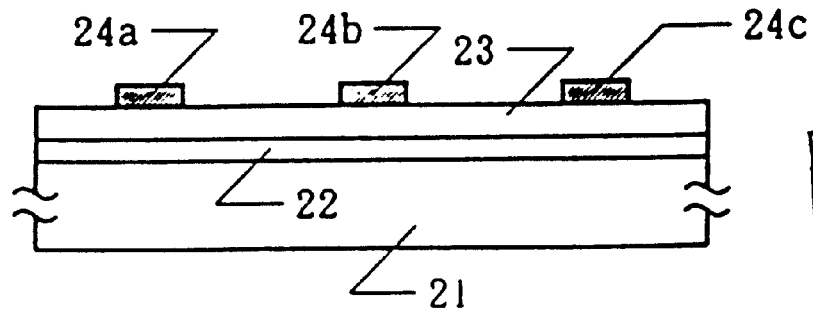
FIGS. 2(A) to 2(E) show schematically drawn step sequential cross section structures obtained in another process according to another embodiment of the present invention (Example 2)
Figures 2, 9A:
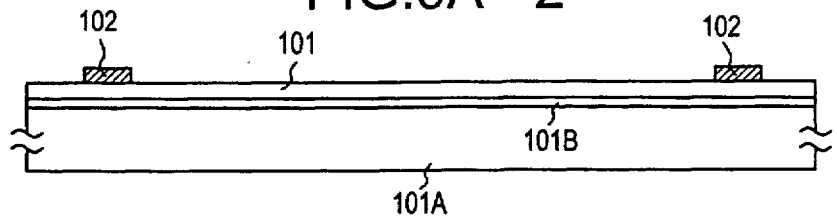
Figure 9B:
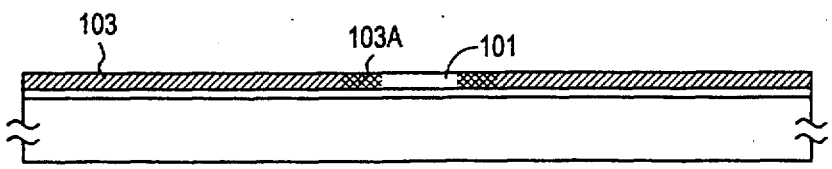
Figure 9C:
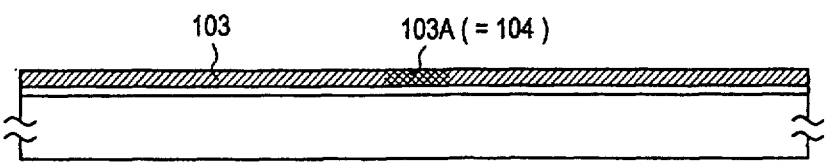
Figure 9D:
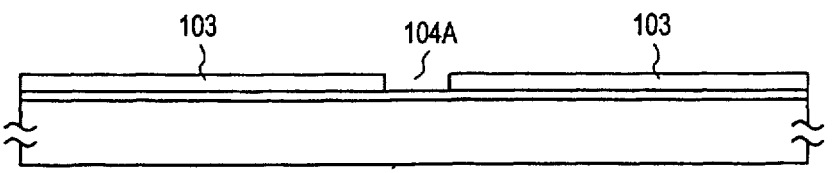
Figure 10A:
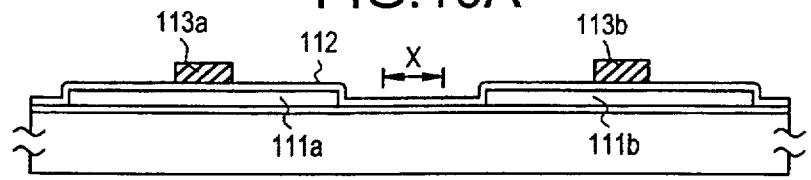
Figure 10B:
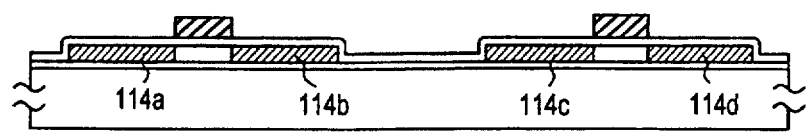
Figure 10C:
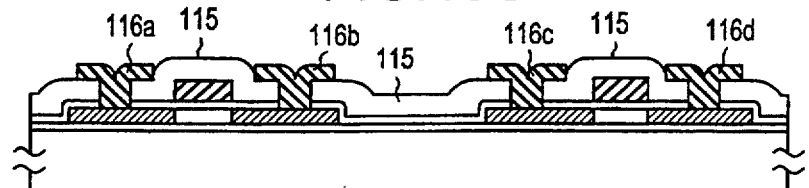
Figure 11A:
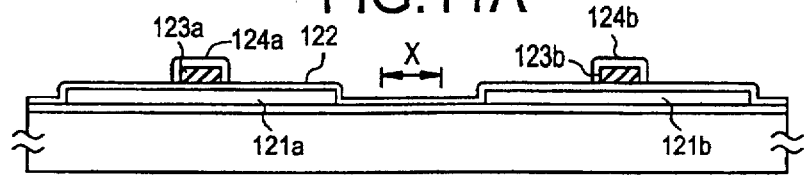
Figure 11B:
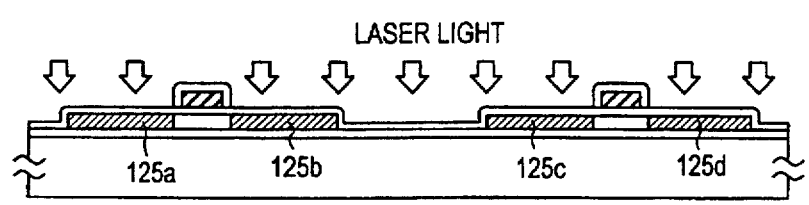
Figure 11C:
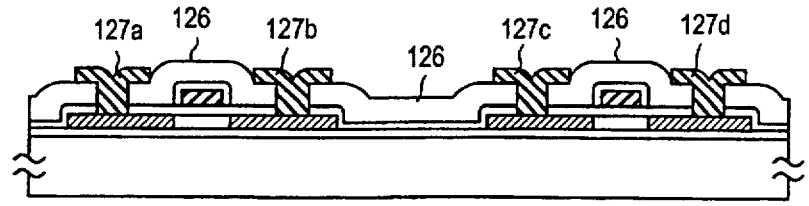
Figure 12A:
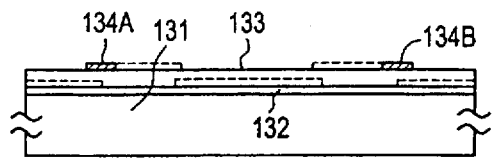
Figure 12B:
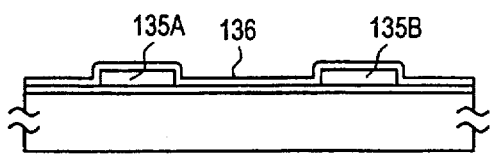
Figure 12C:
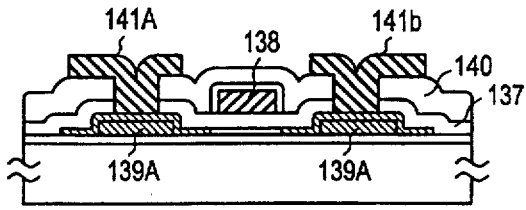
Figure 13A:
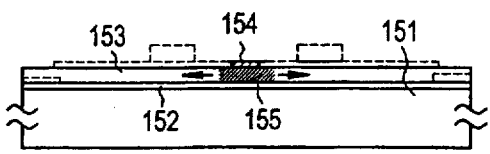
Figure 13B:
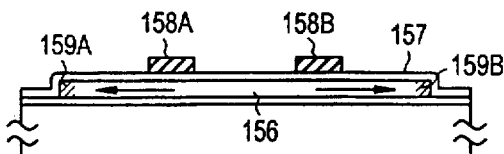
Figure 13C:
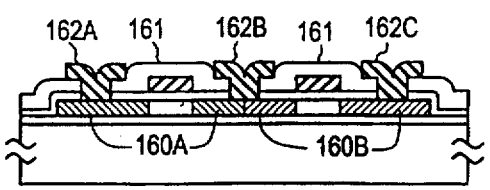
Figure 14A:
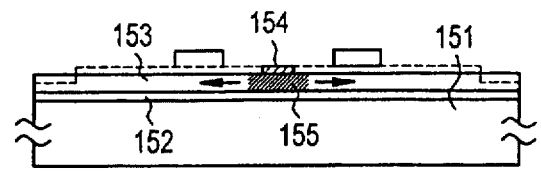
Figure 14B:
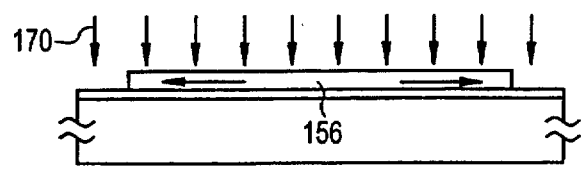
Figure 14C:
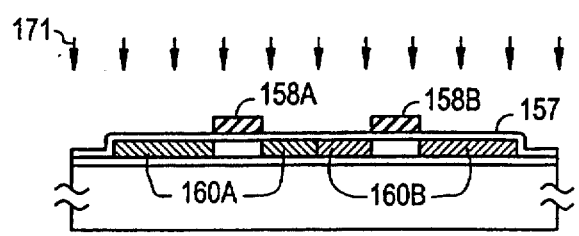
Figure 14D:
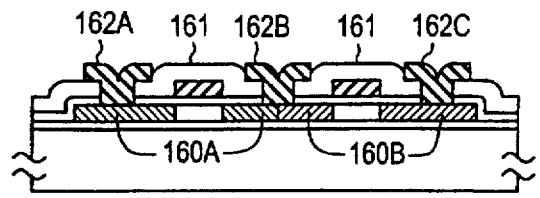
Figure 15A:
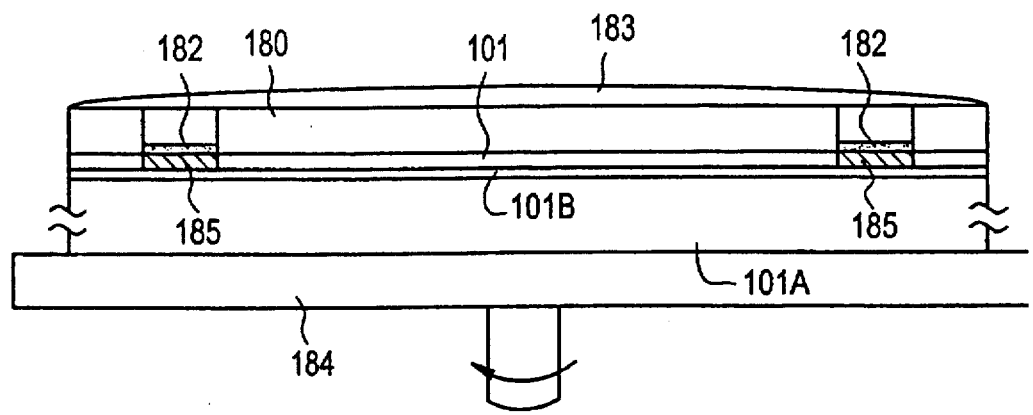
Figure 15B:
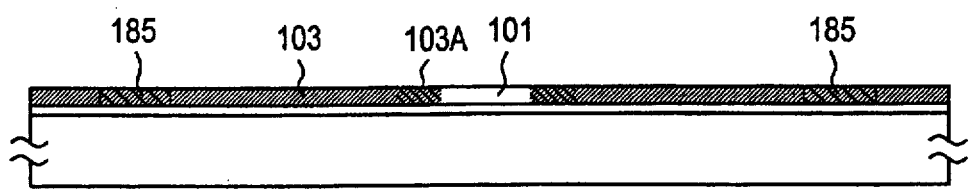
Figure 15C:
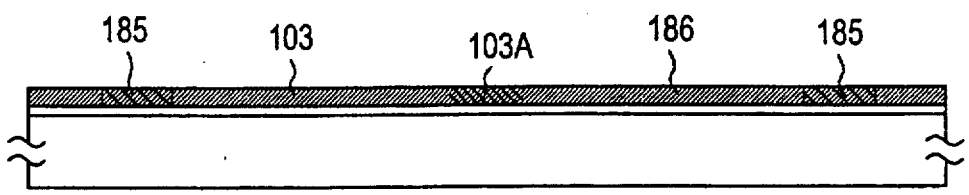
Figure 15D:
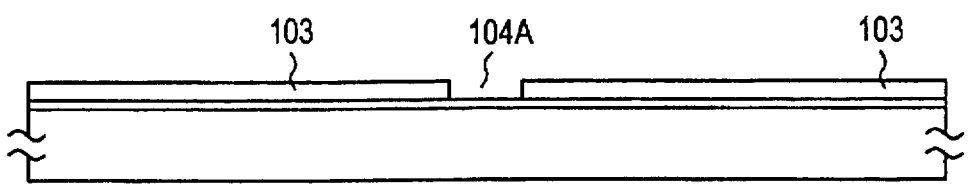
Figure 16:
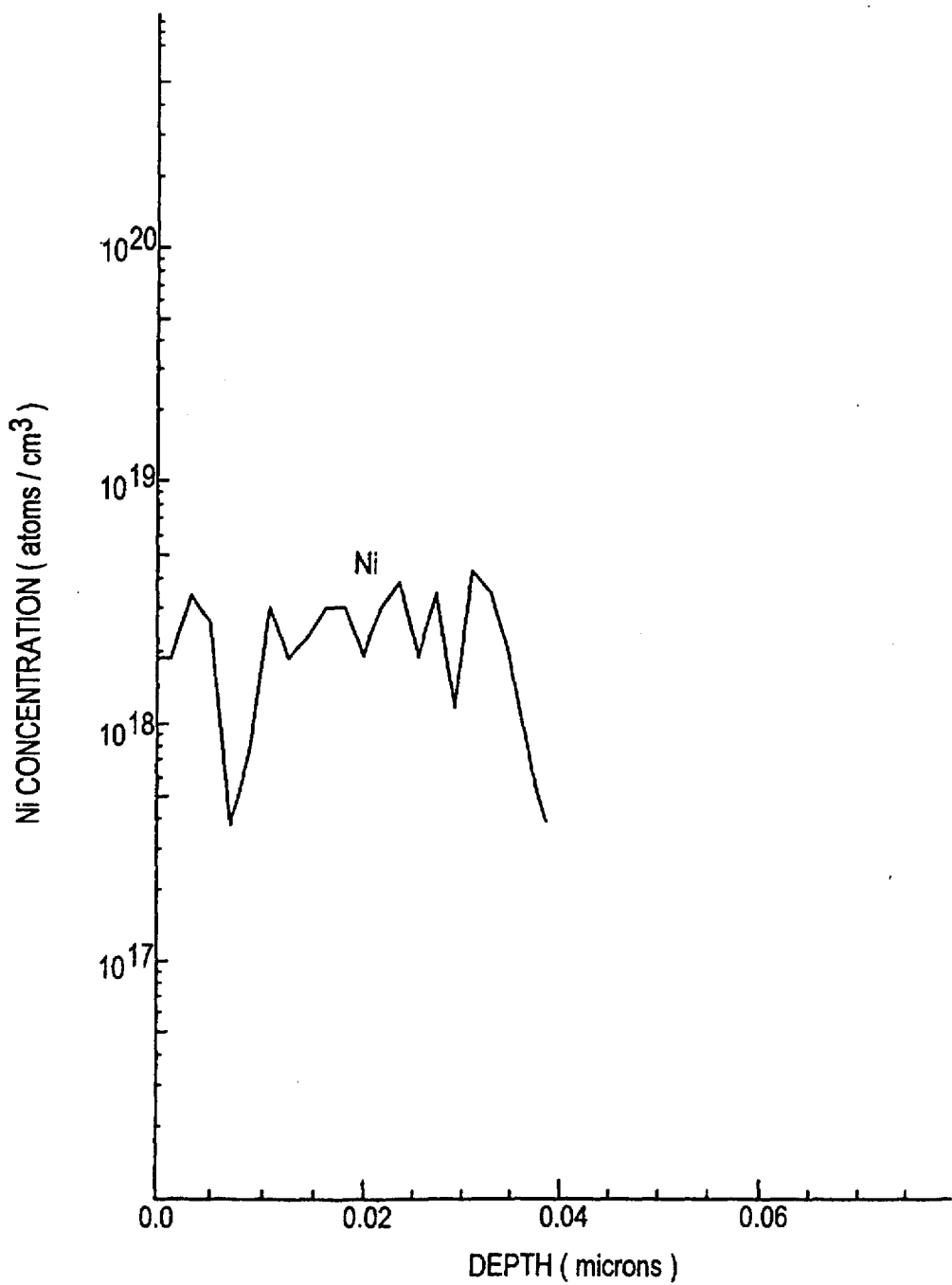
Figure 17A:
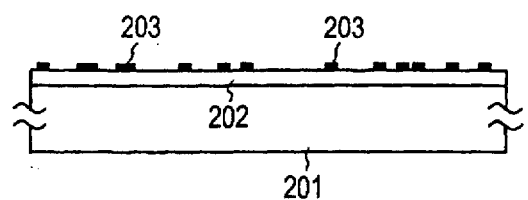
Figure 17B:
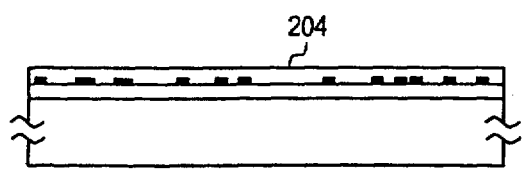
Figure 17C:
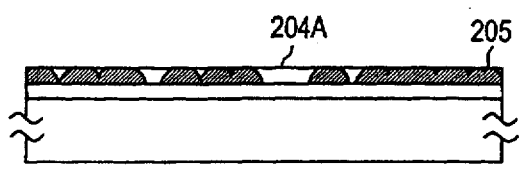
Figure 18A:
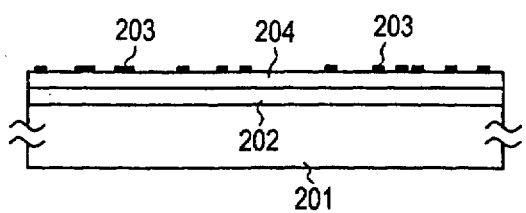
Figure 18B:
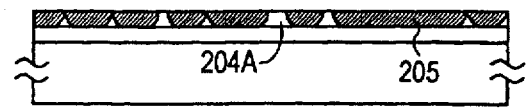
Figure 19A:
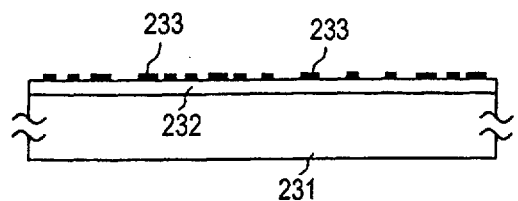
Figure 19B:
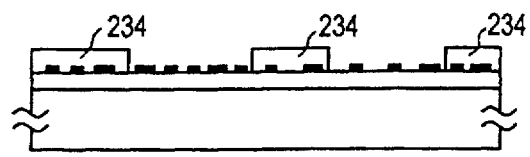
Figure 19C:
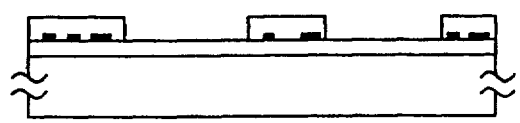
Figure 19D:
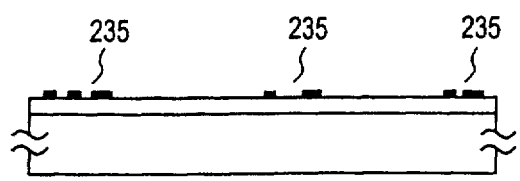
Figure 19E:
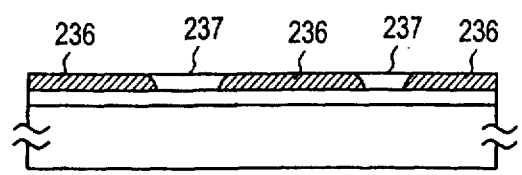
Figure 20A:
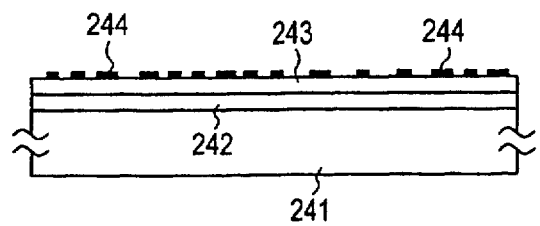
Figure 20B:
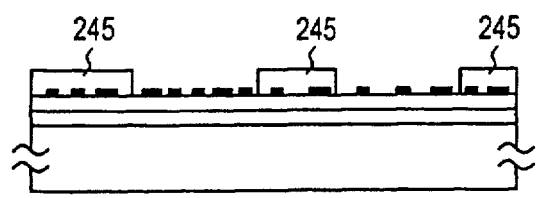
Figure 20C:
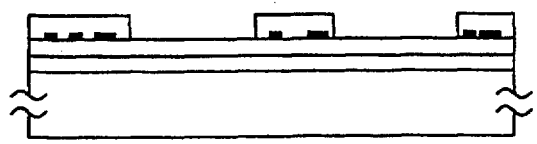
Figure 20D:
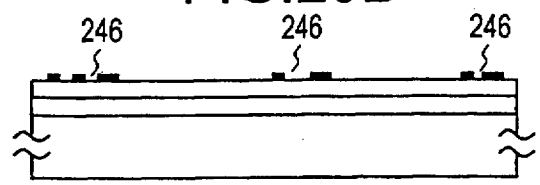
Figure 20E:
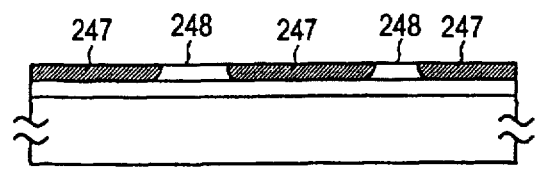
Figure 21A:
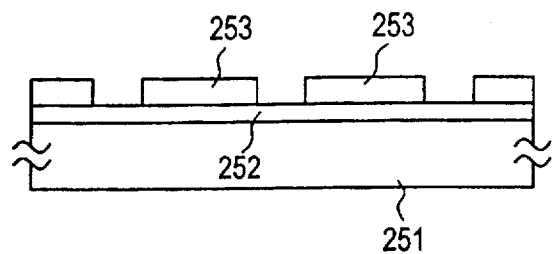
Figure 21B:
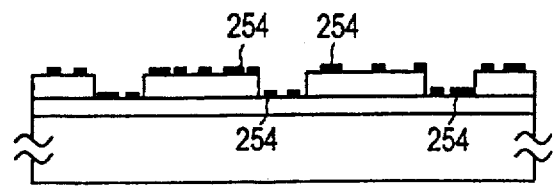
Figure 21C:
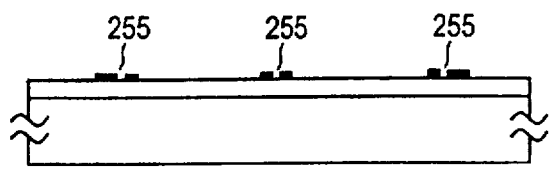
Figure 21D:
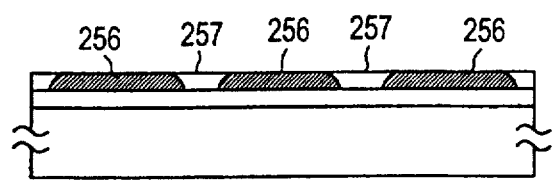
Figure 22A:
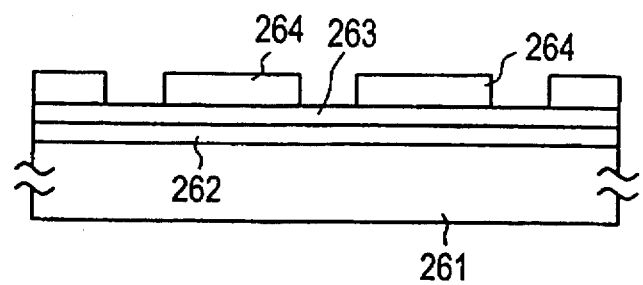
Figure 22B:
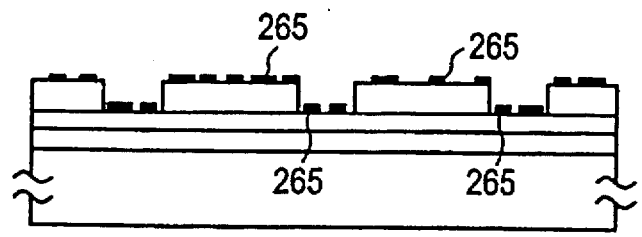
Figure 22C:
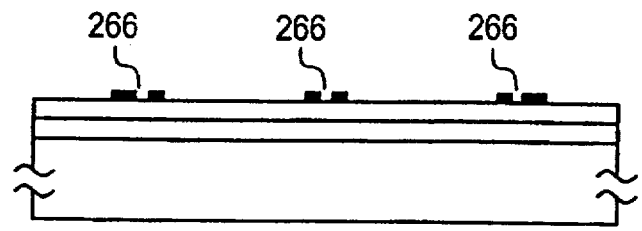
Figure 22D:
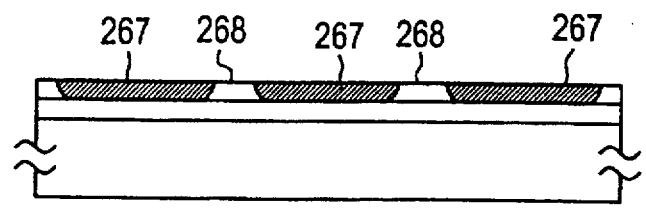
Figure 23A:
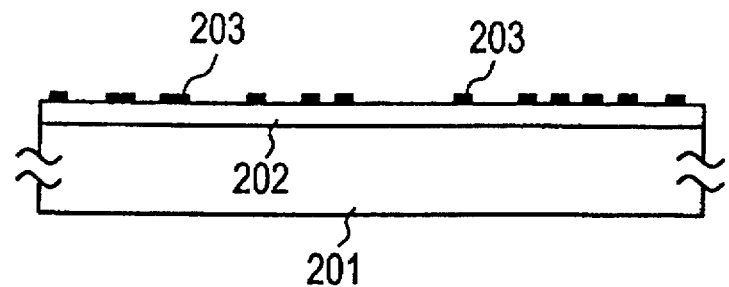
Figure 23B:
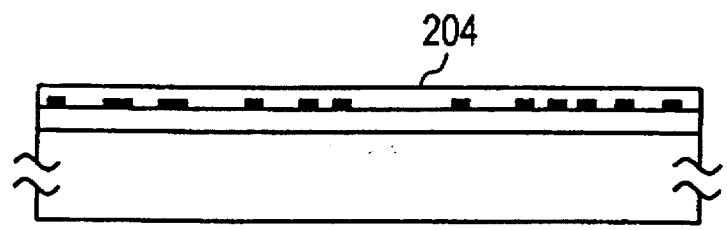
Figure 23C:
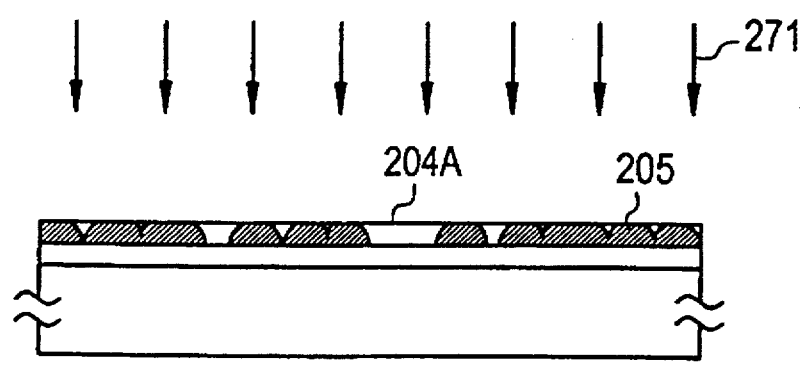
Figure 24A:
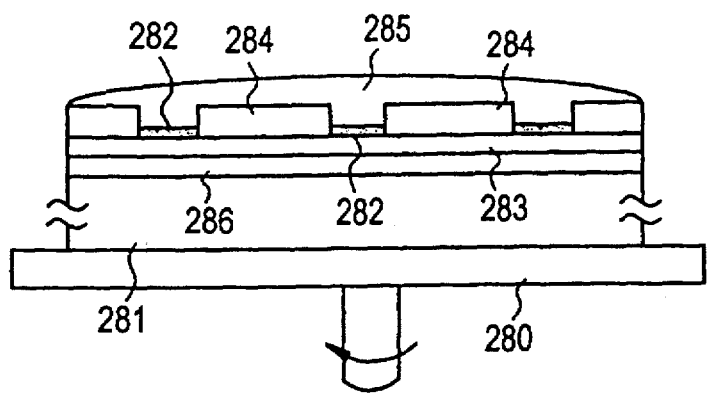
Figure 24B:
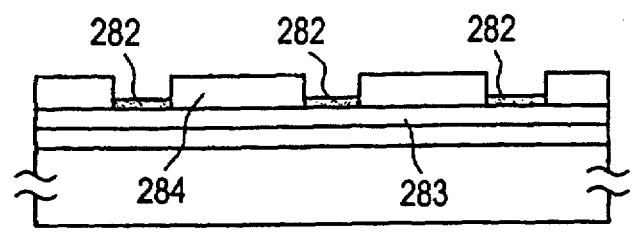
Figure 24C:
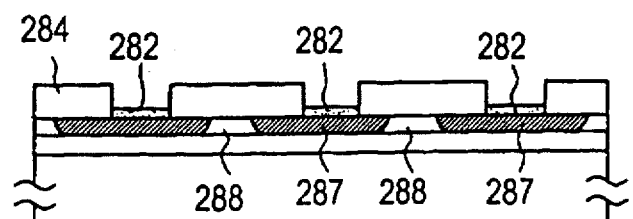
Figure 26A:
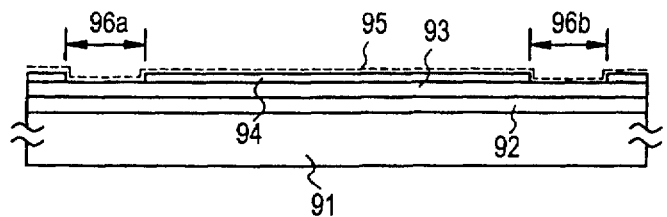
Figure 26B:
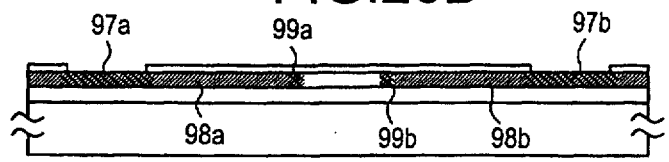
Figure 26C:
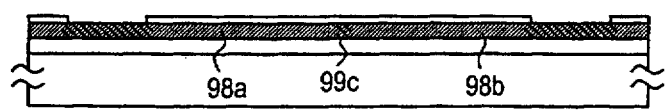
Figure 26D:
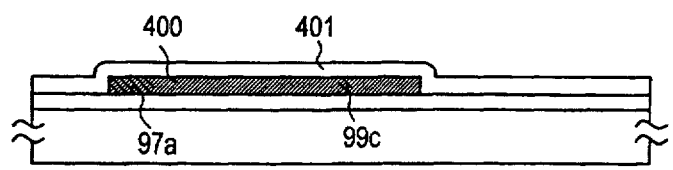
Figure 26E:
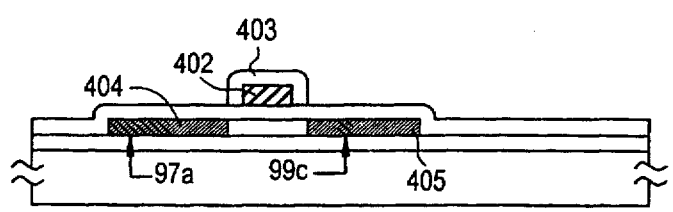
Figure 26F:
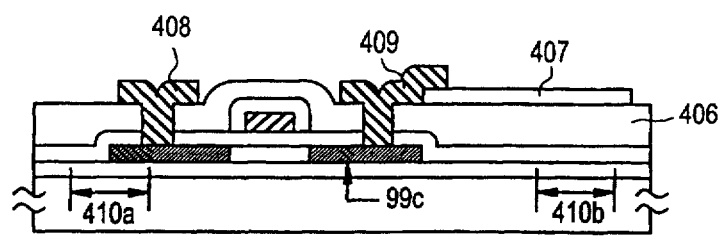

Referring to FIG. 2, a process for fabricating a crystalline silicon film is described below. A 2,000 Å thick silicon oxide film 22 as a base film was deposited on a Corning #7059 glass substrate 21 and an amorphous silicon film 23 was deposited further thereon at a thickness of from 500 to 3000 Å, for example, at a thickness of 500 Å and 1,500 Å. After removing hydrogen from the film by keeping the film at a temperature of 430° C. for a duration of from 0.1 to 2 hours, for example, 0.5 hour, a nickel film was deposited thereon by sputtering at a thickness of from 100 to 1000 Å, for example, 500 Å. A nickel silicide film can be used in the place of the nickel film. The nickel film thus obtained was etched to form patterns 24a, 24b, and 24c as shown in FIG. 2(A).

Figure 2B:
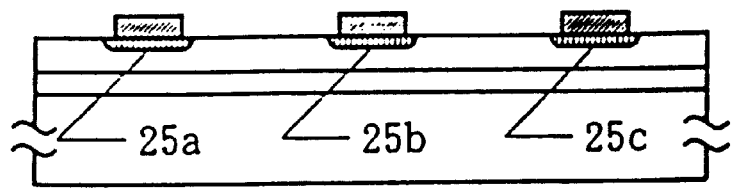

Then, the structure was heated in the temperature range of from 450 to 580° C. for a duration of from 1 to 10 minutes to allow the nickel films 24a to 24c to undergo reaction with the amorphous film 23 to form thin crystalline silicon regions 25a, 25b, and 25c as shown in FIG. 2(B).

Figure 2C:
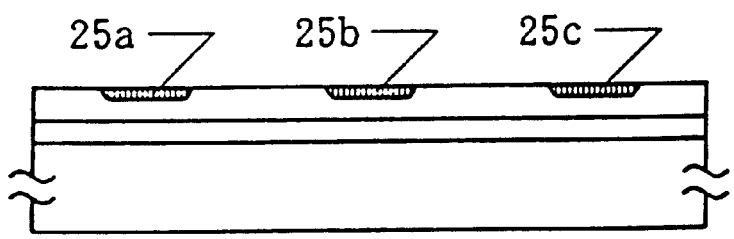

The nickel film and the nickel silicide film thus obtained from the nickel film through the reaction were subjected to etching using hydrochloric acid in a concentration of from 5 to 30%. No influence was found on crystalline silicon regions 25a to 25c which have been formed by the reaction between amorphous silicon and nickel (silicide) by this treatment. Thus was obtained a structure shown in FIG. 2(C).

Figure 2D:
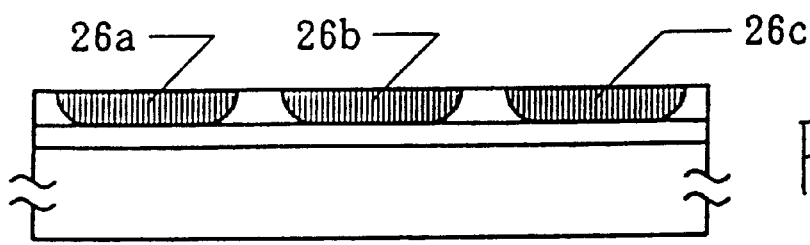
Figure 2E:
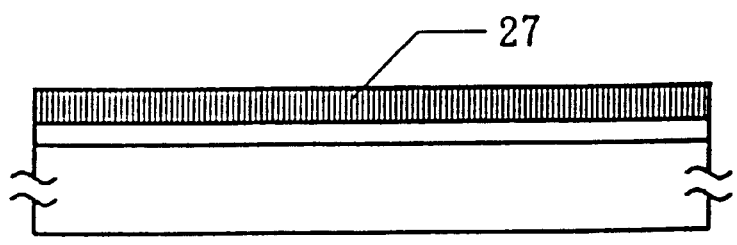

The resulting structure was annealed under a nitrogen atmosphere in an annealing furnace whose temperature was kept in a range of from 450 to 580° C., for example, 550° C., for a duration of 4 hours. FIG. 2(D) provides an intermediate state during the annealing process, in which the crystallization is observed to proceed from the previously formed crystalline silicon regions 25a to 25b, in such a manner that the crystalline silicon regions 26a, 26b, and 26c are observed to extend into the amorphous region 23.

A crystalline silicon film 27 was finally obtained by crystallizing the entire amorphous silicon film. In contrast to the case of Example 1 in which the crystal growth proceeds perpendicularly from the surface to the substrate side, the crystal in the present example grows transversely from the patterned nickel. For instance, the crystal structure of the crystalline silicon regions 26a to 26c as shown in FIG. 2(D) is similar to that of a single crystal silicon. Accordingly, the structure can be suitably applied to semiconductor devices such as TFTs because the formation of a potential barrier in these crystalline silicon regions along the transverse direction is relatively rare. However, at portions in which the crystalline silicon regions 26a and 26b collide with each other, for example, crystals are greatly damaged and are thus not suitable for the application.

Figure 5:
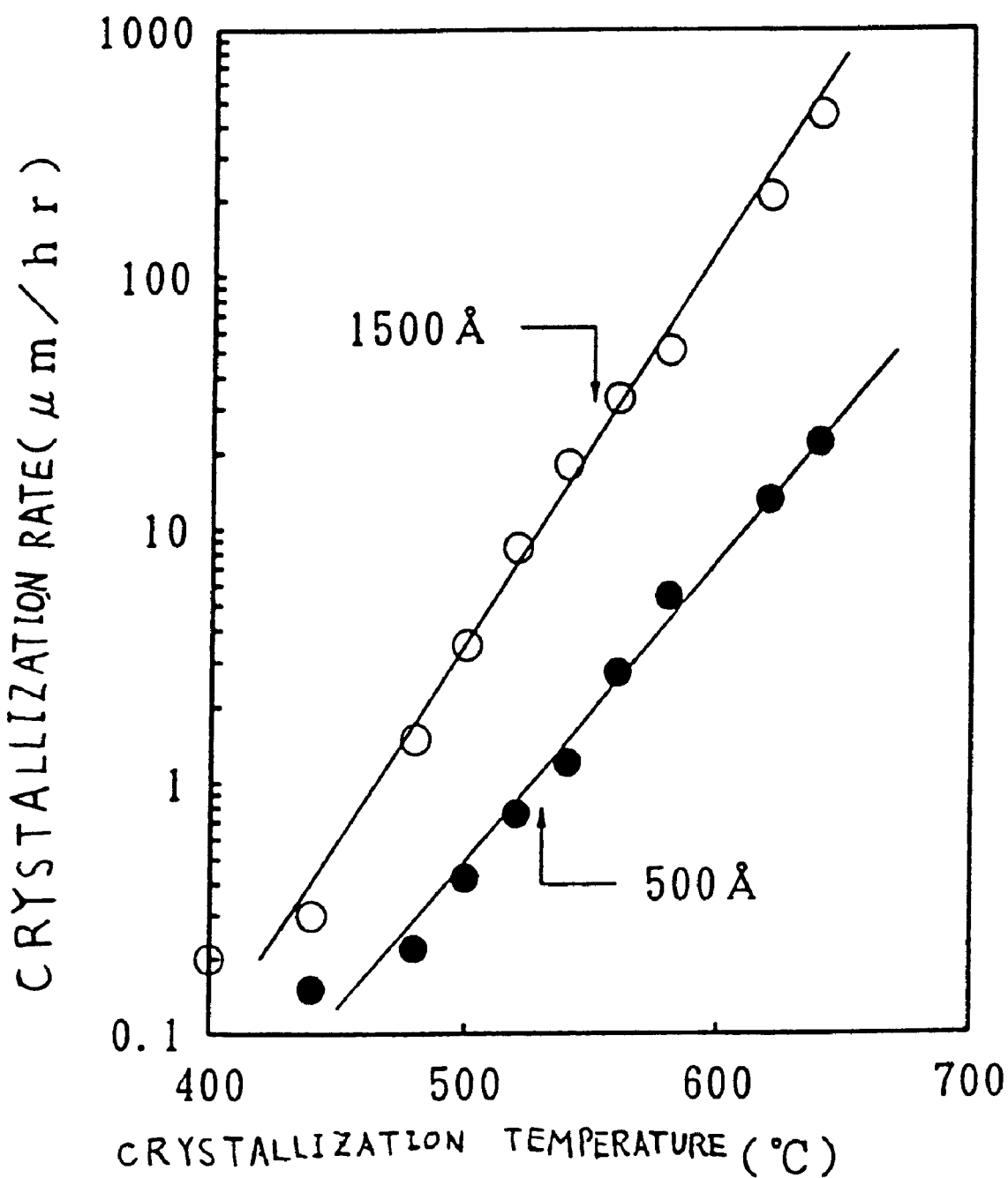
FIG. 5 shows the crystallization rate of silicon (Example 2)

FIG. 5 shows the relation between the crystallization rate and the temperature of crystallization. It has been found that the crystallization proceeds faster with increasing thickness of the silicon film.

EXAMPLE 3

The present example relates to a process for fabricating a silicon film hating an improved crystallinity by irradiating a laser beam to the silicon film after once crystallizing it by heating. Furthermore, the present example provides a process for fabricating a TFT using the thus crystallized silicon film.

FIG. 6 shows the cross section view of the step-sequential structures obtained in the present process. Referring to FIG. 6, a 2,000 Å thick silicon oxide film 602 as a base film was deposited on a Corning #7059 glass substrate 601, and an intrinsic (I type) amorphous silicon film was deposited further thereon at a thickness of from 100 to 1,500 Å for example, at a thickness of 800 Å in this case. A nickel film, i.e., a catalytic material for accelerating the crystallization of the amorphous silicon, was deposited selectively thereon by a process similar to that described in Example 2 (refer to FIG. 2(A)). The resulting structure was then heated in the temperature range of from 450 to 580° C. for a duration of from 1 to 10 minutes to allow the nickel film to react with the amorphous silicon film, thereby obtaining a thin crystalline silicon film. The resulting structure is shown in FIG. 2(B).

The nickel film and the nickel silicide film structure obtained from the nickel film through the reaction were subjected to etching using hydrochloric acid in a concentration of from 5 to 30%. No influence by this treatment was found on crystalline silicon which has been formed by the reaction between amorphous silicon and nickel (silicide). Thus was obtained a structure shown in FIG. 2(C).

A further annealing at 550° C. for 12 hours under a nitrogen atmosphere at atmospheric pressure provides a crystalline silicon film 603 covering the entire surface of the structure.

Figure 6A:
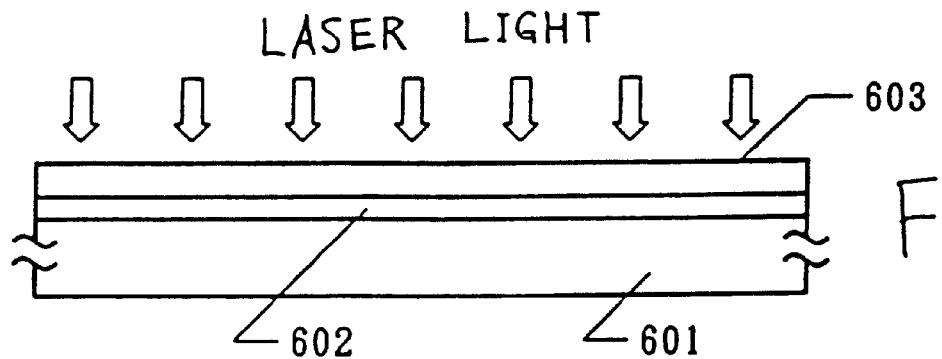
FIGS. 6(A) to 6(E) show schematically drawn step sequential cross section structures obtained in a process for fabricating a semiconductor according to a yet another embodiment of the present invention (Example 3)

Then, a KrF excimer laser was operated to irradiate a laser beam at a wavelength of 248 nm and at a pulse width of 20 nsec to the surface of the resulting crystalline silicon film to further accelerate the crystallization thereof. The laser beam was irradiated at an output energy density of from 200 to 400 mJ/cm$^2$, for instance 250 mJ/cm$^2$, for 2 shots. During the laser beam irradiation, the substrate was maintained at a temperature of 300° C. by heating to fully enhance the effect of laser beam irradiation. In general, the substrate is preferably heated in the temperature range of from 200 to 450° C. The present step is illustrated in FIG. 6(A).

Usable laser light other than that of the KrF excimer laser above include those emitted from a XeCl excimer laser operating at a wavelength of 308 nm and an ArF excimer laser operating at a wavelength of 193 mm. Otherwise, an intense light may be irradiated in the place of a laser light. In particular, the application of RTA (rapid thermal annealing) which comprises irradiating an infrared light is effective because it can selectively heat the silicon film in a short period of time.

Thus, a silicon film having a favorable crystallinity can be obtained by employing any of the aforementioned methods. The crystallized silicon film 603 obtained as a result of thermal annealing was found to change into a silicon film having a further improved crystallinity. Furthermore, observation by transmission electron microscope revealed that relatively large grains of oriented crystallites constitute the laser-irradiated film.

Figure 6B:
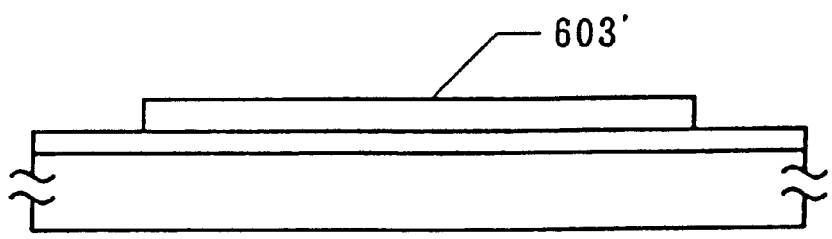

The silicon film thus obtained upon the completion of crystallization was patterned into squares 10 to 1,000 $\mu$m in edge length to obtain island-like silicon film 603' as the active layer of the TFT, as shown in FIG. 6(B).

Figure 6C:
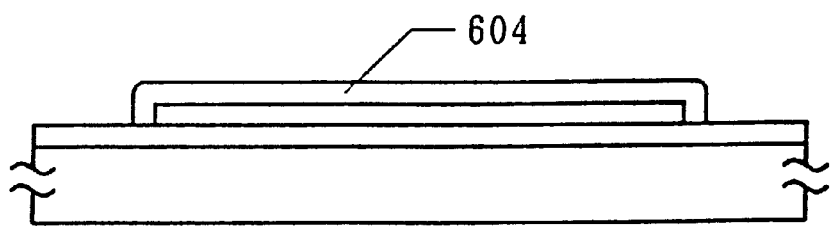

A silicon oxide film 604 which functions as a gate insulator film was formed. Here, the silicon film was exposed to an oxidizing atmosphere in the temperature range of from 500 to 750° C., preferably in the temperature range of from 550 to 650° C., to form a silicon oxide film 604 which functions as a gate insulator film on the surface of the silicon region. In this heat treatment step, the oxidation reaction can be more enhanced by incorporating water vapor, nitrous oxide, and the like into the atmosphere. As a matter of course, the silicon oxide film can be formed by using any of the known means for vapor phase crystal growth, such as plasma CVD and sputtering. This step is illustrated in FIG. 6(C).

Subsequently, a polycrystalline silicon film containing from 0.01 to 0.2% of phosphorus was deposited by reduced pressure CVD to a thickness of from 3000 to 8000 Å, specifically 6,000 Å. A gate contact 605 was formed thereafter by patterning the silicon film. Furthermore, an impurity (phosphorus in the present Example), to render the active layer regions (source/drain which constitute the channel) N-conductive, was added by ion doping (plasma doping) in a self-aligned manner using the silicon film above as a mask. In the present Example, the ion doping was performed using phosphine (PH$_3$) as the doping gas to introduce phosphorus at a dose of $1\times10^{15}$ to $8\times10^{15}$ cm$^{-2}$, specifically for example, $5\times10^{15}$ cm$^{-2}$, and at an accelerated voltage of 60 to 90 kV. Thus were obtained N-type conductive impurity regions 606 and 607 for the source/drain regions.

Figure 6D:
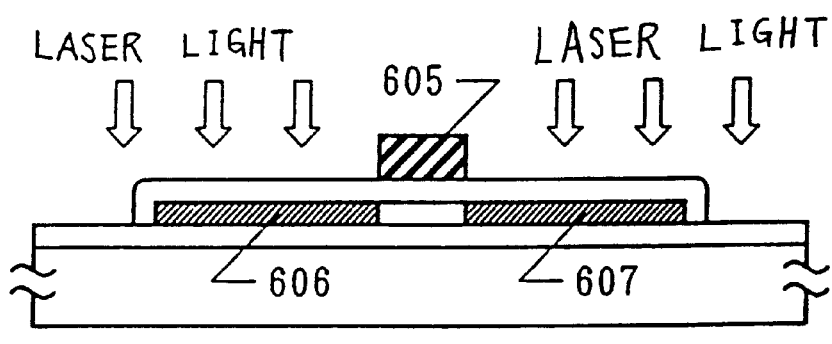

Laser was then irradiated for annealing. Though a KrF excimer laser operated at a wavelength og 248 nmand a pulse width of 20 nsec was used in the present Example, other lasers can be used as well. The laser light was irradiated at an energy density of 200 to 600 mJ/Cm$^2$, for example, 250 mJ/cm$^2$, and from 2 to 10 shots, for example 2 shots, per site. The effect of laser annealing can be further enhanced by heating the substrate in the temperature range of from 200 to 450° C. during the irradiation of laser light. This is illustrated in FIG. 6(D).

Otherwise, this step can be carried out by a so-called RTA (rapid thermal annealing) process, i.e. lamp annealing using near infrared light. Since near infrared light can be more readily absorbed by a crystallized silicon than by amorphous silicon, an effective annealing well comparable to thermal annealing at temperatures not lower than 1,000° C. can be effected sore advantageously, near infrared light is less absorbed by glass substrates. The fact is that a far infrared light is readily absorbed, but a light in the visible to near infrared region, i.e., a light in the wavelength region of 0.5 to 4 $\mu$m, is hardly absorbed by a glass substrate. Accordingly, the annealing can be completed within a shorter period of time, and yet, without heating the substrate to a high temperature. It can be seen that this method is most suitable for a step in which the shrinking of the glass substrate is unfavorable.

Figure 6E:
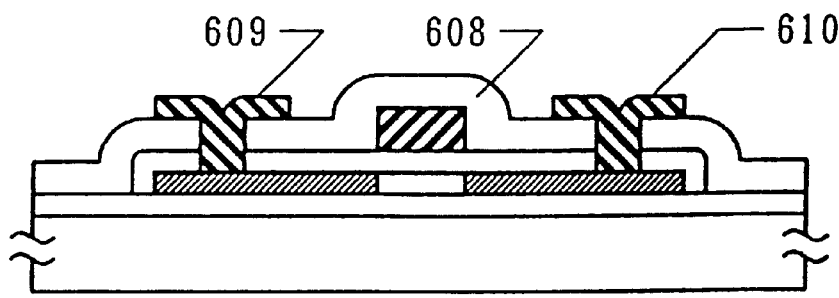

A 6000 Å thick silicon oxide film 608 was deposited as an interlayer insulator by plasma CVD. A polyimide film can be used in the place of silicon oxide. Contact holes were perforated to form contacts with connection 609 and 610 using a metallic material, for example, a multilayered film of titanium nitride and aluminum. Finally, annealing was performed at 350° C. for a duration of 30 minutes under a pressure of 1 atmosphere to obtain a complete TFT structure as shown in FIG. 6(E).

As described in the present Example, an amorphous silicon film cam be more favorably crystallized than in the case of simply heating by introducing nickel as a catalytic element for the crystallization, and yet, the crystallinity of the thus crystallized silicon film can be further ameliorated by irradiating a laser light. In this manner, a crystalline silicon having particularly high crystallinity can be obtained. The use of the resulting crystalline silicon film of good crystallinity provides a high performance TFT.

More specifically, an N-channel TFT obtained through the same process steps as in the process of the present Example except for not employing the crystallization step described in Example 2 yields a field-effect mobility of from 50 to 90 cm$^2$/vs, and a threshold voltage of from 3 to 8 V. These values are in clear contrast to a mobility of from 150 to 200 cm$^2$/Vs and a threshold voltage of from 0.5 to 1.5 V obtained for the N-channel TFT fabricated in accordance with the present Example. The mobility is considerably increased, and the fluctuation in the threshold voltage is greatly reduced.

Previously, the aforementioned TFT characteristics of such a high level were obtained from amorphous silicon film only by laser crystallization. However, the silicon films obtained by a prior art laser crystallization yielded fluctuation in the characteristics. Furthermore, the crystallization process required an irradiation of a laser light at an energy density of 350 mJ/cm$^2$ or higher at a temperature of 400° C. or higher, and it was therefore not applicable to mass production. In contrast to the conventional processes, the process for fabricating a TFT according to the present Example can be performed at a lower substrate temperature and at a lower energy density than the values for the conventional processes. Accordingly, the process according to the present invention is suitable for mass production. Furthermore, the quality of the devices obtained by the present process is as uniform as the one for the devices obtained by a conventional solid phase growth crystallization using thermal annealing. Accordingly, TFTs of uniform quality can be obtained stably.

In the foregoing Examples 1 and 2, the crystallization was found to occur insufficiently when the nickel concentration was low. However, the process according to the present Example employs laser irradiation to compensate for an insufficient crystallization. Accordingly, TETs with satisfactorily high quality can be obtained even when the nickel concentration is low. This signifies that devices containing nickel at a still lower concentration can be implemented, and that devices having excellent electric stability and reliability can be obtained.

EXAMPLE 4

The present example relates to a process for introducing a catalytic element into the amorphous film by coating the upper surface of the amorphous silicon film with a solution containing a catalytic element which accelerates the crystallization of the amorphous silicon film.

The present invention also provides a process for fabricating a crystalline silicon film containing a catalytic element at a low concentration by selectively introducing a catalytic element into an amorphous silicon film, and then allowing crystal growth to proceed therefrom to the portions into which catalytic elements were not introduced.

FIG. 7 shows schematically the step-sequential fabrication process according to the present invention. A 1000 Å thick amorphous silicon film 705 was deposited on a 10×10-cm square Corning #7059 glass substrate 701 by plasma CVD, and a silicon oxide film 704 was deposited further thereon to a thickness of 1,200 Å as a mask. A silicon oxide film 704 as thin as 500 Å in thickness can be used without any problem, and the film can be made even thinner by using a denser film.

Figure 7A:
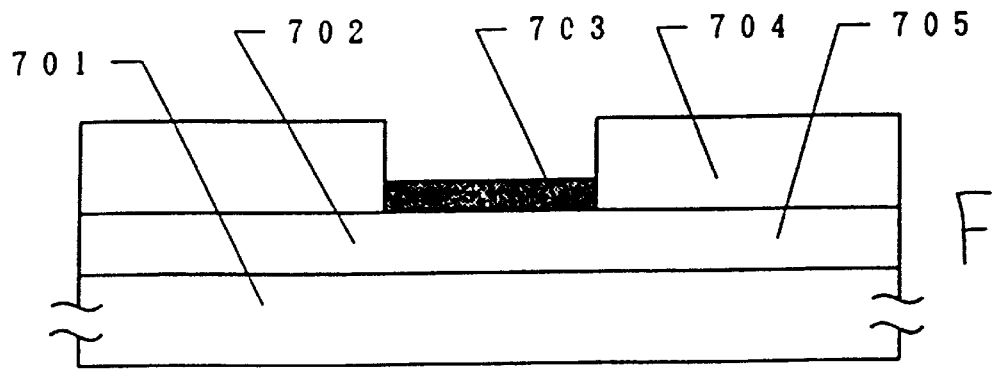
FIGS. 7(A) to 7(C) show a step of introducing a catalyst element using a solution (Example 4)

The resulting silicon oxide film 704 was patterned as desired by am ordinary photolithographic patterning. Then, a thin silicon oxide film 703 was deposited in an oxygen atmosphere by irradiating ultraviolet (UV) light. More specifically, the silicon oxide film 703 was fabricated by irradiating the UV light for 5 minutes. The silicon oxide film 703 is believed to have a thickness of from 20 to 50 Å. Thus was obtained a structure as shown in FIG. 7(A).

The silicon oxide film above is formed for improving wettability of the pattern with the solution to be applied hereinafter. A favorable wettability is sometimes assured by the hydrophilic nature of the silicon oxide mask, but this is a rare case because this happens only when the pattern size matches with the solution. Accordingly, it is safer to use a silicon oxide film 703 to assure good wettability.

Figure 7B:
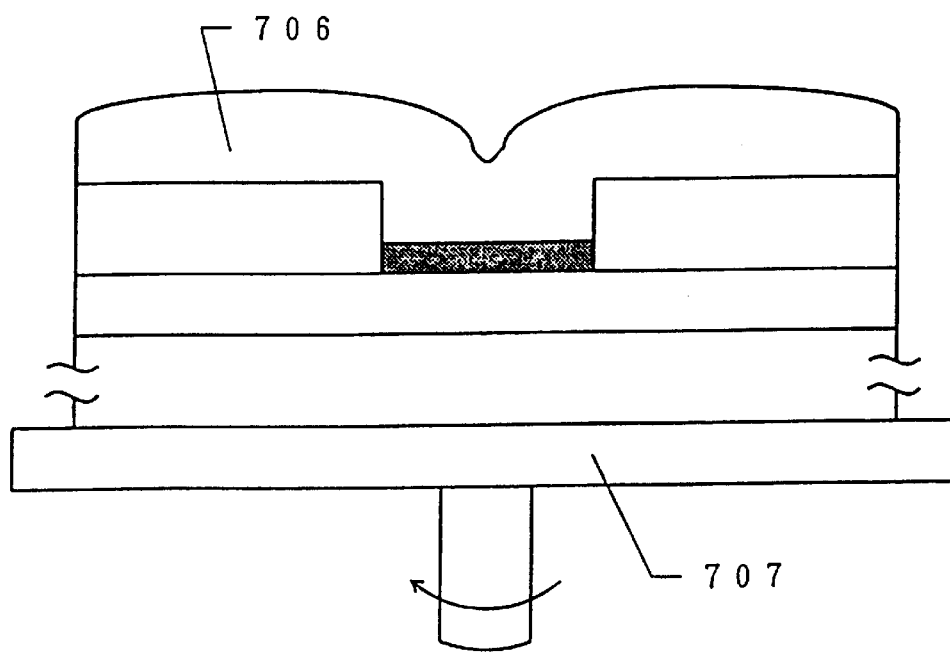

Then, a 5-ml portion of an acetate solution containing 100 ppm by weight of nickel was dropped on the surface of a 10×10-cm² square substrate. A spinner 707 was operated for 10 seconds at a rate of 50 rpm to form a uniform aqueous film on the entire surface of the substrate. The spinner 707 was operated for an additional 60 seconds at a rate of 2000 rpm to effect spin drying after maintaining the substrate for 5 minutes. The substrate may be subjected to rotation at a rate of from 0 to 150 rpm on a spinner. This step is illustrated in FIG. 7(B).

The resulting structure was heated at a temperature range of from 450 to 580° C. for a duration of from 1 to 10 minutes to form an extremely thin nickel silicide film on the surface of the amorphous silicon film 705. A crystalline silicon was found to form at the phase boundary between the amorphous silicon film 705 and the nickel silicide film, as well as in the vicinity 710 thereof in this step. The surface of the amorphous silicon film 705 was etched with 5% hydrochloric acid to remove the nickel silicide.

Subsequently, the resulting structure was subjected to heat treatment at 550° C. under a nitrogen atmosphere for a duration of 4 hours. In this manner, crystallization is allowed to occur from the region 709 into which nickel was introduced to the region 710 into which nickel was not introduced along the transverse direction as indicated with an arrow 708. As a matter of course, crystallization also occurs in the region 709 into which nickel was directly introduced.

Figure 7C:
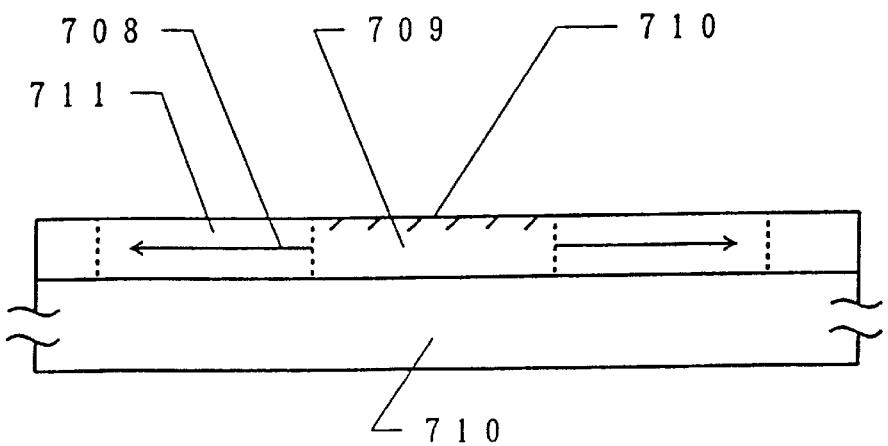

In FIG. 7(C), crystallization occurred in the region 709 into which nickel was directly introduced, and it proceeded transversely over the region 711.

The nickel concentration can be controlled by changing the nickel concentration of the solution to be applied. In the present invention, the nickel concentration in the solution was adjusted to 100 ppm. However, it is confirmed that the crystallization also occurs even when the concentration is decreased to 10 ppm. Crystallization occurs in the same manner by using a solution containing nickel at a concentration of 10 ppm. In this case, the nickel concentration in the region 711 as shown in FIG. 7 can be further lowered by a digit. However, the use of a solution containing nickel at too low a concentration shortens the distance of crystal growth along the transverse direction indicated by the arrow 708, and is therefore not desired.

The crystalline silicon film thus obtained can be used as it is in the active layer of a TFT. In particular, the use of a region 711 to form an active layer is useful because this region contains the catalytic element at a low concentration.

It is also effective to further improve the crystallinity of the crystalline silicon film obtained above by irradiating a laser beam or am intense light equivalent thereto in the same manner as in the foregoing Example 3.

An acetate solution was used in the present example as a solution containing the catalytic element. However, other usable solutions include am aqueous solution selected from a wide variety, and a solution containing an organic solvent. The catalytic element need not necessary be included as a compound, and it may be simply dispersed in the solution.

The solvent for the catalytic element can be selected from the group consisting of polar solvents, i.e. water, alcohol, acids, and ammonia water.

When nickel is used as the catalytic element, nickel is incorporated into a polar solvent in the form of a nickel compound. The nickel compound is selected from, representatively, the group consisting of nickel bromide, nickel acetate, nickel oxalate, nickel carbonate, nickel chloride, nickel iodide, nickel nitrate, nickel sulfate, nickel formate, nickel acetylacetonate, nickel 4-cyclohexylbutyrate, nickel oxide, and nickel hydroxide.

The solvent may be selected from a non-polar solvent selected from the group consisting of benzene, toluene, xylene, carbon tetrachloride, chloroform, and ether.

In this case, nickel is involved in the solution in the form of a nickel compound, which is selected from the group consisting of nickel acetylacetonate, and nickel 2-ethylhexanate.

It is also effective to add a surfactant into the solution containing a catalytic element. A surfactant increases the adhesiveness of the solution to the surface of the silicon oxide film, and controls the adsorptivity. The surfactant may be applied previously to the surface to be coated. If elemental nickel is used as the catalytic element, it must be previously dissolved into an acid to obtain a solution thereof.

Instead of using a solution containing nickel completely dissolved into the solution, an emulsion, i.e. a material comprising a dispersing medium uniformly dispersed therein a powder of metallic nickel or of a nickel compound, can be used.

The same applies In other cases using a material other than nickel as the catalytic element.

A solution containing a non-polar solvent, i.e., a toluene solution of nickel 2-ethylhexanatae can be directly applied to the surface of an amorphous silicon film. In this case, it is effective to use a material such as an adhesive generally employed in forming a resist. However, the use of the adhesive in an excess amount reversely interferes the transfer of the catalytic element into amorphous silicon.

The catalytic element is incorporated into the solution approximately in an amount as nickel of, though depending on the type of the solution, from 1 to 200 ppm by weight, and preferably, from 1 to 50 ppm by weight. This range of addition is determined by taking the nickel concentration of the crystallized film and the resistance against hydrofluoric acid into consideration.

EXAMPLE 5

In the present example, a nickel film is patterned into islands on a glass substrate made of Corning 7059. Using this film as a starting material, an amorphous silicon film is crystallized. Using the obtained crystalline silicon film, TFTs are fabricated. This process is described below. Two methods are available to pattern the nickel film into islands. In one method, the nickel film is formed under the amorphous silicon film, as shown in FIG. 9(A-1). In the other, the nickel film is formed on the amorphous film, as shown in FIG. 9(A-2). In the latter method, after nickel is deposited over the whole surface of the amorphous silicon film, the nickel film is selectively etched. The nickel slightly reacts with the amorphous silicon, thus producing nickel silicide. If this silicide is left, a silicon film of high crystallinity what the present invention is intended to provide will not be obtained. Therefore, it is necessary to sufficiently remove the nickel silicide with hydrochloric acid or hydrofluoric acid. Consequently, the thickness of the amorphous silicon is reduced compared with the thickness obtained at the beginning.

The former method does not present such a problem. It Ls necessary, however, to etch away the nickel film completely except for the islands. To suppress the effects of the remaining nickel, the substrate is treated with oxygen plasma, ozone, or the like to oxidize the nickel except for the islands.

In either method, a 2000 Å-thick silicon oxide film 101B forming a base layer was formed on a substrate 101A made of Corning 7059 by plasma CVD. The amorphous silicon film, indicated by numeral 101, had a thickness of 200 to 3000 Å, preferably 500 to 1500 Å, and was fabricated by plasma CVD or low-pressure CVD. The amorphous silicon film was annealed at 350 to 450° C. for 0.1 to 2 hours to release hydrogen atoms. When the hydrogen concentration of the film was less than 5 atomic %, crystallization was easily conducted.

In the method shown in FIG. 9(A-1), before formation of the amorphous silicon film 101, nickel was sputtered to a thickness of 50 to 1000 Å, preferably 100 to 500 Å. This nickel film was photolithographically patterned to form islands 102 of nickel.

Figure 8A:
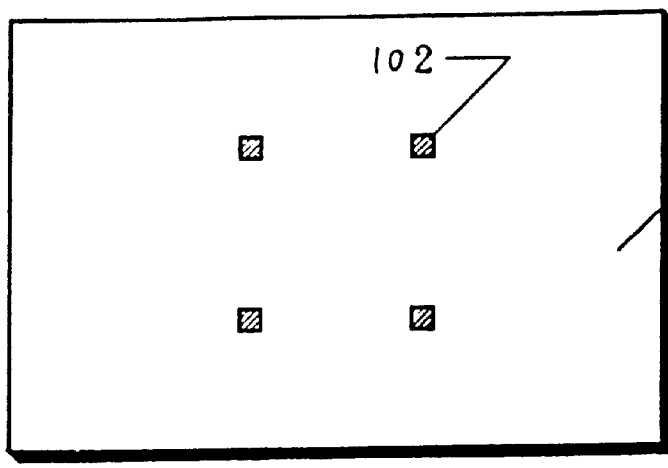
FIGS. 8(A) to 8(C) are top views of TFTs illustrating crystallization steps for manufacturing the TFTs according to the invention and their arrangement.

In the method shown in FIG. 9(A-2), after the formation of the amorphous silicon film 101, nickel was sputtered to a thickness of 50 to 1000 Å, preferably 100 to 500 Å. Then, this nickel layer was photolithographically patterned to form islands 102 of nickel. FIG. 8(A) is a top view of these islands 102.

Each island of nickel is a square having sides of 2 $\mu$m and the spacing between the successive islands is 5 to 50 $\mu$m e.g., 20 $\mu$m. Similar advantages can be obtained by using nickel silicide instead of nickel. When the nickel film was formed, good results could be obtained by heating the substrate at 100 to 500° C., preferably 180 to 250° C., because the adhesion of the nickel film to the underlying silicon oxide film is improved, and because silicon oxide reacts with nickel, producing nickel silicide. Similar advantages can be derived by using silicon nitride, silicon carbide, or silicon instead of silicon oxide.

Then, the laminate was annealed at 450 to 650° C., e.g., 550° C., for 8 hours in a nitrogen ambient. FIG. 9(B) shows an intermediate state. In FIG. 9(A) islands of nickel film located at two ends grow as nickel silicide 103A toward the center. Those portions 103 through which the nickel has passed are made of crystalline silicon. Finally, as shown in FIG. 9(C), the two growing nickel crystal portions meet, leaving behind the nickel silicide 103A in the center. Thus, the crystallization process ends.

Figure 8B:
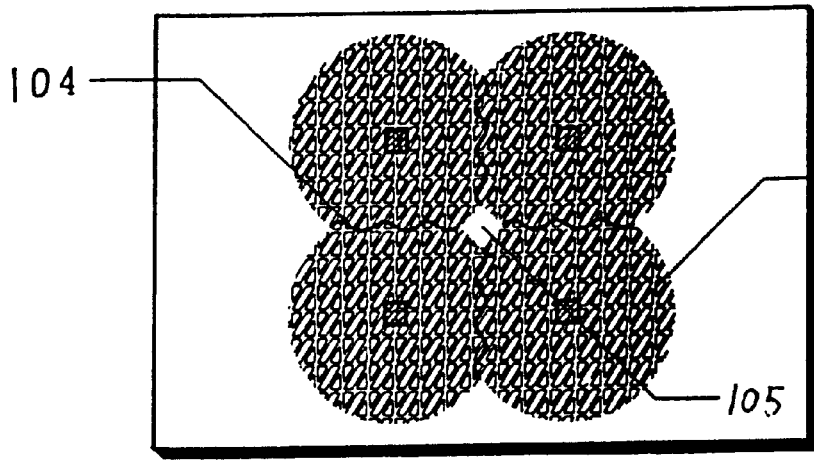

FIG. 8(B) is a top view of the laminate under this condition. The nickel silicide 103A shown in FIG. 9(C) forms grain boundaries 104. If the anneal is continued, nickel atoms move along the grain boundaries 104 and are collected in a region 105 located among the islands of nickel. In this stage, the original shape of the islands is not retained.

Figure 8C:
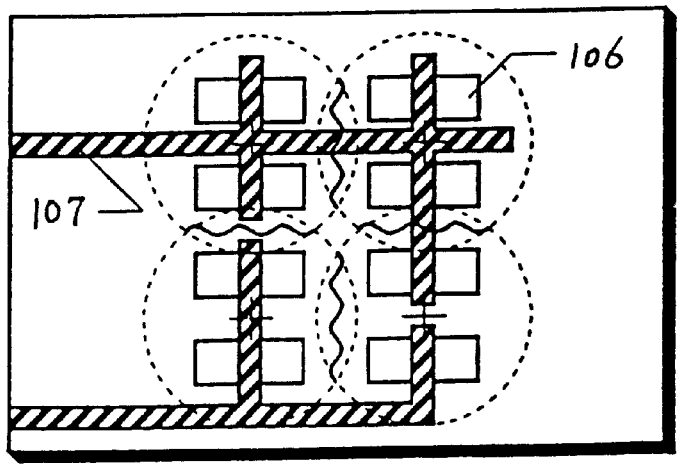

A crystalline silicon can be obtained by the steps described thus far. It is not desired that nickel atoms diffuse from the produced nickel silicide 103A into the semiconductor film. Therefore, it is desired to etch the nickel film with hydrofluoric acid or hydrochloric acid. Neither hydrofluoric acid nor hydrochloric acid affects the silicon film. The laminate having the etched nickel film is shown in FIG. 9(D). The grain boundaries form grooves 104A. It is not desired to form semiconductor regions, or active layers, of TFTs on opposite sides of each groove. An example of arrangement of the TFT is shown in FIG. 8(C), where semiconductor regions 106 are arranged so as not to intersect the grain boundaries 104. On the other hand, gate interconnects 107 may intersect the grain boundaries 104.

Examples of method of fabricating TFTs using the crystalline silicon obtained by the steps described thus far are shown to FIG. 10, (A)–(C) and 11, (A)–(C). In FIG. 10(A), a central portion X indicates a location where the groove 104A existed. The semiconductor regions of the TFTs are arranged so as not to intersect this central portion X. More specifically, the crystalline silicon film 103 obtained by the steps of FIG. 9(A-1) to (D), was patterned to form island-shaped semiconductor regions 111a and 111b. Then, a silicon oxide film 112 acting as a gate-insulating film was formed by RF plasma CVD, ECR plasma CVD, sputtering, or other method.

Thereafter, a polysilicon film having a thickness of 3000 to 6000 Å and doped with phosphorus atoms at a concentration of $1 \times 10^{20}$ to $5 \times 10^{20}$ cm$^{-3}$ was formed by LPCVD. This film was photolithographically patterned to form gate electrodes 113a and 113b (FIG. 10(A)).

Then, an impurity was implanted by plasma doping. In the case of an N-type semiconductor, phosphine ($PH_3$) was used as a dopant gas. In the case of a P-type semiconductor, diborane ($B_2H_6$) was used as a dopant gas. In the illustrated example, N-type TFTs are shown. Phosphine ions were accelerated at 80 kV. Diborane ions were accelerated at 65 kV. The laminate was annealed at 550° C. for 4 hours to activate the dopant, thus forming doped regions 114a to 114d. For the activation, a method using optical energy such as laser annealing or flash lamp annealing can be used (FIG. 10(B)).

Finally, silicon oxide was deposited to a thickness of 5000 Å to form an interlayer insulator 115 in the same way as in normal fabrication of TFTs. Contact holes were created in this insulator 115. Conductive interconnects and electrodes 116a to 116d were formed (FIG. 10(C)).

TFTs were fabricated by the steps described thus far. In the illustrated example, the TFTs were of the H-channel type. The field-effect mobility of the obtained TFTs was 40 to 60 $cm^2/V$ s for the N-channel type and 30 to 50 $cm^2/V$ s for the P-channel type.

FIG. 11, (A)–(C), show fabrication of TFTs having aluminum gates. In FIG. 11(A), a central portion X indicates a location where the groove 104A (FIG. 9(D)) existed. The semiconductor regions of the TFTs do not intersect this central portion X. More specifically, the crystalline silicon film 103 obtained by the steps of FIG. 9, (A-1)–(D), was patterned to form island-shaped semiconductor regions 121a and 121b. Then, a silicon oxide film 122 acting as a gate-insulating film was formed by RF plasma CVD, ECR plasma CVD, sputtering, or other method. Where plasma CVD was employed, if TEOS (tetraethoxysilane) and oxygen were used as raw material gases, good results were obtained. Aluminum containing 1% silicon was sputtered to form an aluminum film having a thickness of 5000 Å. This aluminum film was photolithographically patterned to form gate interconnects and electrodes 123a and 123b.

Then, the laminate was immersed in ethylene glycol solution of 3% tartaric acid. An electrical current was passed between a cathode and an anode which consisted of platinum and the aluminum interconnects, respectively, to effect anodization. The current was increased at a rate of 2 V/min at first. When the current reached 220 V, the voltage was maintained constant. When the current decreased below 10 $\mu A/m^2$, the current was made to cease. As a result, anodic oxides 124a and 124b having a thickness of 2000 Å were formed (FIG. 11(A)).

Then, an impurity was implanted by plasma doping. In the case of an N-type semiconductor, phosphine ($PH_3$) was used as a dopant gas. In the case of a P-type semiconductor, diborane ($B_2H_6$) was used as a dopant gas. In the illustrated example, N-type TFTs are shown. Phosphine ions were accelerated at 80 kV. Diborane ions were accelerated at 65 kV. The impurity was activated by laser annealing to form doped regions 125a to 125d. For this purpose, a KrF laser emitting a wavelength of 248 nm was used. Five shots of laser beam of an energy density of 250 to 300 $mJ/cm^2$ were illuminated (FIG. 11(B)).

Finally, silicon oxide was deposited to a thickness of 5000 Å to form an interlayer insulator 126 in the same way as in normal fabrication of TFTs. Contact holes were created in this insulator 126. Conductive interconnects and electrodes 127a to 127d were formed in the source region and in the drain regions (FIG. 11(C)).

The field-effect mobility of the obtained TFTs was 60 to 120 $cm^2/V$ s for the N-channel type and 50 to 90 $cm^2/V$ s for the P-channel type. A shift register was built, using these TFTs. We have confirmed that this shift register operates at 6 MHz with a drain voltage of 17 V and at 11 MHz with a drain voltage of 20 V.

EXAMPLE 6

FIG. 12, (A)–(C), show a case in which TFTs having aluminum gates were fabricated in the same manner as in the scheme illustrated in FIG. 11, (A)–(C). In this example, an active layer was fabricated from amorphous silicon. As shown in FIG. 12(A), silicon oxide was deposited as a base film 132 on a substrate 131. Amorphous silicon 133 having a thickness of 2000 to 3000 Å was deposited on the film 132. An appropriate amount of P- or N-type impurity may be added to the amorphous silicon film. Subsequently, islands 134A and 134B of nickel or nickel silicide were created as described above. The laminate was annealed at 550° C. for four hours to crystallize the amorphous silicon film.

Figure 12A:
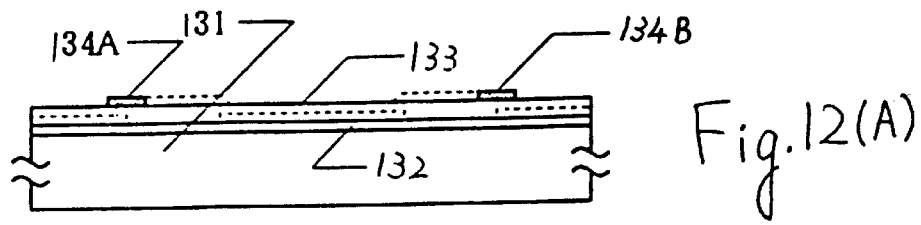
FIGS. 12(A) to 12(C) are cross-sectional views of TFTs illustrating steps of Example 6 of the invention.
Figure 12B:
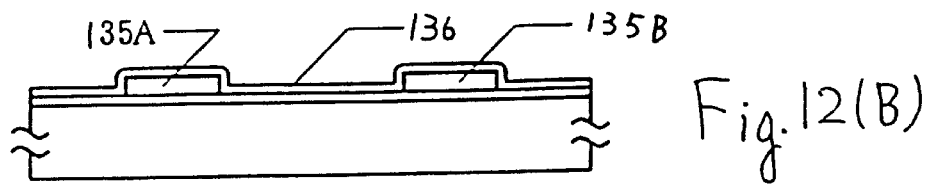

The crystalline silicon film obtained in this way was photolithographically patterned as shown in FIG. 12(B). The silicon film is enriched with nickel in its central portion located between the islands 134A and 134B of the nickel or nickel silicide. Therefore, the patterning step was carried out to exclude this central portion. As a result, island-shaped silicon regions 135A and 135B were formed. A substantially intrinsic amorphous silicon film 136 was deposited on the island-shaped silicon regions 135A and 135B.

Figure 12C:
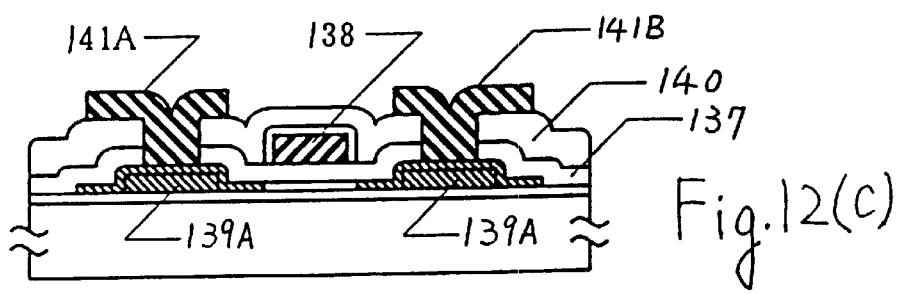

Then, as shown in FIG. 12(C), a gate-insulating film 137 was fabricated from silicon nitride, silicon oxide, or the like. Gate electrodes 138 ware fabricated from aluminum. In the same way as in the method illustrated in FIG. 11, (A)–(C), anodization was effected. Impurity atoms were diffused by ion implantation to form doped regions 139A and 139B. Then, an interlayer insulator 140 was deposited. Contact holes were created. Metal electrodes 141A and 141B were formed on the source and drain electrodes, thus completing TFTs. These TFTs are characterized in that the semiconductor regions of the source and drain electrodes are thick compared with the thickness of the active layer and that the resistivity is small. In consequence, the resistances of the source and drain regions are small, and the characteristics of the TFTs are improved. Furthermore, it is easy to form contacts.

EXAMPLE 7

FIG. 13, (A)–(C), show fabrication of CMOS TFTs. As shown in FIG. 13(A), silicon oxide was deposited as a base film 152 on a substrate 151. An amorphous silicon film 153 having a thickness of 1000 to 1500 Å was deposited. Islands 154 of nickel or nickel silicide were formed as described above. The laminate was annealed at 550° C. During this step, a nickel silicide region 155 was grown, and the crystallization progressed. The anneal was conducted for 4 hours. As shown in FIG. 13(B), the amorphous silicon film changed Into crystalline silicon. As the crystallization progressed, nickel silicide regions 159A and 159B were urged toward the opposite ends.

Figure 13A:
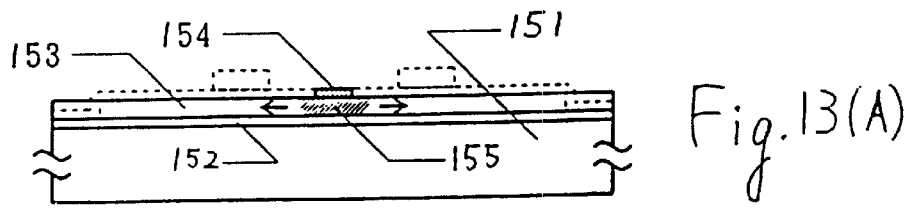
FIGS. 13(A) to 13(C) are cross-sectional views of TFTs illustrating steps of Example 7 of the invention.
Figure 13B:
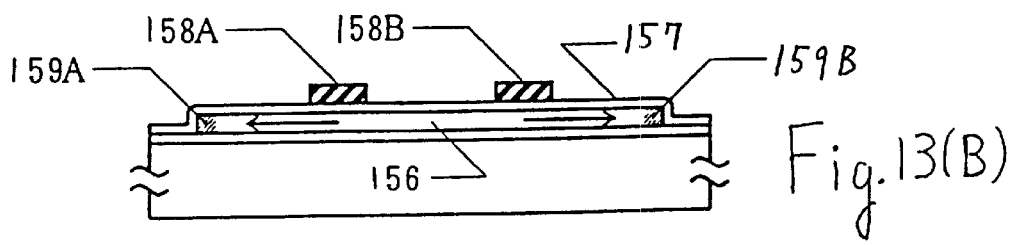
Figure 13C:
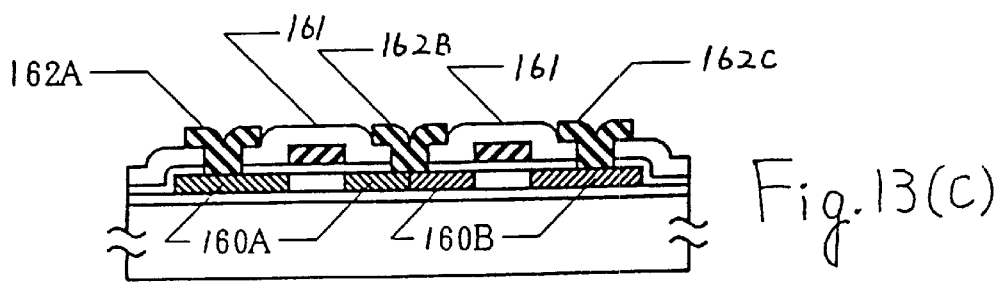

The crystalline silicon film obtained in this way was patterned photolithographically as shown in FIG. 13(B) to form an island silicon region 156. It is to be noted that the island region is enriched with nickel at both ends. After the formation of the island silicon region, a gate-insulating film 157, and gate electrodes 158A, 158B were formed.

Then, as shown in FIG. 12(C), impurity ions were diffused by ion implantation to form an N-type doped region 160A and a P-type doped region 160B. For example, phosphorus was used as the N-type impurity. Phosphine (PH$_3$) was used as a dopant gas. Impurity ions were implanted into the whole surface at an accelerating voltage of 60 to 110 kV. Then, the N-channel TFTs were coated with a photoresist. P-type impurity such as boron was implanted at an accelerating voltage of 40 to 80 kV. Diborane (B$_2$H$_6$) was used as a dopant gas.

After the ion implantation, laser light was illuminated in the same way as in the steps illustrated in FIG. 11, (A)–(C), to activate the source and drain electrodes. Subsequently, an interlayer insulator 161 was deposited. Contact holes were created. Metal electrodes 162A, 162B, and 162C were formed on the source and drain electrodes, thus completing TFTs.

EXAMPLE 8

The present example is similar to the steps of Example 7 except that a laser illumination step was carried out to improve the crystallinity of the crystalline silicon film further aster the crystallization step in which the laminate was heated at 550° C. for 4 hours.

In the present example, CMOS TFTs were fabricated in the manner as shown in FIG. 14, (A)–(D). First, as shown in FIG. 14(A), silicon oxide was sputtered to a thickness of 2000 Å to form a base film 152 on a substrate 151. An amorphous silicon film 153 having a thickness of 1000 to 1500 Å was formed by plasma CVD. Islands 154 of nickel or nickel silicide were then created.

Figure 14A:
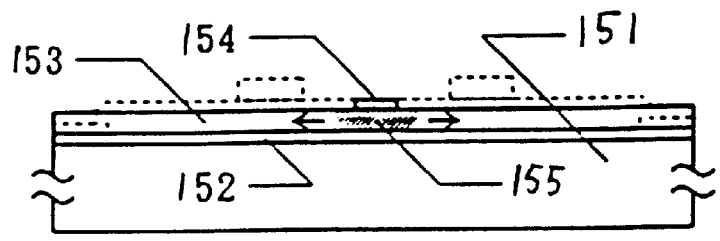
FIGS. 14(A) to 14(D) are cross-sectional views of TFTs illustrating steps of Example 8 of the invention.
Figure 14B:
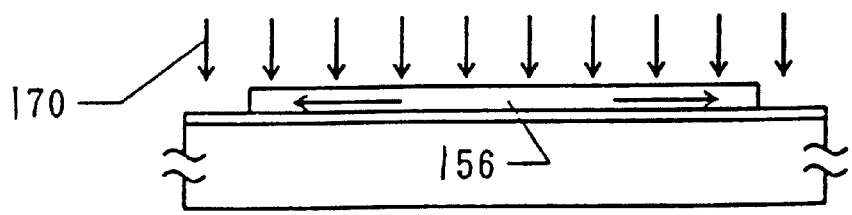

The laminate was annealed at 550° C. for four hours within a nitrogen ambient. During this step, the nickel silicide region 155 was grown, i e., crystallization progressed. A crystalline silicon film obtained in this way was photolithographically patterned as shown in FIG. 14(B) to form island-shaped silicon regions 156.

KrF excimer laser radiation 171 having a wavelength of 248 nm and a pulse duration of 20 nsec was illuminated. Two shots of the laser radiation were illuminated. The energy of each shot was 250 mJ/cm$^2$ The illumination energy may be set to 200 to 400 mJ/cm$^2$, taking account of various conditions such as the film thickness and the substrate temperature. An XeCl laser emitting a wavelength of 308 nm or an ArF laser emitting a wavelength of 193 nm can be used as the laser.

Furthermore, other intense light source which can produce the same effects as laser illumination can also be used. Especially, rapid thermal annealing (RTA) techniques exploiting infrared irradiation permits silicon to selectively absorb infrared radiation. Hence, an anneal can be carried out efficiently. The laser illumination may be effected prior to the patterning step.

After he above mentioned thermal annealing, a crystal region was formed in the silicon film 153. However a non-crystallized region may remain in the silicon film 153 (not shown in the figures)

The crystallinity of the crystalled region was further improved by the subsequent laser annealing or RTA. Therefore, this region is suitable as an active region of thin firm transistors. On the other hand, while the non-single crystallized region was also converted into a polycrystalline structure, the result of Raman spectroscopy on this region revealed that the crystallinity is relatively poor as compared with the previously crystallized region. Also, innumerable crystallites were observed through transmission electron microscopy in the non-crystallized region after the laser annealing or RTA, while relatively large crystals uniformly oriented were observed in the previously crystallized region.

This means that the non-crystallized region includes a number of grain boundaries even after the laser annealing or RTA and therefore, is not so suitable as an active region of thin film transistors.

Therefore, it is preferable to remove the non-crystallized region so as to form silicon islands to become TFTs either before or after the laser annealing or RTA.

Figure 14C:
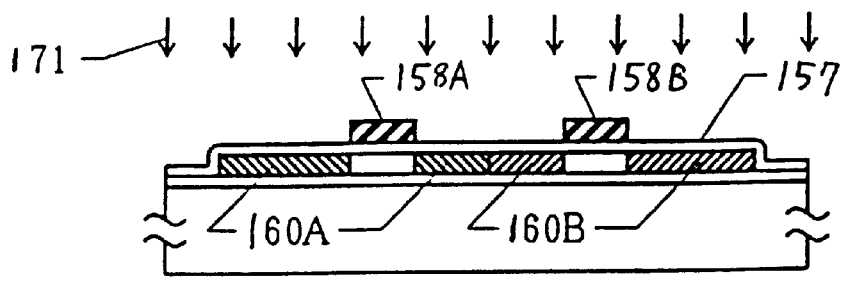
Figure 14D:
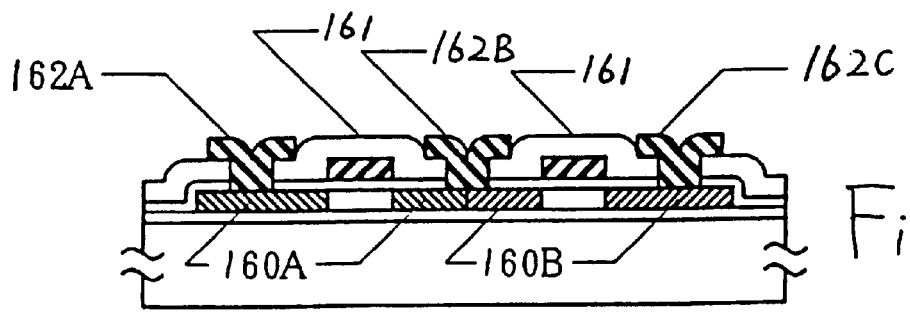

Then, gate electrodes 158A and 158B consisting mainly of silicon were formed. As shown in FIG. 14(C), impurity atoms were diffused by ion implantation to form N-type doped regions and P-type doped regions 160A and 160B, respectively. For example, phosphorus was used as an N-type impurity. Phosphine (PH$_3$) was used as a dopant gas. The impurity ions were implanted into the whole surface at an accelerating voltage of 60 to 110 kV. Subsequently, a photoresist was coated on the N-channel TFT regions. P-type impurity ions such as boron ions were implanted at an accelerating voltage of 40 to 80 kV, using diborane (B$_2$H$_6$) as a dopant gas.

After the ion implantation, the source and drain electrodes were activated by laser illumination. An interlayer insulator 161 was deposited, and contact holes were created. Metal electrodes 162A, 162B, and 162C were formed on the source and drain electrodes, thus completing TFTs.

In the present example, a catalytic element was introduced to promote crystallization. In this way, a low-temperature, short crystallization steps was used together with an annealing step using laser Illumination. The crystallization step was affected at 550° C. for about four hours. In this way, a silicon film of good crystallinity could be obtained. High-performance TFTs could be derived, using such a crystalline silicon film.

More specifically, the N-channel TFTs obtained in Example 5 had a field-effect mobility of 40 to 60 cm$^2$/V s for the silicon gate type (FIG. 10, (A)–(C)) and a field-effect mobility of 60 to 120 cm$^2$/V s for the aluminum gate type (FIG. 11, (A)–(C)). The threshold voltage was 3 to 8 V. The mobility of the N-channel TFTs obtained in the present example was 150 to 200 cm$^2$/V s, and the threshold voltage was 0.5 to 1.5 V. It is to be noted that the mobility was improved greatly and that variations in threshold voltage decreased.

These characteristics were heretofore attainable only with laser crystallization of an amorphous silicon film. In the prior art laser crystallization, the obtained silicon films differed widely in characteristics. Also, temperatures higher than 400° C. were needed for crystallization. Furthermore, illumination of a high laser energy exceeding 350 mJ/cm$^2$ was required. Hence, mass production has suffered from problems. In the present example, a lower substrate temperature and a lower energy density suffice. In consequence, mass production can be carried out without difficulty. In addition, variations are comparable to variations occurring when a solid phase crystal growth method using conventional thermal anneal is used. Hence, the obtained TFTs are uniform in characteristics.

In the present invention, if the concentration of nickel is low, the silicon film is not crystallized sufficiently, and the characteristics of TFTs were not good. In the present example, however, even if the crystallinity of the silicon film is not sufficiently high, it can be compensated for by subsequent laser illumination. Therefore, if the concentration of nickel is low, the characteristics of the TFT are not deteriorated Consequently, the concentration of nickel in the active layer regions of devices can be lowered further. This further enhances electrical stability and reliability of the devices.

EXAMPLE 9

In the present example, a catalytic element for promotions crystallization of amorphous silicon is added to a solution. This solution is applied to the amorphous silicon film. In this way, the catalytic element is introduced in the amorphous silicon film.

Also, in the present example, the catalytic element is selectively introduced. A crystal is grown from the region in which the catalytic element has been introduced to the region in which the catalytic element has not been introduced. In this way, a crystalline silicon film lightly doped with the catalytic element is obtained.

FIG. 15, (A)–(D), schematically illustrate steps for manufacturing the present example. It is to be noted that like components are indicated by like reference numerals in both FIGS. 9 and 15.

First, silicon oxide was sputtered to a thickness of 2000 Å to form a base film 101B on a glass substrate made of Corning 7059. The substrate was 10 cm square. Then, an amorphous silicon film 101 having a thickness of 1000 Å was formed by plasma CVD.

Thereafter, a silicon oxide film 180 having a thickness of 2000 Å was formed. Our experiment has demonstrated that if the thickness of the silicon oxide film 180 is set to 500 Å, then no problems take place. We consider that if the film is dense, the film thickness cam be reduced further.

The silicon oxide film 180 was patterned Into a desired pattern by normal photolithography techniques. Ultraviolet radiation was illuminated for 5 minutes in an oxygen ambient to form a thin silicon oxide film 182 on the exposed surface of the amorphous silicon film 101. We think that the thickness of the silicon oxide film 182 is approximately 20 to 50 Å (FIG. 15(A)).

This silicon oxide film is intended to improve the wettability of the solution applied in a later step. Under this condition, 5 ml of acetate solution was dripped onto a substrate 10 cm square. The acetate solution was prepared by adding 100 ppm by weight of nickel to acetate solution. At this time, the laminate was spun at 50 rpm by a spinner 84, and a uniform water film 183 was formed over the whole surface of the substrate. This condition was maintained for 5 minutes. Then, the laminate was spun at 2000 rpm for 60 seconds by the spinner 184 to dry the laminate. The water film may also be maintained on the spinner by rotating the laminate at 0 to 150 rpm (FIG. 15(A)).

Nickel was introduced in region 185 by the steps described above. The laminate was thermally treated at 300 to 500° C. to form nickel silicide on the surfaces of the regions 185. Then, the silicon oxide film 180 acting as a mask was removed. The laminate was heated at 550° C. for four hours in a nitrogen ambient. In this way, the amorphous silicon film 180 was crystallized. At this time, the crystal was grown laterally, i.e., parallel to the substrate, from the regions 185 doped with nickel to regions in which nickel was not introduced. Of course, crystallization takes place in regions where nickel was directly introduced.

Thermal processing was performed to form a silicon nickel film on the surfaces of the regions 185, followed by removal of the silicon oxide film 180. In a modified example, the laminate was heated at 550° C. for four hours without removing the silicon oxide film 180, and crystallization was induced. In this case, the step for creating the nickel silicide film was not required. The silicon oxide film 180 may be removed after the crystallization step.

Figure 15A:
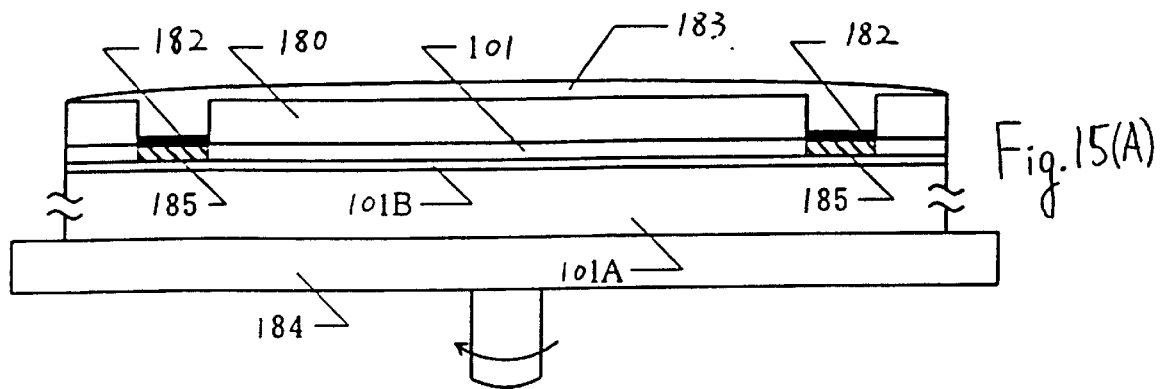
FIGS. 15(A) to 15(D) are cross-sectional views of TFTs illustrating steps of Example 9 of the invention.
Figure 15B:
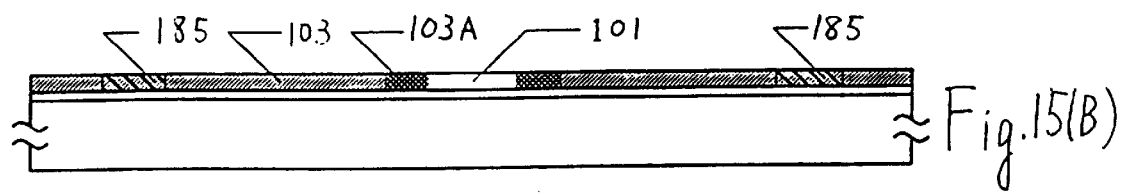
Figure 15C:
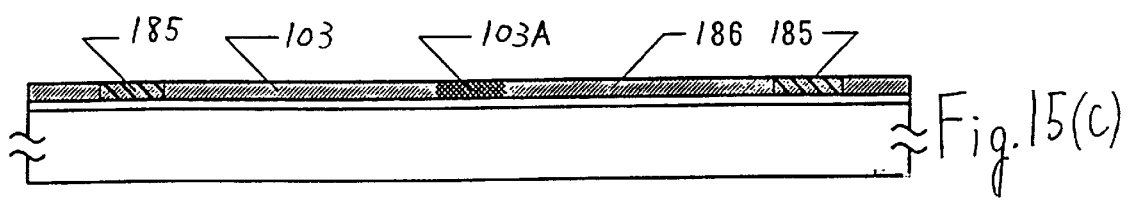

FIG. 15(B) shows a state in which crystallization is in progress. In particular, nickel which was introduced in marginal portions goes as nickel silicide 103A toward the center. The portions 103 through which nickel has passed are crystalline silicon. If the crystallization proceeds further, the two portions starting from the portions 185 in which nickel was introduced meet, as shown in FIG. 15(C), leaving behind the nickel silicide 103A between them. Thus, the crystallization process ends.

Figure 15D:
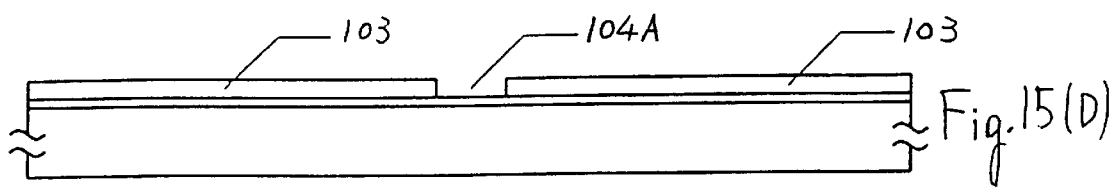

A crystalline silicon could be obtained by the steps described above. It is not desired that nickel diffuse from the resulting nickel silicide 103A into the semiconductor film. Accordingly, regions 103A were etched away with hydrofluoric acid or hydrochloric acid. This condition is shown in FIG. 15(D). The portions where grain boundaries existed formed grooves 104A.

Figure 16:
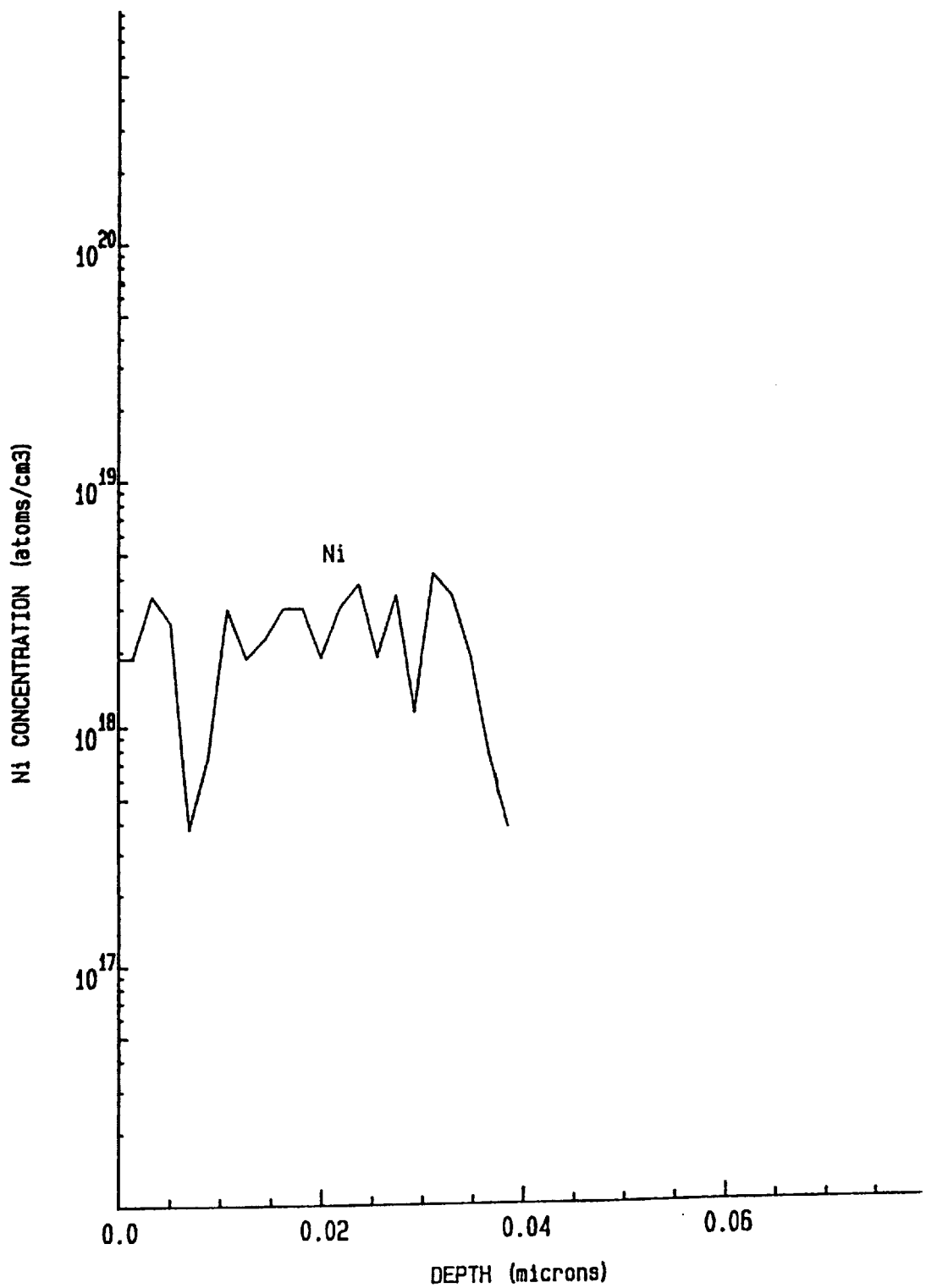
FIG. 16 is a graph showing the concentration of nickel in a crystalline silicon film in Example 9 of the invention.

In FIG. 15(C), crystallization proceeded laterally from the regions 185 through regions 186. The concentration of nickel in the regions 186 are shown in FIG. 16, which indicates the distribution of nickel in the direction of thickness of the regions 186 of the crystalline silicon film which has undergone the crystallization step. The distribution was measured by SIMS. It has been confirmed that the concentration of nickel in the regions 185 in which nickel was directly introduced is higher than the concentrations whose distribution is shown in FIG. 16 by at least one order of magnitude. Using the crystalline silicon film obtained in this way, TFTs were fabricated by the same method as was used in Example 5.

The crystalline silicon film derived in this way was illuminated with laser light or other equivalent intense light to improve the crystallinity further effectively in the same way as in Example 8. In Example 8, the concentration of nickel in the silicon film was relatively high and so laser illumination caused nickel to be deposited out of the silicon film. Particles of nickel having dimensions of the order of 0.1 to 10 $\mu$m were formed in the silicon film. As a result, the morphology of the film deteriorated. In the present example, however, the concentration of nickel can be made much lower than those obtained in Examples 5 and 6. Hence, nickel silicide was not deposited. Also, the film was not roughened by laser illumination.

The nickel concentration shown in FIG. 16 can be controlled by controlling the nickel concentration in the solution. In the present example, the nickel concentration in the solution was set to 100 ppm. We have confirmed that crystallization is possible if the concentration is set to 10 ppm. In this case, the nickel concentration (FIG. 16) in the regions 186 shown in FIG. 15, (A)–(D), can be reduced further by one order of magnitude. However, if the nickel concentration of the solution is reduced, the lateral crystal growth distance shortens.

The silicon film which was crystallized as described thus far can be directly used as an active layer of each TFT. Especially, formation of the active layer of each TFT using regions 186 is quite useful in that the concentration of the catalytic element is low.

In the present example, acetate solution is used as a solution containing a catalytic element. This solution can be selected from various water solutions and organic solvents and solutions. The form of the catalytic element is not limited to compounds. The catalytic element may be simply dispersed in a solution.

Where nickel is used as a catalyst and contained in a polar solvate such as water, alcohol, acid, or ammonia, the nickel is introduced as a nickel compound. Typical examples of the nickel compound include nickel bromide, nickel acetate, nickel oxalate nickel carbonate, nickel chloride, nickel iodide, nickel nitrate, nickel sulfate, nickel formate, nickel acetylacetonate, 4-cyclohexyl butyric nickel, nickel oxide, and nickel hydroxide.

The solvent can be selected from non-polar solvents, i.e., benzene, toluene, xylene, carbon tetrachloride, chloroform, and ether.

In this case, the nickel is introduced in the form of a nickel compound. Typical examples of the nickel compound are nickel acetylacetonate, and 2-ethylhexylic nickel.

Also, it is advantageous to add a surfactant to the solution containing a catalytic element. This improves the adhesion to the applied surface and controls the adsorptivity. This surfactant may be previously applied to the surface. Where simple nickel is used as the catalytic element, it is necessary to dissolve it in an acid, thus producing a solution.

In the example described above, a solution in which nickel, or a catalytic element, is fully dissolved is used. It is not always necessary that nickel be fully dissolved. In this case, a material such as emulsion may be used which comprises a medium in which powder of simple nickel or a nickel compound is uniformly dispersed. Also, a solution used for formation of an oxide film may be employed. OCD (Ohka diffusion source) produced by TOKYO OHKA KOGYO CO., LTD. can be used as the solution. Where this OCD solution is used, it is applied to a surface to be coated, and then it is baked at about 200° C. In this way, a silicon oxide film can be easily formed. Furthermore, any impurity can be utilized, because an impurity can be added at will.

These principles apply where materials other than nickel are used as catalytic elements. there a non-polar solvent such as toluene Solution of 2-ethylhexylic nickel is used, it can be directly applied to the surface of an amorphous silicon film. In this case, it is advantageous to previously apply a material such as an intimate contact agent used for resist application. However, if the amount of application is too large, the introduction of the catalytic element in the amorphous silicon will be hindered.

The amount of the catalytic element contained in the solution depends on the kind of the solution. Roughly, the ratio of the weight of nickel to the weight of solution is 200 to 1 ppm, preferably 50 to 1 ppm. This range has been determined, taking account of the concentration of nickel in the film after completion of crystallization and the resistance to hydrofluoric acid.

In the present example, a solution containing a catalytic element is applied to the top surface of an amorphous silicon film. Before the formation of the amorphous silicon film, a solution containing the catalytic element may be applied to the base film.

EXAMPLE 10

A method of obtaining a crystalline silicon film by forming a nickel film on a substrate of Corning 7059 glass and crystallizing an amorphous silicon film with this nickel film as a catalyst will now be described with reference to FIG. 17. On a substrate 201, a base silicon oxide film 202 of thickness 2000 Å was formed by the plasma CVD method. Next, a nickel film 203 of thickness less than 1000 Å, for example 50 Å, was deposited by sputtering. The nickel film of thickness less than 100 Å was of a form which would be more accurately described as particles, or clusters of pluralities of particles joined together, than as a film. Good results were obtained when the substrate was heated to 100 to 500° C., preferably 180 to 250°C., for the formation of the nickel film. This Is because the adhesion between the silicon oxide bass film and the nickel film is improved. A nickel silicide could have been used in place of the nickel. (FIG. 17(A))

After that, an amorphous silicon film 204 of thickness 500 to 3000 Å, for example 1500 Å was deposited by plasma CVD, and hydrogen purging was carried out in a nitrogen atmosphere at 430° C. for 0.1 to 2 hours, for example 0.5 hours. (FIG. 17(B))

Figure 17A:
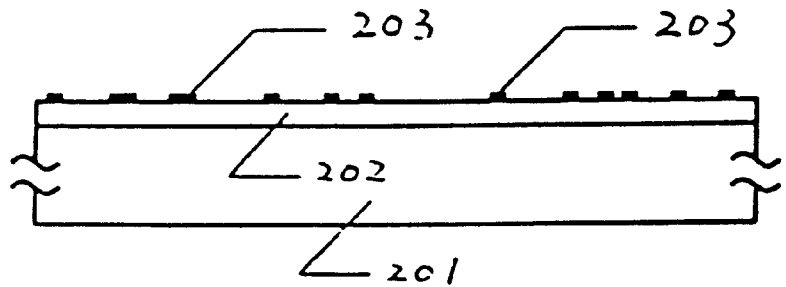
FIGS. 17(A) to 17(C) are cross-sectional views of a substrate undergoing a manufacturing process according to Example 10 of the invention.
Figure 17B:
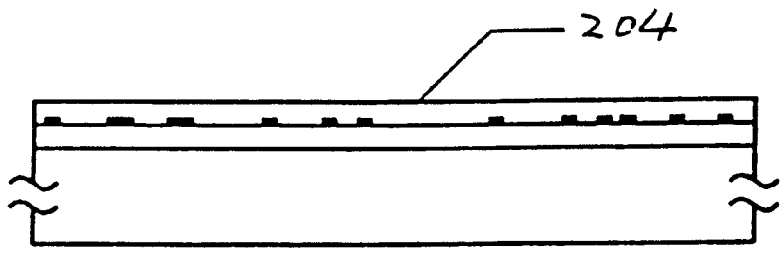
Figure 17C:
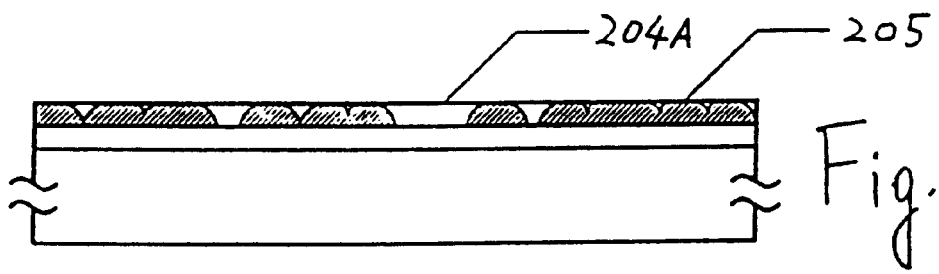

Next, this was annealed in a nitrogen atmosphere in an annealing furnace at 450 to 580° C., for example 550° C., for 8 hours. FIG. 17(C) illustrates the state during this annealing in which crystallization progresses as nickel diffuses from the previously formed nickel film (particles, clusters) and crystalline silicon regions 205 grow and spread throughout the amorphous region 204A.

After the crystallization finished, a temperature of 400 to 600° C., for example 550° C., was maintained, trichloroethylene ($C_2HCl_3$) was diluted with hydrogen or oxygen to 1 to 10% for example 10%, and introduced into the annealing furnace, and annealing was carried out for 0.1 to 2 hours, for example 1 hour. When the specimen thus chlorination treated was analyzed by secondary ion material spectrometry (SIMS), the concentration of nickel in the silicon film was 0.01 atomic%. The concentration of nickel in a specimen on which chlorination treatment was not performed was as much as 5 atomic%.

EXAMPLE 11

A eleventh preferred embodiment is illustrated in FIG. 18. A base silicon oxide film 202 of thickness 2000 Å was formed on a Corning 7050 glass substrate 201 by plasma CVD. Next, an amorphous silicon film 204 of thickness 500 to 3000 Å, for example 1500 Å, was deposited by plasma CVD and hydrogen purging was carried out in am atmosphere of nitrogen at 430° C. for 0.1 to 2 hours, for example 0.5 hours.

After that, a nickel film 203 of thickness less than 1000 Å, for example 80 Å, was deposited by sputtering. The nickel film of thickness less than 100 Å was of a form which would be more accurately described as particles, or clusters of pluralities of particles joined together, than as a film. For formation of the nickel film, good results were obtained when the substrate was heated to 100 to 500° C., and preferably 180 to 250° C. This is because the adhesion between the silicon oxide base film and the nickel film improves. A nickel silicide could have been used in place of the nickel. (FIG. 18(A))

Figure 18A:
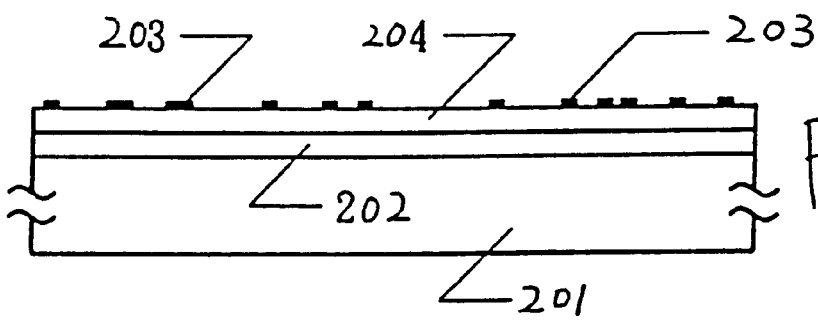
FIGS. 18(A) and 18(B) are cross-sectional views of a substrate undergoing a manufacturing process according to Example 11 of the invention.
Figure 18B:
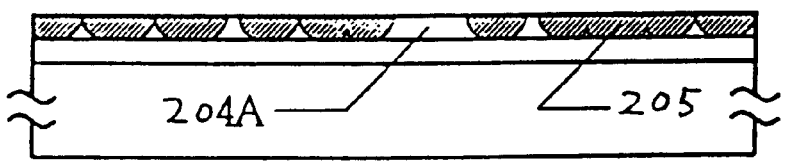

Next, this was annealed in a nitrogen atmosphere in an annealing furnace at 450 to 580° C., for example 550° C., for 4 hours. FIG. 18(B) illustrates the way in which, during this annealing, as nickel diffuses from the previously formed nickel film (particles, clusters), crystallization progresses, and crystalline silicon regions 205 grow and spread throughout the amorphous region 204A.

After the crystallization finished, a temperature of 400 to 600° C., for example 580° C., was maintained, trichloroethylene ($C_2HCl_3$) was diluted with hydrogen or oxygen to 1 to 10%, for example 5%, and introduced into the annealing furnace, and annealing was carried out for 0.1 to 2 hours, for example 0.5 hours.

EXAMPLE 12

A twelfth preferred embodiment is illustrated in FIG. 19. A base silicon oxide film 232 of thickness 2000 Å was formed on a Corning 7059 glass substrate 231 by plasma CVD. Next, a nickel film 233 of thickness less than 1000 Å for example 80 Å, was deposited by sputtering. (FIG. 19(A))

The whole surface was then coated with a photoresist, and using a commonly known photolithography method a resist pattern 234 was formed. (FIG. 19(B))

This was then immersed in a suitable etchant, for example 5 to 30% hydrochloric acid solution, and the exposed parts of the nickel film were removed. The film can be removed in the same way in cases where nickel silicide was used. (FIG. 19(C))

The photoresist was then removed by a commonly known method, and a nickel film pattern 235 was formed. (FIG. 19(D))

Figure 19A:
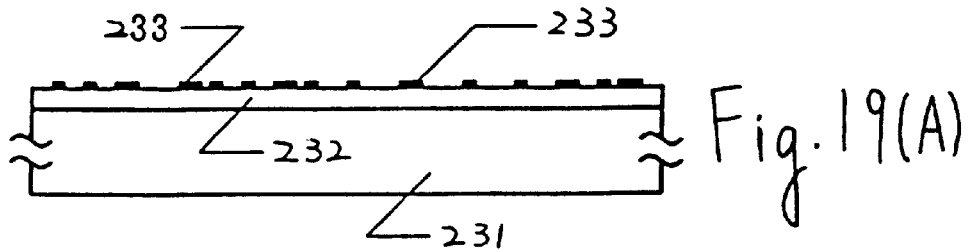
FIGS. 19(A) to 19(E) are cross-sectional views of a substrate undergoing a manufacturing process according to Example 12 of the invention.
Figure 19B:
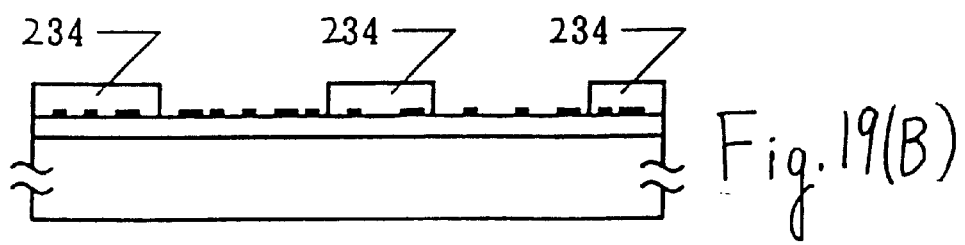
Figure 19C:
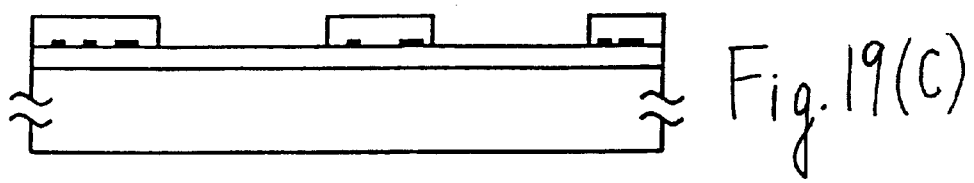
Figure 19D:
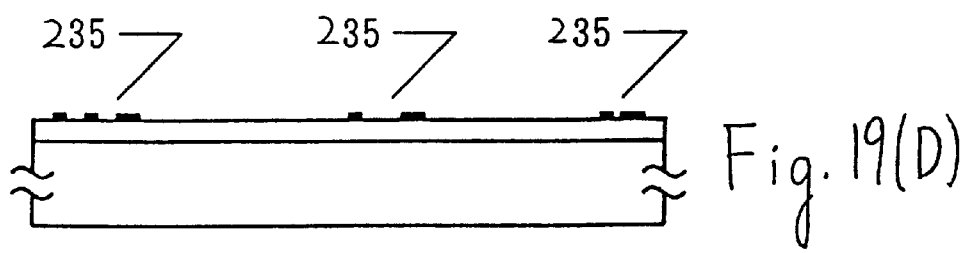
Figure 19E:
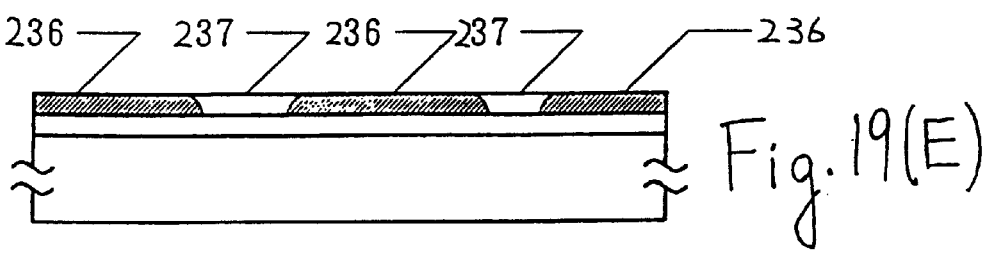

After that, an amorphous silicon film was deposited by plasma CVD to a thickness of 500 to 300 Å, for example 1500 Å, and hydrogen purging was carried out in a nitrogen atmosphere at 430° C. for 0.1 to 2 hourws, for example 0.5 hours. Next, this was annealed in a nitrogen atmosphere in an annealing furnace at 450 to 580° C, for example 550° C., for 4 hours. FIG. 19(E) illustrates the way In which, during this annealing, as nickel diffuses from the previously formed nickel film pattern, crystallization progresses, and crystalline silicon regions 236 grow and spread throughout the amorphous region 237.

After the crystallization finished, a temperature of 400 to 600° C., for example 580° C., was maintained, hydrogen chloride (HCL) was diluted with hydrogen or oxygen to 1 to 10%, for example 10%, and introduced into the annealing furnace, and annealing was carried out for 0.1 to 2 hour, for example 0.5 hours. When the specimen thus chlorination treated was analyzed by secondary ion material spectrometry (SIMS), the concentration of nickel in the silicon film was 5 to 10 PPM. The concentration of nickel in a specimen on which chlorination treatment was not performed was as much as 1 atomic %.

EXAMPLE 13

A thirteenth preferred embodiment is illustrated In FIG. 20. A base silicon oxide film 242 of thickness 2000 Å was formed an a Corning 7059 glass substrate 241 by plasma CVD. Next, an amorphous silicon film 243 of thickness 500 to 3000 Å, for example 1500 Å, was deposited by plasma CVD, and then a nickel film 244 of thickness less than 1000 Å for example 80 Å, was deposited by sputtering. (FIG. 20(A))

The whole surface was coated with a photeresist, and using a commonly known photolithography method a resist pattern 245 was formed. (FIG. 20(B))

This was then immersed in a suitable etchant, for example 5 to 30% hydrochloric acid solution, and the exposed parts of the nickel film were thereby removed. (FIG. 20(C))

The photoresist was then removed by a commonly known method, and a nickel film pattern 246 was formed. (FIG. 20(D))

Figure 20A:
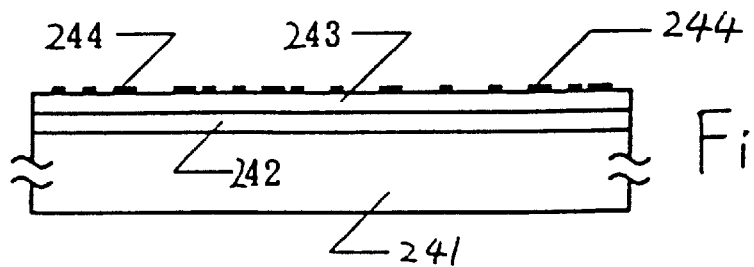
FIGS. 20(A) to 20(E) are cross-sectional views of a substrate undergoing a manufacturing process according to Example 13 of the invention.
Figure 20B:
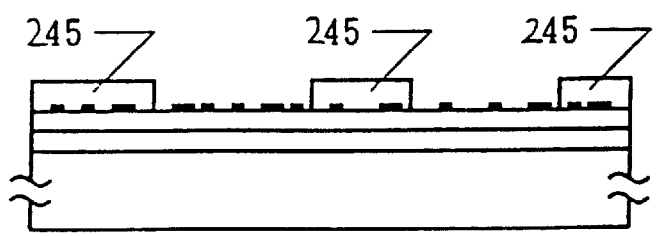
Figure 20C:
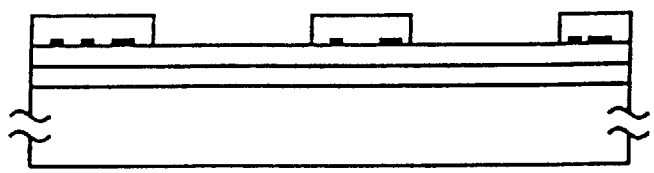
Figure 20D:
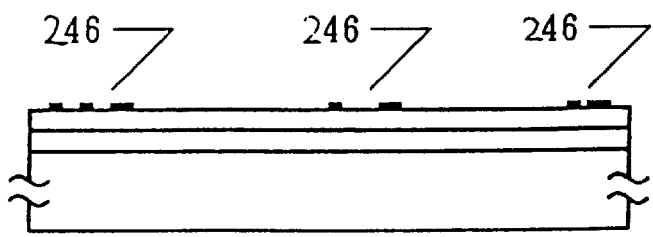
Figure 20E:
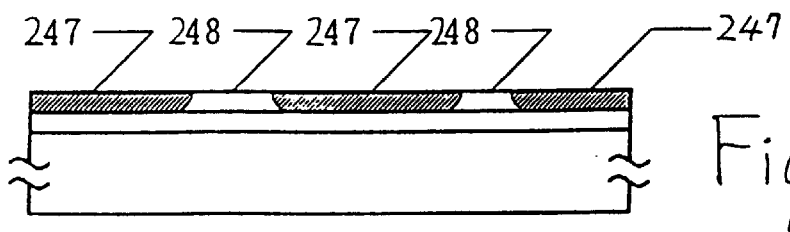
Figure 21A:
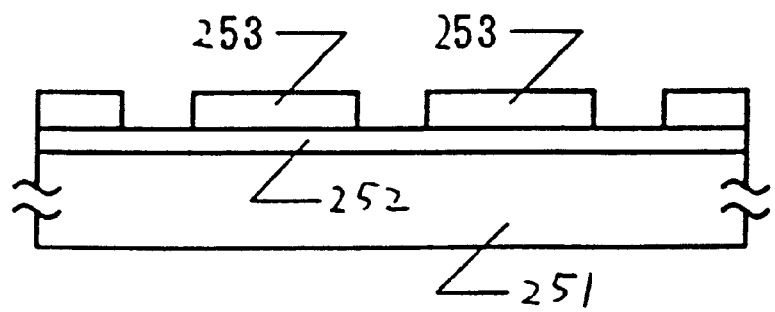
FIGS. 21(A) to 21(D) are cross-sectional views of a substrate undergoing a manufacturing process according to Example 14 of the invention.
Figure 21B:
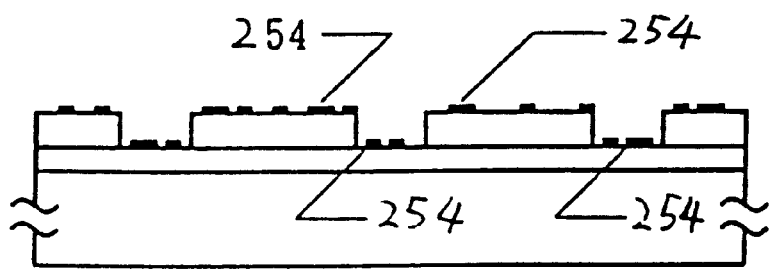
Figure 21C:
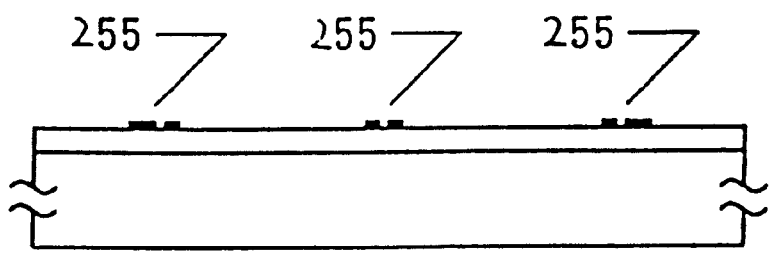
Figure 21D:
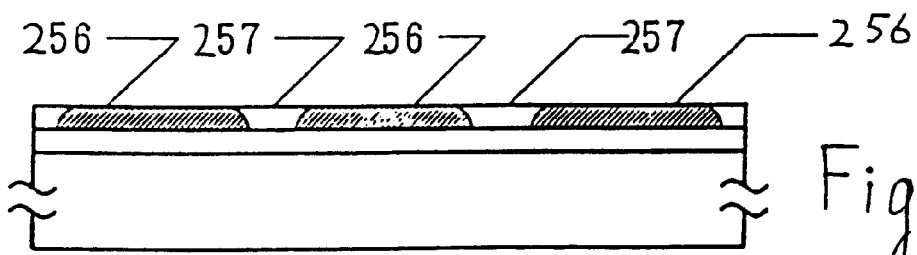
Figure 22A:
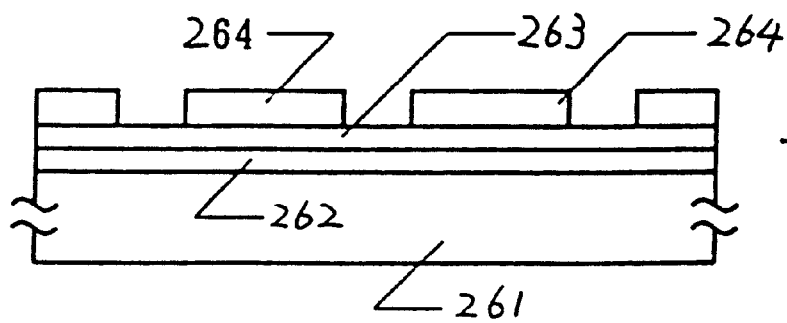
FIGS. 22(A) to 22(D) are cross-sectional views of a substrate undergoing a manufacturing process according to Example 15 of the invention.
Figure 22B:
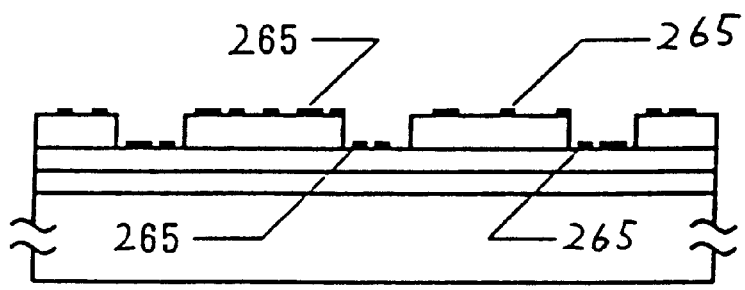
Figure 22C:
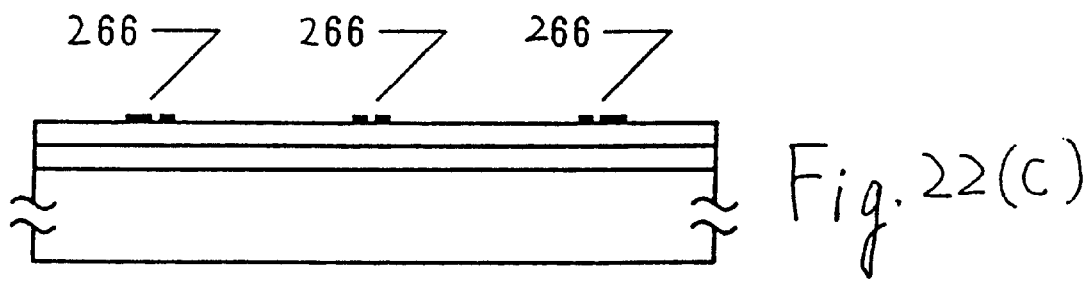
Figure 22D:
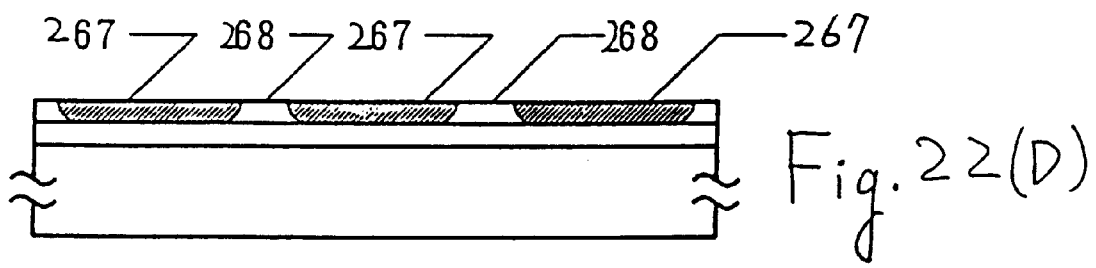

After that, hydrogen purging was carried out in a nitrogen atmosphere at 430° C. for 0.1 to 2 hours, for example 0.5 hours. Next, this was annealed in a nitrogen atmosphere in an annealing furnace at 450 to 580° C., for example 550° C., for 4 hours. FIG. 20(E) illustrates the way in which, during this annealing, as nickel diffuses from the previously formed nickel film pattern, crystallization progresses, and crystalline silicon regions 247 grow and spread throughout the amorphous region 248.

After the crystallization finished, a temperature of 400 to 600° C., for example 580° C., was maintained, trichloroethylene ($C_2HCl_3$) was diluted with hydrogen or oxygen to 1 to 10%, for example 5%, and introduced into the annealing furnace, and annealing was carried out for 0.1 to 2 hours, for example 0.5 hours. When the specimen thus chlorination treated was analyzed by secondary ion material spectrometry (SIMS), the concentration of nickel in the silicon film was 5 to 10 PPM. The concentration of nickel in a specimen on which the above chlorination treatment was not performed was as much as 0.1 to 1 atomic %.

EXAMPLE 14

A fourteenth preferred embodiment is illustrated in FIG. 21. A base silicon oxide film 252 of thickness 2000 Å was formed on a Corning 7059 glass substrate 251 by plasma CVD. The whole surface was then coated with a photoresist, and using a commonly known photolithography method a resist pattern 253 was formed. (FIG. 21(A))

Next, a nickel film 254 was deposited to a thickness of 80° by sputtering. (FIG. 21(B))

The photoresist was then removed by a commonly known method and the nickel film adhered to the top of the resist was also removed at the same time, thereby producing a nickel film pattern 255. (FIG. 21(C))

After that, an amorphous silicon film was deposited to a thickness of 1000 Å by plasma CVD. Hydrogen purging was not carried out. Next, this was annealed in a nitrogen atmosphere in an annealing furnace at 450 to 580° C., for example 550° C., for 4 hours. FIG. 21(E) illustrates the way in which, during this annealing, as nickel diffuses from the previously formed nickel film pattern, crystallization progresses, and crystalline silicon regions 256 grow and spread throughout the amorphous region 257.

After crystallization finished, a temperature of 550° C. was maintained, trichloroethylene ($C_2HCl_3$) was diluted with hydrogen or oxygen to 1 to 10%, for example 5%, and introduced into the annealing furnace, and annealing was carried out for 0.5 hours.

EXAMPLE 15

A fifteenth preferred embodiment is illustrated in FIG. 22. A base silicon oxide film 262 of thickness 2000 Å was formed on a Corning 7059 glass Substrate 261 by plasma CVD. After that, an amorphous silicon film 263 of thickness 500 Å was deposited by plasma CVD. Hydrogen purging was not carried out. The whole surface was then coated with a photoresist, and using a commonly known photolithography method a resist pattern 284 was formed. (FIG. 22(A))

Next, a nickel film 265 was deposited to a thickness of about 100 Å by electron beam vaporization. (FIG. 22(B))

The photoresist was then removed by a commonly known method and the nickel film adhered to the top of the resist was also removed at the same time, thereby producing a nickel film pattern 266. (FIG. 22(C))

Next, this was annealed in a nitrogen atmosphere in an annealing furnace at 550° C. for 4 hours. FIG. 22(E) illustrates the way in which, during this annealing, as nickel diffuses from the previously formed nickel film pattern, crystallization progresses, and crystalline silicon regions 267 grow and spread throughout the amorphous region 268.

After crystallization finished, a temperature of 500° C. was maintained, hydrogen chloride (HCL) was diluted with hydrogen or oxygen to 1 to 10%, for example 1%, and introduced into the annealing furnace, and annealing was carried out for 0.5 hours.

EXAMPLE 16

A sixteenth preferred embodiment is characterized in that a crystalline silicon film having good crystalline properties is obtained by a process in which a catalyst element which promotes the crystallization of an amorphous silicon film is introduced into an amorphous silicon film and crystallization is brought about by heating and a process in which after this first process the crystallinity is further raised by irradiation with laser light.

The manufacturing processes of this seventh preferred embodiment will be described below with reference to FIG. 23. First, on a substrate 201, a bass silicon oxide film 202 of thickness 2000 Å was formed by plasma CVD. Next, a nickel film 203 of thickness less than 1000 Å, for example 50 Å, was deposited by sputtering. The nickel film of thickness less than 100 Å was of a form which would be more accurately described as particles, or clusters of pluralities of particles joined together, than as a film. Good results were obtained when the substrate was heated to 100 to 500° C., preferably 180 to 250° C., for the formation of the nickel film. This is because the adhesion between the silicon oxide base film and the nickel film improves. A nickel silicide could have been used instead of nickel. (FIG. 23(A))

After that, hydrogen purging was carried out in an atmosphere of nitrogen at 430° C. for 0.1 to 2 hours, for example 0.5 hours. (FIG. 23(3))

Figure 23A:
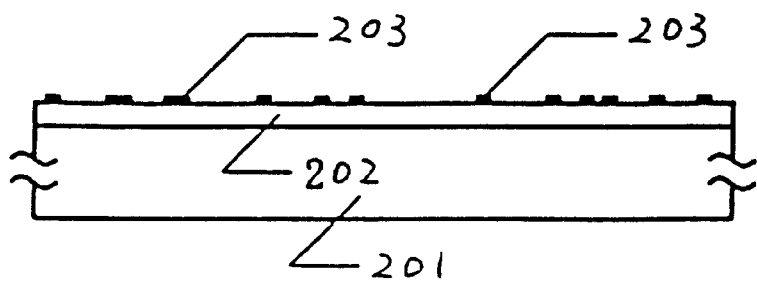
FIGS. 23(A) to 23(C) are cross-sectional views of a substrate undergoing a manufacturing process according to Example 16 of the invention.
Figure 23B:
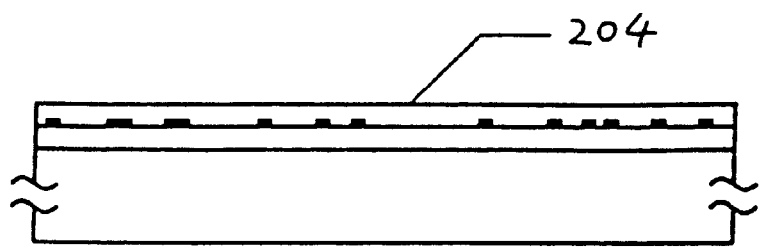
Figure 23C:
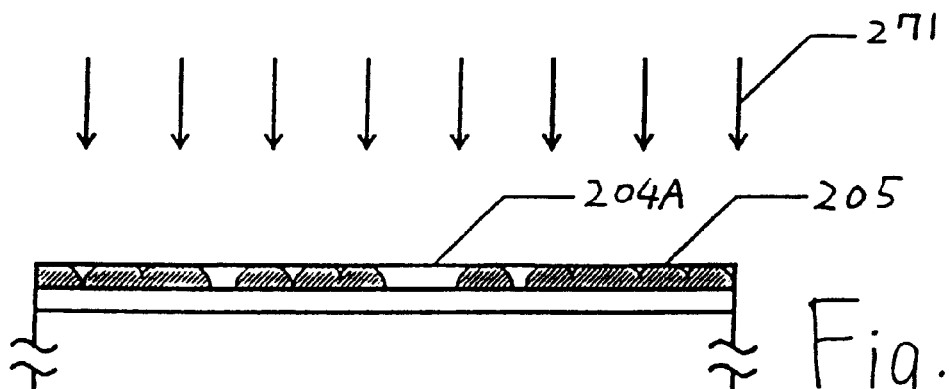

Next, this was annealed in a nitrogen atmosphere in an annealing furnace at 450 to 580° C., for example 550° C., for 8 hours. FIG. 23(C) illustrates the way in which, during this annealing, as nickel diffuses from the previously formed nickel film (particles, clusters), crystallization progresses, and crystalline silicon regions 205 grow and spread within the amorphous region 204A.

After the heat annealing was finished, annealing by irradiation with laser light 271 was carried out. For the laser light, a KrF excimer laser (wavelength 248 nm pulse width 20 nsec) was used. The laser light irradiation was performed for 2 shots at an energy density of 250 mJ/cm$^2$. The substrate was heated to 300° C. for the laser light irradiation. This is to increase the effect of the laser light irradiation.

For the laser light, an XeCl excimer laser (wavelength 308 nm), or an ArF excimer laser (wavelength 193 nm or the like can alternatively be used. Alternatively, a method based on irradiation not with laser light but rather with strong light may be employed. In particular, RTA (Rapid Thermal Annealing), which is based on short-duration irradiation with infrared light, has the advantage that it is possible to selectively heat silicon film in a short period of time.

Aster the completion of annealing by irradiation with laser light, a temperature of 400 to 600° C. for example 550° C., was maintained, trichloroethylene ($C_2HCl_3$) was diluted with hydrogen or oxygen to 1 to 10%, for example 10%, and introduced into the annealing furnace, and annealing was carried out for 0.1 to 2 hours, or example 1 hour in this way it was possible to obtain a crystalline silicon film.

When a specimen thus chlorination treated was analyzed by secondary ion material spectrometry (SIMS), the concentration of nickel in the silicon film was $1 \times 10^{18} cm^{-3}$. The concentration of nickel in a specimen on which chlorination treatment was not performed was as much as $1 \times 10^{19} cm^{-3}$.

It is possible to obtain a silicon film with good crystalline properties in the way described above. As a result of carrying out this treatment, the region 205 that had been crystallized by heat annealing became a silicon film of good crystalline quality. On the other hands although as a result of the laser irradiation a polycrystalline film was also obtained in the region 204A which had not been crystallized, and a change in the quality of the film was observed, it was found by Raman spectrometry that the crystalline quality in this region was not good. Also, examination with a transmission electron microscope revealed that whereas in the region 4A, which was crystallized by being irradiated by the laser while still uncrystallized, countless small crystals had been formed, the region 205, which was laser-irradiated after having already been crystallized, relatively large crystals with their crystals aligned in the same direction were observed.

When a silicon film 205 obtained in this way was formed into an island shape and a TFT was made, a marked improvement in performance was observed. That is, whereas in an N channel type TFT made using a silicon film crystallized according to the first preferred embodiment described above the electric field affect mobility was 40 to 60cm$^2$/Vs and the threshold voltage was 3 to 8V, in an N channel type TFT manufactured by exactly the same method but made using a silicon film obtained according to this preferred embodiment the mobility was 150 to 200cm$^2$/Vs and the threshold voltage was 0.5 to 1.5; the mobility was greatly improved, and the variation in the threshold voltage was reduced.

Although in the past it has been possible to obtain this kind of performance by crystallization of amorphous silicon films by laser crystallization alone, with conventional laser crystallization there has been wide variation in the characteristics of the silicon films obtained and there has been the problem that mass-producability has been poor because temperatures of over 400° C. and irradiation at high laser energies of over 350 mJ/cm$^2$ have been necessary for the crystallization. With respect to this point, with this preferred embodiment, because both the substrate temperature and the energy density are entirely satisfactory at lower values than these, there were no problems relating to mass-producability. Furthermore, because the variation in characteristics is about the same as that encountered with solid phase growth crystallization by conventional thermal annealing, the TFTs obtained also had uniform characteristics.

It is noted that with this invention when the concentration of the Ni was too low the crystallization of the silicon film was not satisfactory and the characteristics of the obtained TFTs were not good. However, in this preferred embodiment, because even if the crystallinity of the silicon film is unsatisfactory it can be made up for by the subsequent laser irradiation, even when the Ni concentration was low there was no deterioration in the characteristics of the TFTs. As a result of this, it is possible to further reduce the nickel concentration in the active layer regions of the device and a structure extremely favorable to the electrical stability and reliability of the device can be adopted.

EXAMPLE 17

An seventeenth preferred embodiment of the invention relates to a method in which the nickel serving as the catalyst element is introduced in the liquid phase. The manufacturing processes of this eighth preferred embodiment will be described below with reference to FIG. 24. First, a base silicon oxide film 286 of thickness 2000 Å was formed on a 10cm-square Corning 7059 glass substrate 281 by plasma CVD. After that, an amorphous silicon film 283 was deposited to a thickness of 500 Å by plasma CVD. Then, a silicon oxide film of thickness 1500 Å was formed over the whole surface, and a mask pattern 284 was formed using a commonly known photolithography method. This mask pattern 284 of silicon oxide film is for selectively introducing nickel. Resist may be used, instead of silicon oxide, for the mask pattern.

Next, a thin silicon oxide film 282 was formed by ultraviolet irradiation in an oxygen atmosphere. This silicon oxide film 282 was made by irradiation with UV light for 5 minutes in an oxygen atmosphere. The thickness of this silicon oxide film 282 is thought to be about 20 to 50 Å. This silicon oxide film is formed in order to improve the leak characteristic of a solution that is applied in a later process. In this states, 5 ml (in the case of a 10 cm square substrate) of an acetate solution made by Edding 100 ppm (weight conversion) to an acetate solution was dripped onto the specimen. Spin coating at 50 rpm was performed for 10 seconds on a spinner 280, and a water film 285, uniform over the whole surface of the substrate, was thereby formed. Then, after this state had been held for 5 minutes, spin drying at 2000 rpm for 60 seconds was carried out using the spinner 280. This holding can be performed on the spinner while the spinner is rotated at a to 150 rpm. (FIG. 24(A))

Figure 24A:
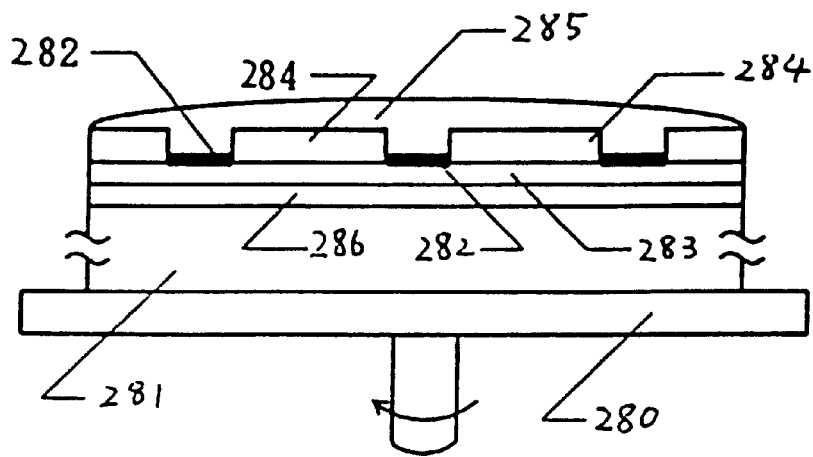
FIGS. 24(A) to 24(C) are cross-sectional views of a substrate undergoing a manufacturing process according to Example 17 of the invention.
Figure 24B:
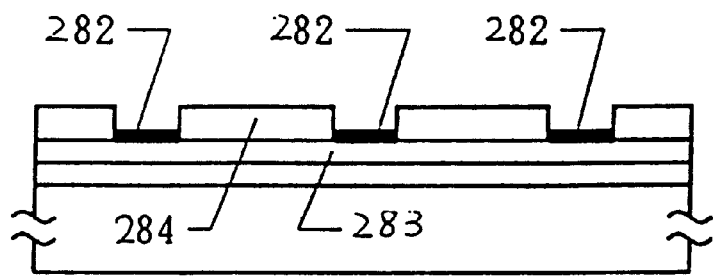

The state illustrated in FIG. 24(B) is thus obtained. This state is one in which the catalyst element nickel is in contact with the amorphous silicon film 283 through the extremely thin oxide film 282.

Next, this was annealed in an annealing furnace at 550° C. for 4 hours in a nitrogen atmosphere. At this time, nickel diffuses through the oxide film 282 into the amorphous silicon film, and crystallization progresses.

Figure 24C:
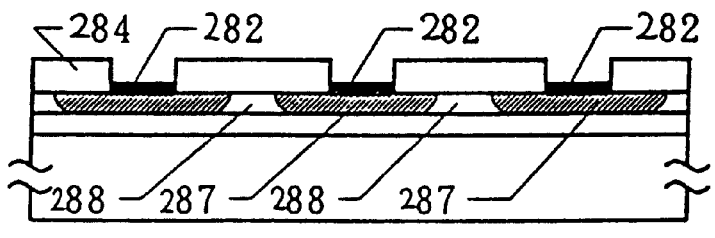

FIG. 24(C) illustrates the way in which, during this annealing, as nickel diffuses from the oxide film 282 portions, crystallization progresses, and crystalline silicon regions 287 grow and spread throughout the amorphous region 288.

After the crystallization finished, a temperature of 500° C. was maintained, hydrogen chloride (HCL) was diluted with hydrogen or oxygen to 1 to 10%, for example 1%, and introduced into the annealing furnace, and annealing was carried out for 0.5 hours.

Figure 25:
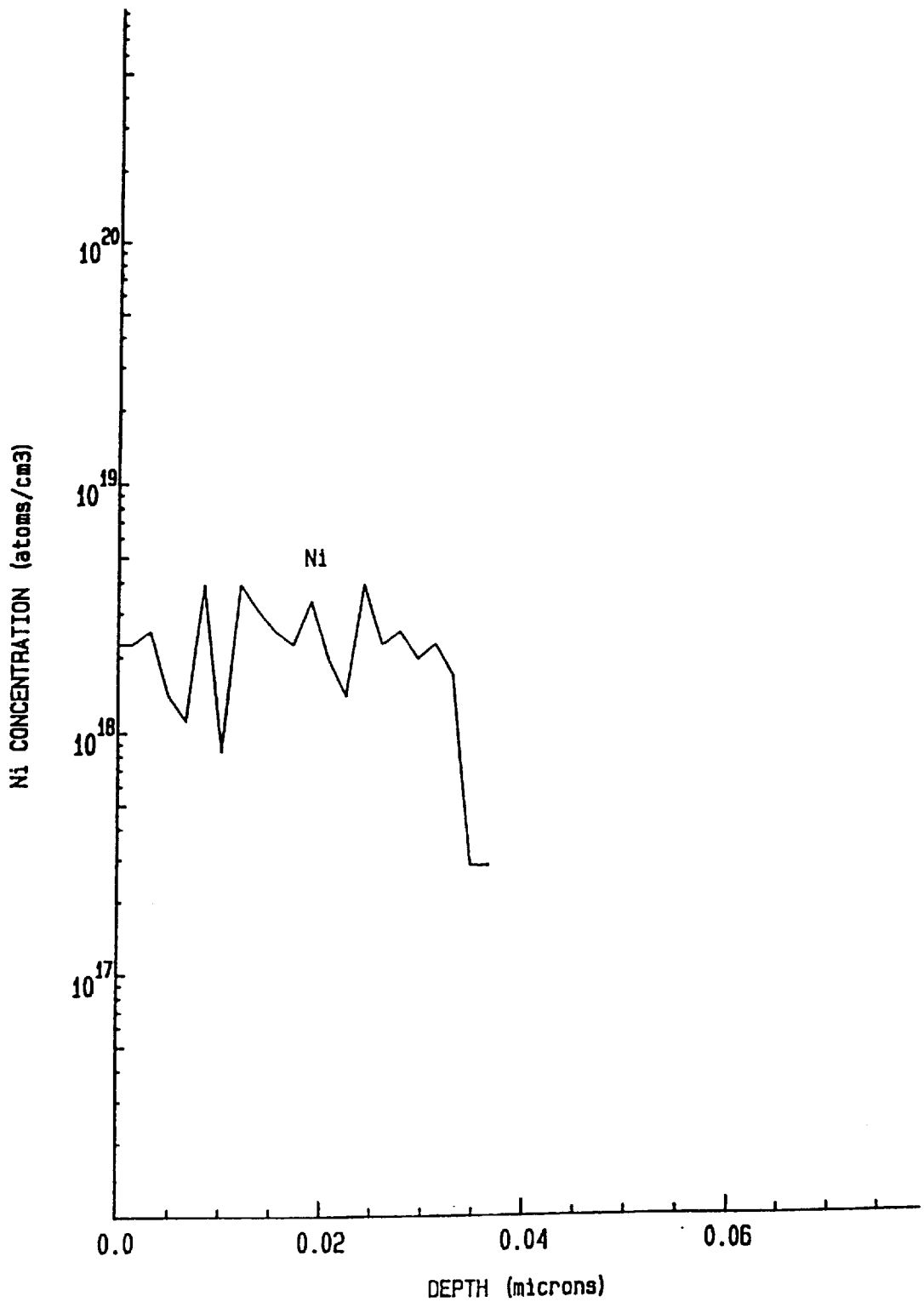
FIG. 25 is a graph illustrating the nickel concentration in a crystalline silicon film.

In this way, it was possible to obtain a crystalline silicon film. FIG. 25 shows the results of a SIMS investigation of the nickel concentration in a crystalline silicon film of which the crystallization process is finished. The region of which the nickel concentration was investigated is the region which was protected by the silicon oxide film 284 serving as mask, and is a region into which nickel was not directly introduced.

Also, It has been confirmed that the concentration of nickel in the region into which nickel was directly introduced, i.e., the region into which nickel diffused through the oxide film 282, is one order higher than the concentration distribution shown in FIG. 25. Further improving the crystallinity of a silicon film obtained in this way by irradiation with laser light or an equivalent strong light, as per the second preferred embodiment described above, is effective.

It is possible to control the nickel concentrations shown in FIG. 25 by controlling the nickel concentration in the solution. Although in this preferred embodiment the nickel concentration in the solution was set at 100 ppm, it has been found that crystallization is still possible when this concentration is set to 10 ppm. When this Ls done, the nickel concentrations shown in FIG. 25 can be further reduced by one order. However, there is the problem that when the nickel concentration in the solution is made low, the crystal growth distances becomes short.

Crystalline silicon film crystallized in the way described above can be used as it is for the active layers of TFTs. In particular, using regions in which crystal growth has taken place from the region into which nickel was introduced in a direction parallel to the substrate to form the active layers of TFTs is extremely advantageous in that their catalyst element concentration is low.

In this preferred embodiment, as the solution containing the catalyst element, acetate solution was used; however, it is possible to widen this and use water solutions or organic solvent solutions or the like. Here the catalyst element does not have to be included as a chemical compound and may alternatively be included by simple dispersion.

As the solvent which is made to contain the catalyst element, any of the polar solvents waters alcohol, acid or ammonia can alternatively be used.

In cases when nickel is used as the catalyst and this nickel is to be included in a polar solvent, the nickel is introduced in the form of a chemical compound of nickel. As this nickel compound, nickel compounds chosen from among for example nickel bromide, nickel acetate, nickel oxalate, nickel carbonate, nickel chloride, nickel iodide, nickel nitrate, nickel sulfate, nickel formate, nickel acetylacatonate, 4-cyclohexyl butyric acid nickel, nickel oxide and nickel hydroxide can be used.

Also, as the solvent, any of the non-polar solvents benzene, toluene, xylenes carbon tetrachloride, chloroform and ether can be used.

In this case, nickel is introduced as a chemical compound of nickel. As this nickel compound, nickel compounds chosen from among for example nickel acetylacetonate and 2-ethyl hexanoic acid nickel can be used.

The addition of a detergent to the solution containing the catalyst element is beneficial. This is because it raises the adhesion with the surface that is coated and controls the adsorbency. This detergent may be coated in advance onto the surface that is to be coated. When simple nickel is used as the catalyst element, it is necessary for the nickel to be first made into a solution by dissolving in acid.

That which is discussed above is an example in which a solution made by dissolving the catalyst element nickel completely is used; however, an emulsion-like substance in which a powder consisting of simple nickel or a compound of nickel is uniformly dispersed in a dispersion medium may alternatively be used instead of completely dissolving the nickel. Alternatively, a solution for forming oxide films can be used. As this kind of solution, OCD (Ohka Diffusion Source), made by Tokyo Ohka Chemical Industries Co., Ltd., can be used. By coating this OCD onto a non-crystalline silicon film and baking it at about 200° C., a silicon oxide film cam be formed simply. A catalyst element can then be caused to diffuse from this silicon oxide film into the non-crystalline silicon film.

It is noted that these points also apply to cases where a material other than nickel is used as the catalyst element.

Also, by using a non-polar solvent such as a toluene solution of 2-ethyl hexanoic acid nickel as the solution it is possible to coat the solution directly onto the surface of the amorphous silicon. In this case it is beneficial that a material like an adhesive used in the application of resist be applied in advance. However, because when the amount applied is too great this can have the reverse effect of obstructing the addition of the catalyst element to the amorphous silicon film, caution is necessary.

The quantity of the catalyst element to be included in the solution depends on the type of solution, but as a general rule it is desirable that the quantity of nickel with respect to the solution be 1 ppm to 200 ppm, and preferably 1 ppm to 50 ppm (weight conversion). This is a value determined in consideration of the nickel concentration and resistance to fluoric acid of the film after crystallization is finished.

EXAMPLE 18

An example of positional relation among a crystallized region, an active layer (channel region) of a TFT, a contact hole, and a region to which a catalytic element is added in forming the TFT according to the present invention is described in this EXAMPLE 18. A pixel part of an active-matrix is described below.

Figure 26A:
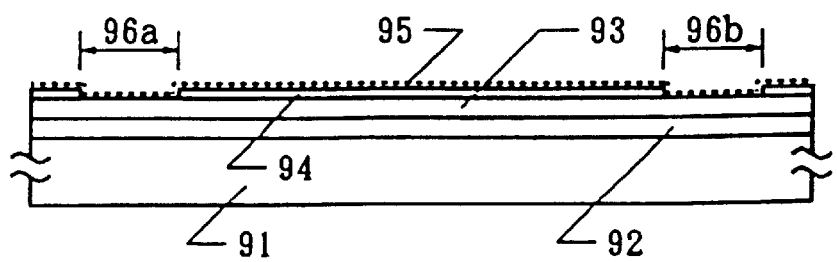
FIGS. 26(A) to 26(F) are cross-sectional views of a substrate undergoing a manufacturing process according to Example 18 of the invention.

FIGS. 26(A) to 26(F) show steps for manufacturing a TFT of this example. At first, as shown in FIG. 26(A), a silicon oxide bass film 92 is deposited on a substrate 91 to a thickness of 2000 Å by sputtering. Further, an amorphous silicon film 93 is deposited to a thickness of 300 to 1500 Å, e.g. 800 Å, by plasma CVD. A silicon oxide film 94 of 200 to 2000 Å, e.g. 300 Å, is formed and perforated to form holes 96a and 96b. Thus, the silicon oxide film 94 is patterned into a mask. Then, an extremely thin nickel or nickel compound film 95 is formed on the entire surface by sputtering or spin coating as employed in Example 9.

Figure 26B:
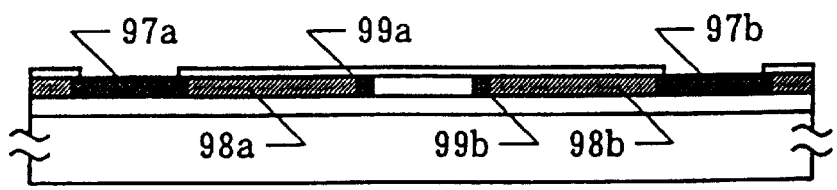
Figure 26C:
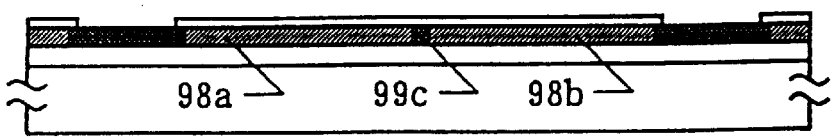

Next, annealing is performed in a nitrogen atmosphere at 550° C. for 4 hours. By this step, portions 97a and 97b of the silicon film 93 located just under the holes 96a and 96b is changed into a silicide, and silicon regions 98a and 98b are crystallized from the portions. The ending portions have a high nickel concentration. FIG. 26(B))

After sufficient crystallization, crystallization proceeding from the holes 96a and 96b collides with each other at a midway therebetween and stops at the midway. A region 99a having a high nickel concentration remains at the midway. A photo anneal may be further performed in this condition by an excimer laser and the like as employed in Example 8. (FIG. 26(C))

Figure 26D:
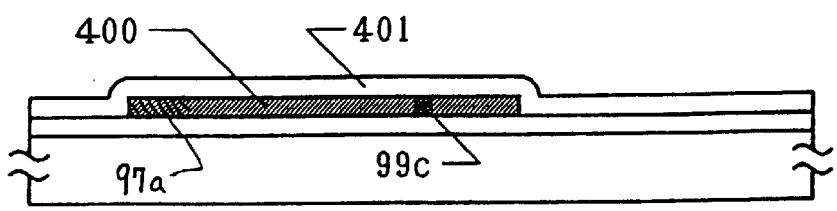

Next, the crystalline silicon film thus obtained is patterned to form an island silicon region 400 as shown in FIG. 26(D). A portion of high nickel concentration regions 97a and 99c remains in the silicon region 400. Further, a silicon oxide gate insulating film 401 of 700 to 2000 Å, e.g. 1200Å, in thickness is formed by plasma CVD. (FIG. 26(D))

Figure 26E:
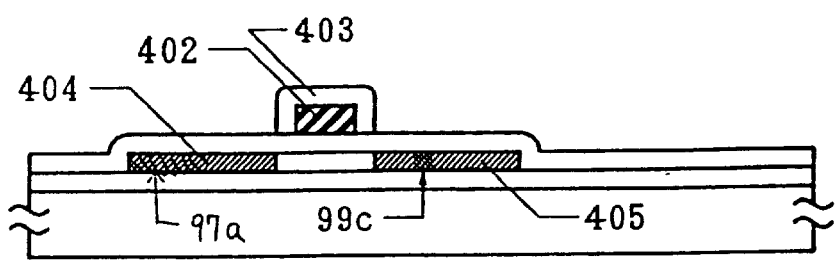
Figure 26F:
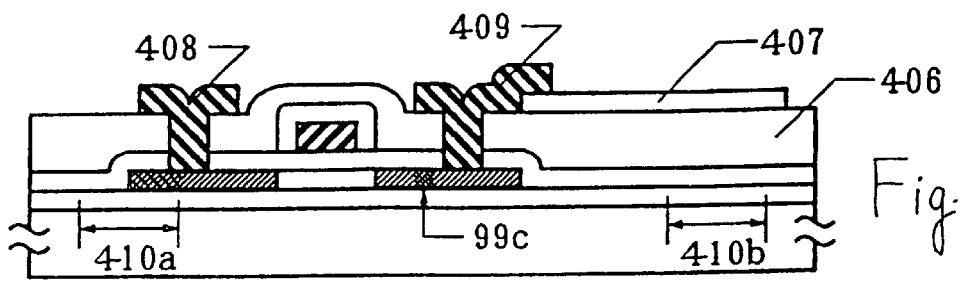
Figure 1A:
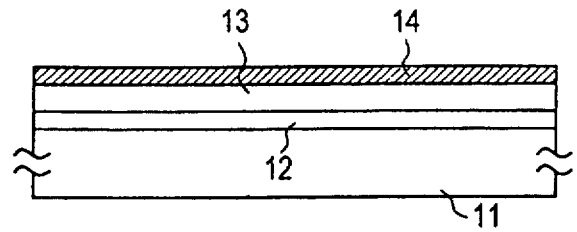
Figure 1B:
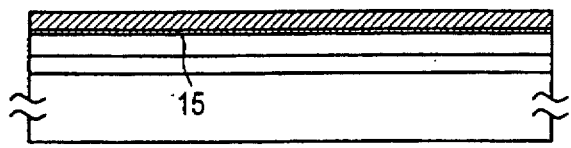
Figure 1C:
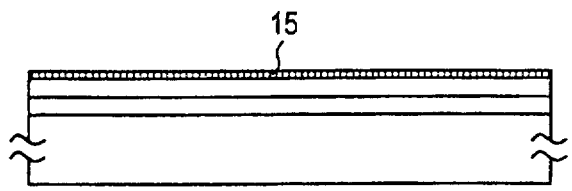
Figure 1D:
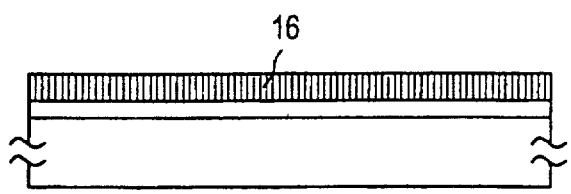
Figure 2A:
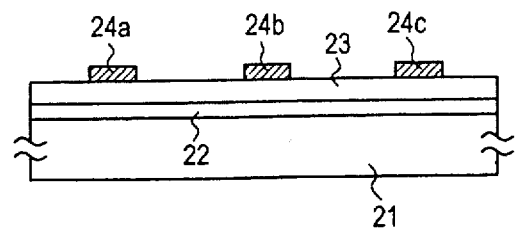
Figure 2B:
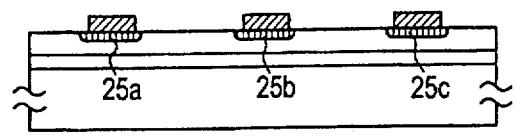
Figure 2C:
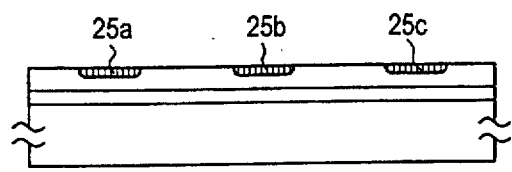
Figure 2D:
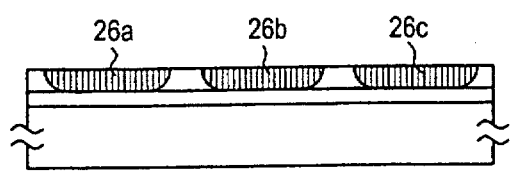
Figure 2E:
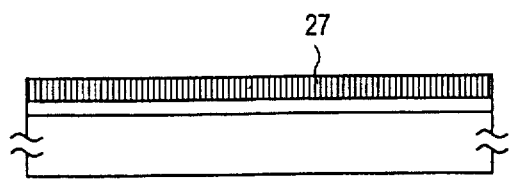
Figure 3:
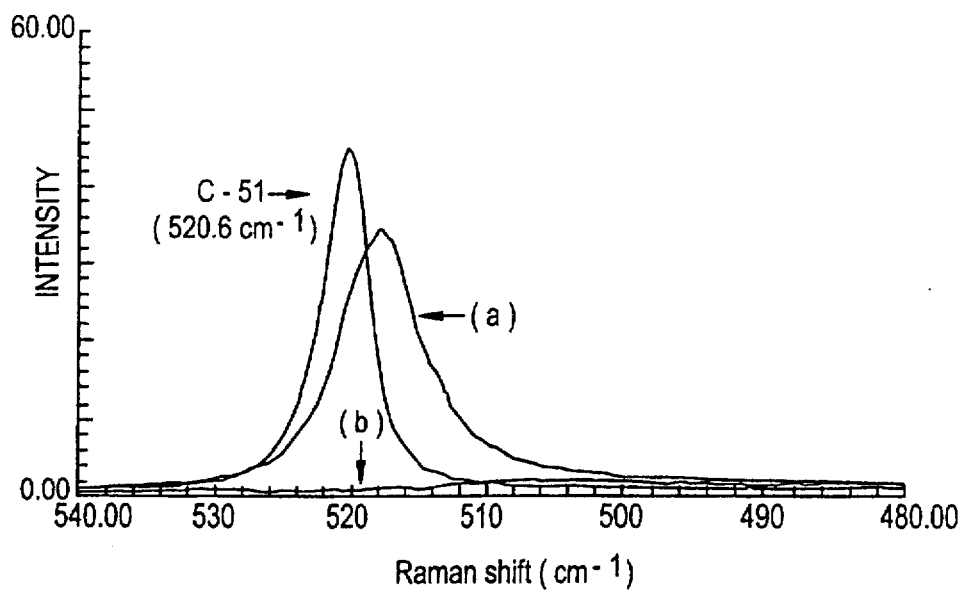
Figure 4:
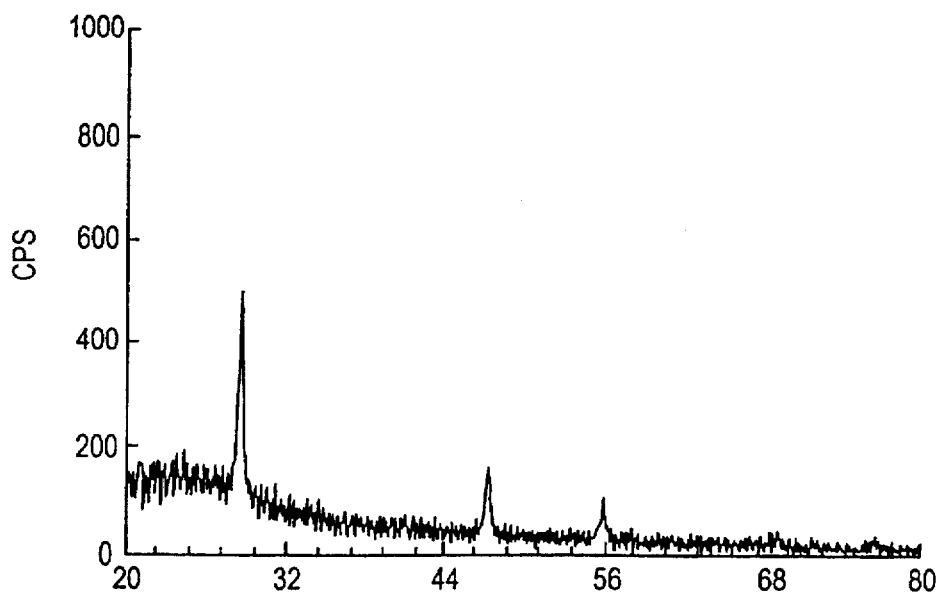
Figure 5:
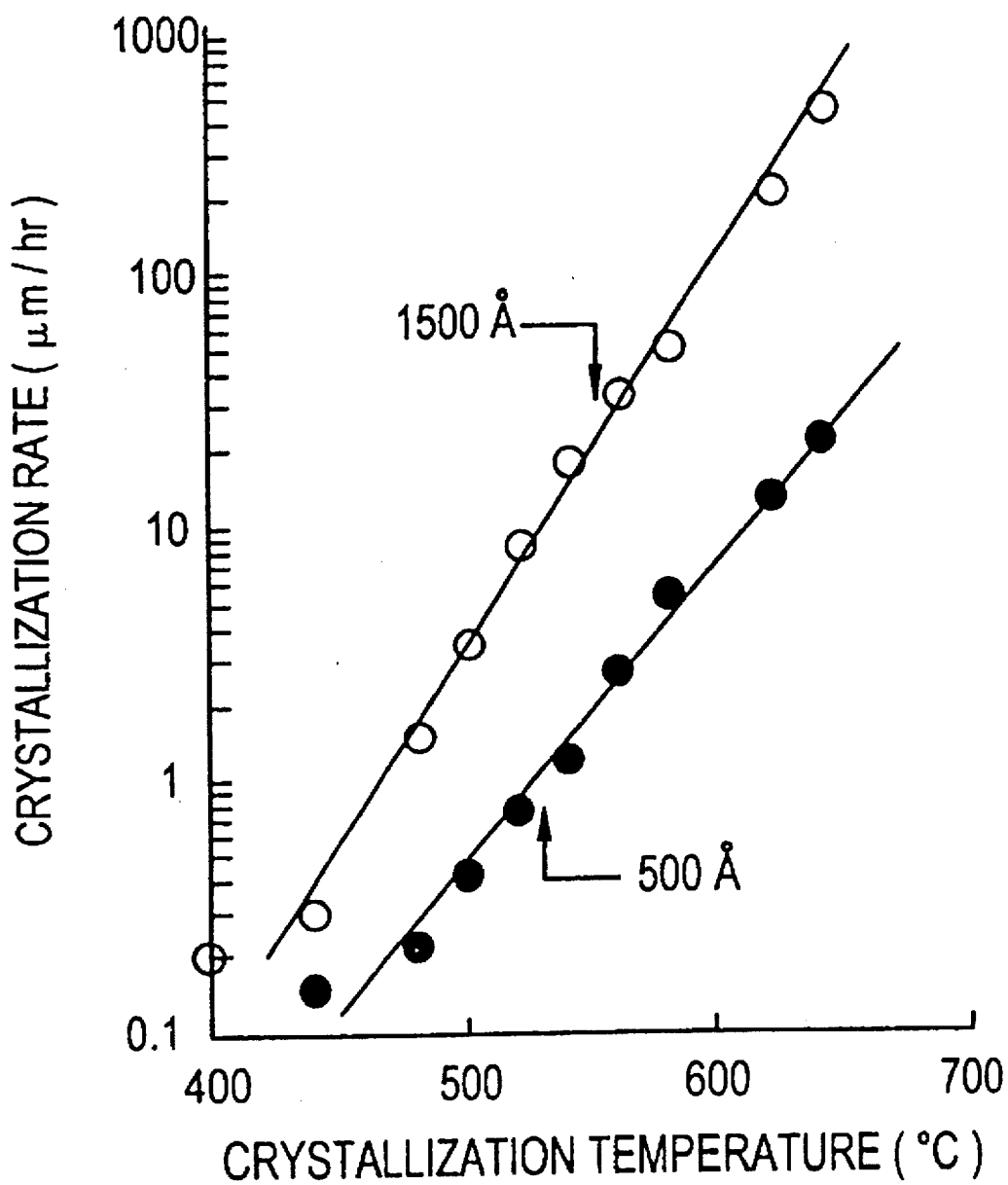
Figure 6A:
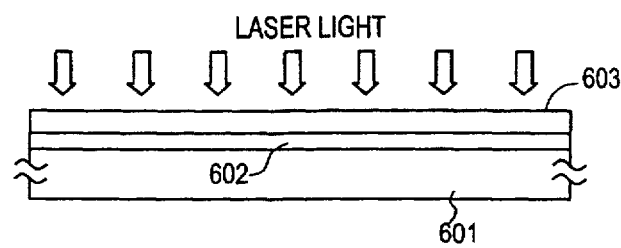
Figure 6B:
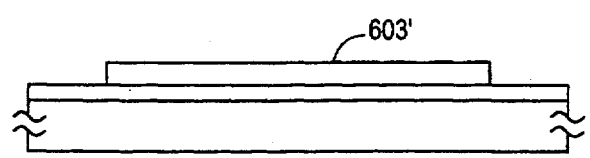
Figure 6C:
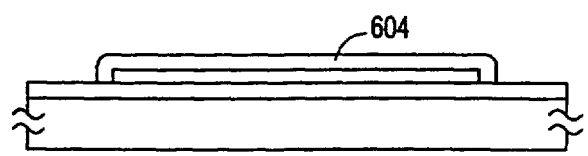
Figure 6D:
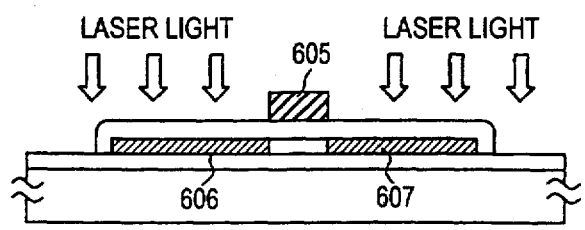
Figure 6E:
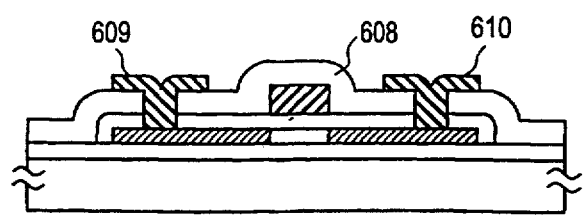
Figure 7A:
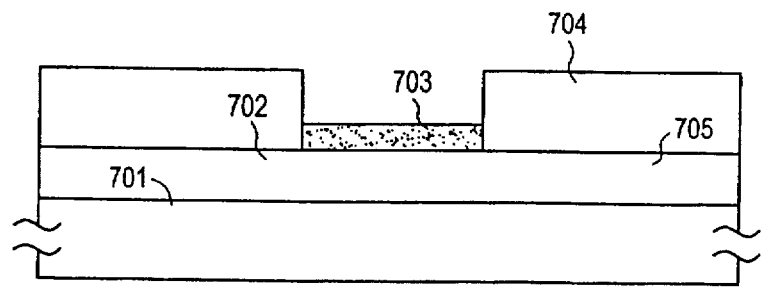
Figure 7B:
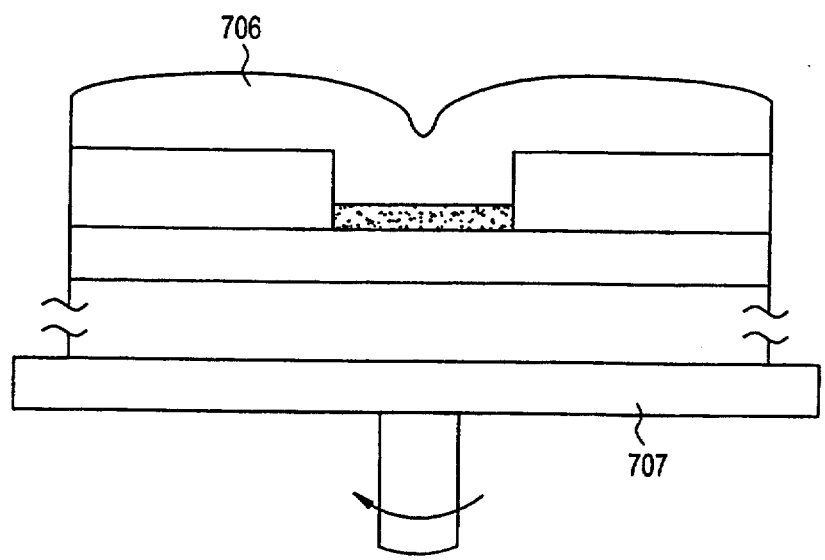
Figure 7C:
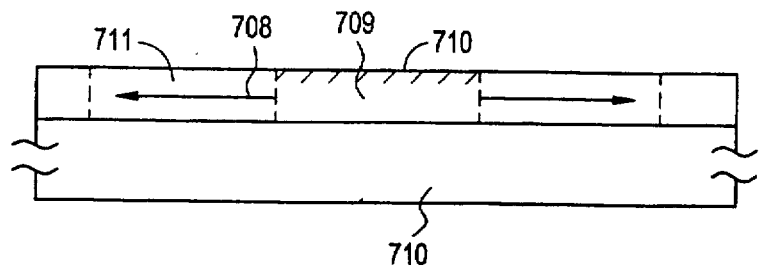
Figure 8A:
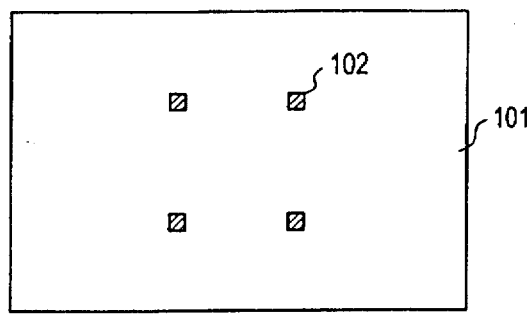
Figure 8B:
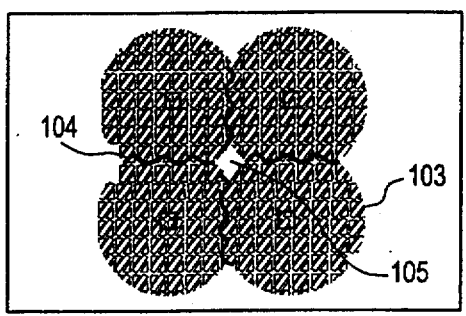
Figure 8C:
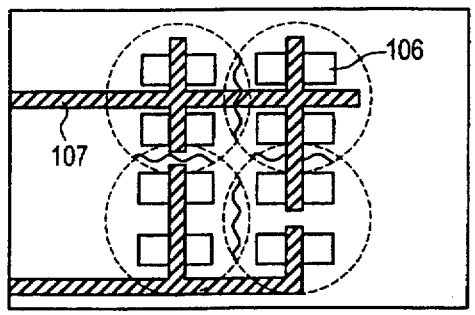

Thereafter, an aluminum gate electrode 402 is formed by the same means as in Example 5. An anodic oxide 403 having a thickness of 1000 to 5000 Å is formed around the gate electrode. Then, N-type impurity regions 404 and 405 are formed by diffusing an impurity by ion doping method. The gate electrode should be located so that the high nickel concentration regions 97a and 99c be located out of the portion (the channel region) located just under the gate electrode as shown In FIG. 26(E)

After doping, the source and drain are activated by laser light irradiation. Further, an interlayer insulator 406 is deposited, and a transparent conductive film having a thickness of 500 to 1500 Å, e.g. 800 Å, is formed by sputtering and patterned by etching to form a pixel electrode 407. Further, contact holes are formed in the interlayer insulator 406, and metallic electrodes 408 and 409 are formed to the source and drain to complete the TFT.

It is desirable to form the contact holes apart from the high nickel concentration regions. 97a and 99c. This can be realized by designing the contact holes so that the contact holes does not overlap the holes 96a and 96b for adding nickel. Otherwise, a defective contact would readily be formed by the overetch of the silicon film during the formation of the contact holes because the high nickel concentration regions are readily etched by a solution containing hydrogen fluoride group as compared with the silicon film containing no nickel. In the drawing, the contact on the left side partly overlaps the high nickel concentration region 97a. It is desirable that at least a portion of the electrode is in contact with a region other than the region to which nickel is added.

As described above, this invention is revolutionary in the sense that it provides a way of advancing the use of low temperatures and short time periods in the crystallization of amorphous silicon; also, because the equipment, apparatus and techniques used to achieve this are both extremely ordinary and highly suited to mass-production, the potential benefits of the invention to industry are enormous.

For example, whereas in the conventional solid phase growth method, because annealing for at least 24 hours was held to be necessary, if the substrate treatment time for one sheet of substrate was 2 minutes then as many as 15 annealing furnaces were necessary, with this invention, because the time required for annealing can be reduced to less then 4 hours, the number of annealing furnaces can be cut down to less than ⅙ of the number that were required before. The improvement in productivity and reductions in capital investment in equipment that result from this lead to reductions in substrate treatment costs and hence to reductions in TFT prices and to consequent stimulation of crash demand for TFTs. This invention is thus of industrial value and is worthy to receive a patent.

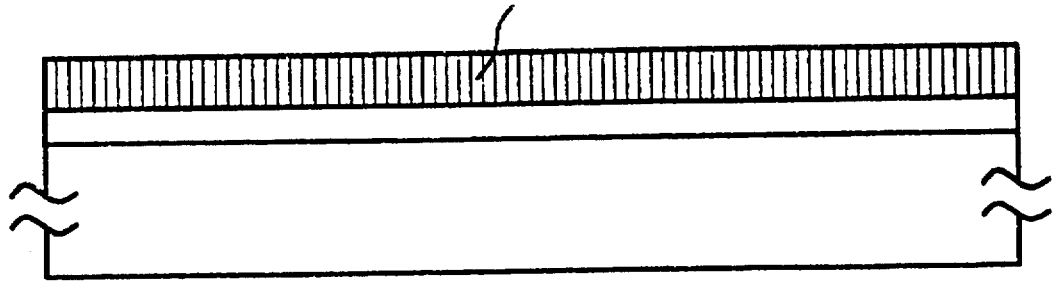

What is claimed is:

1. A method for fabricating a semiconductor device comprising the steps of:

forming a semiconductor film comprising silicon on a substrate;

disposing a catalytic material in contact with said semiconductor film, said catalytic material being capable of promoting crystallization of said semiconductor film;

heating said semiconductor film provided with said catalytic material in order to crystallize said semiconductor film; and annealing the semiconductor film after said heating in order to remove at least a portion of said catalytic material contained in said semiconductor film, wherein said catalytic material comprises a metal selected from the group consisting of nickel, iron, cobalt, platinum and palladium.

2. The method of claim 1 wherein said semiconductor film is substantially amorphous before said heating.

3. The method of claim 1 wherein the substrate comprises a glass and said heating is conducted at a temperature lower than a transition point of said glass.

4. The method of claim 1 wherein said heating step is carried out at a temperature of 450 to 650° C.

5. A method for fabricating a semiconductor device comprising the steps of:

forming an amorphous semiconductor film on a substrate;

disposing a catalytic material in contact with said amorphous semiconductor film, said catalytic material being capable of promoting crystallization of said semiconductor film;

heating said amorphous semiconductor film provided with said catalytic material in order to crystallize said semiconductor film; and annealing said semiconductor film after said heating in order to remove at least a portion of said catalytic material contained in said semiconductor film, wherein said catalytic material comprises a metal selected from the group consisting of nickel, iron, cobalt, platinum and palladium.

6. The method of claim, 5 wherein the substrate comprises a glass and said heating is conducted at a temperature lower than a transition point of said glass.

7. The method of claim 5 wherein said heating step is carried out at a temperature of 450 to 650° C.

8. The method of claim 1 wherein said annealing is conducted at a temperature in a range of 450–650° C.

9. The method of claim 1 wherein said catalytic material comprises a silicide of said metal.

10. The method of claim 1 wherein said catalytic material comprises a compound including said metal.

11. The method of claim 1 wherein said catalytic material is in the form of a film, particles, or clusters.

12. The method of claim 1 wherein said annealing is conducted in a gas comprising a chloride.

13. The method of claim 12 wherein said chloride is selected from the group consisting of $CH_3Cl$, $CH_2Cl_2$, $CHCl_3$, $C_2H_5Cl$, $C_2H_4Cl_2$, $C_2H_3Cl_3$, $C_2H_2Cl_4$, $C_5HCl_5$, $C_2H_3Cl$, $C_2H_2Cl_2$, $C_2HCl_3$ and $C_2HCl_3$.

14. The method of claim 1 wherein said semiconductor film after said heating has a polycrystal structure.

15. The method of claim 1 wherein said semiconductor device is a thin film transistor having a channel region comprising said semiconductor film.

16. The method of claim 5 wherein said annealing is conducted at a temperature in a range of 450–650° C.

17. The method of claim 5 wherein said catalytic material comprises a silicide of said metal.

18. The method of claim 5 wherein said catalytic material comprises a compound including said metal.

19. The method of claim 5 wherein said catalytic material is in the form of a film, particles, or clusters.

20. The method of claim 5 wherein said annealing is conducted in a gas comprising a chloride.

21. The method of claim 20 wherein said said chloride is selected from the group consisting of $CH_3Cl$, $CH_2Cl_2$, $CHCl_3$, $C_2H_5Cl$, $C_2H_4Cl_2$, $C_2H_3Cl_3$, $C_2H_2Cl_4$, $C_5HCl_5$, $C_2H_3Cl$, $C_2H_2Cl_2$, $C_2HCl_3$ and $C_2HCl_3$.

22. The method of claim 5 wherein said semiconductor film after said heating has a polycrystal structure.

23. The method of claim 5 wherein said semiconductor device is a thin film transistor having a channel region comprising said semiconductor film.

24. A method for fabricating a semiconductor device comprising the steps of:

forming an amorphous semiconductor film on a substrate by a CVD method;

disposing a catalytic material in contact with said semiconductor film, said catalytic material being capable of promoting crystallization of said semiconductor film;

heating said amorphous semiconductor film provided with said catalytic material in order to crystallize said semiconductor film; and annealing said semiconductor film after said heating in an atmosphere containing chlorine containing gas in order to remove at least a portion of said catalytic material contained in said semiconductor film, wherein said catalytic material comprises a metal selected from the group consisting of nickel, iron, cobalt, platinum and palladium.

25. The method of claim 24 wherein a proportion of said chlorine containing gas with respect to said atmosphere is from 1 to 10%.

26. The method of claim 24 wherein said CVD method is a plasma CVD.

27. The method of claim 24 wherein the substrate comprises a glass and said heating is conducted at a temperature lower than a transition point of said glass.

28. The method of claim 24 wherein said heating step is carried out at a temperature of 450 to 650° C.

29. The method of claim 24 wherein said annealing is conducted at a temperature in a range of 450–650° C.

30. The method of claim 24 wherein said catalytic material comprises a silicide of said metal.

31. The method of claim 24 wherein said catalytic material comprises a compound including said metal.

32. The method of claim 24 wherein said catalytic material is in the form of a film, particles, or clusters.

33. The method of claim 24 wherein said chlorine containing gas comprises hydrogen chloride.

34. The method of claim 24 wherein said chlorine containing gas comprises a material selected from the group consisting of $CH_3Cl$, $CH_2Cl_2$, $CHCl_3$, $C_2H_5Cl$, $C_2H_4Cl_2$, $C_2H_3Cl_3$, $C_2H_2Cl_4$, $C_5HCl_5$, $C_2H_3Cl$, $C_2H_2Cl_2$, $C_2HCl_3$ and $C_2HCl_3$.

35. The method of claim 24 wherein said semiconductor film after said heating has a polycrystal structure.

36. The method of claim 24 wherein said semiconductor device is a thin film transistor having a channel region comprising said semiconductor film.

37. A method for fabricating a semiconductor device comprising the steps of:

forming a semiconductor film comprising silicon on a substrate by a CVD method;

disposing a catalytic material in contact with said semiconductor film, said catalytic material being capable of promoting crystallization of said semiconductor film; and heating said semiconductor film provided with said catalytic material in order to crystallize said semiconductor film;

irradiating said semiconductor film with light in order to further crystallize said semiconductor film after said heating, wherein said method further comprises a step of annealing said semiconductor film in an atmosphere including a chlorine containing gas after said heating in order to remove at least a portion of said catalytic material contained in said semiconductor film, wherein said catalytic material comprises a metal selected from the group consisting of nickel, iron, cobalt, platinum and palladium.

38. The method of claim 37 wherein a proportion of said chlorine containing gas with respect to said atmosphere is from 1 to 10%.

39. The method of claim 37 wherein said CVD method is a plasma CVD.

40. The method of claim 37 wherein the substrate comprises a glass and said heating is conducted at a temperature lower than a transition point of said glass.

41. The method of claim 37 wherein said heating step is carried out at a temperature of 450 to 650° C.

42. The method of claim 37 wherein said annealing is conducted at a temperature in a range of 450–650° C.

43. The method of claim 37 wherein said catalytic material comprises a silicide of said metal.

44. The method of claim 37 wherein said catalytic material comprises a compound including said metal.

45. The method of claim 37 wherein said catalytic material is in the form of a film, particles, or clusters.

46. The method of claim 37 wherein said chlorine containing gas comprises hydrogen chloride.

47. The method of claim 37 wherein said chlorine containing gas comprises a material selected from the group consisting of $CH_3Cl$, $CH_2Cl_2$, $CHCl_3$, $C_2H_5Cl$, $C_2H_4Cl_2$, $C_2H_3Cl_3$, $C_2H_2Cl_4$, $C_5HCl_5$, $C_2H_3Cl$, $C_2H_2Cl_2$, $C_2HCl_3$, and $C_2HCl_3$.

48. The method of claim 37 wherein said semiconductor film after said heating has a polycrystal structure.

49. The method of claim 37 wherein said semiconductor device is a thin film transistor having a channel region comprising said semiconductor film.

50. The method of claim 37 wherein said irradiating is carried out by using laser.

51. The method of claim 37 wherein said irradiating is carried out by rapid thermal annealing.

52. The method of claim 37 wherein said atmosphere includes an oxygen gas.

53. The method of claim 37 wherein said atmosphere includes a hydrogen gas.

54. A method for fabricating a semiconductor device comprising the steps of:

forming a semiconductor film comprising silicon on a substrate by CVD method;

disposing a catalytic material in contact with only a selected region of said semiconductor film, said catalytic material being capable of promoting crystallization of said semiconductor film;

heating said semiconductor film provided with said catalytic material in order to crystallize said semiconductor film wherein crystals grow through another region of said semiconductor film adjacent to said selected region in a direction parallel with a surface of said substrate; and annealing said semiconductor film in an atmosphere including a chlorine containing gas after said heating in order to remove at least a portion of said catalytic material contained in said semiconductor film.

55. The method of claim 54 wherein said atmosphere includes an oxygen gas.

56. The method of claim 54 wherein said atmosphere includes a hydrogen gas.

57. A method for fabricating a semiconductor device comprising the steps of:

forming a semiconductor film comprising silicon on a substrate;

disposing a catalytic material in contact with only a selected region of said semiconductor film, said catalytic material being capable of promoting crystallization of said semiconductor film;

heating said semiconductor film provided with said catalytic material in order to crystallize said semiconductor film wherein crystals grow through another region of said semiconductor film adjacent to said selected region in a direction parallel with a surface of said substrate; and irradiating said semiconductor film with light in order to further crystallize said semiconductor film after said heating, wherein said method further comprises a step of annealing said semiconductor film after said heating in order to remove at least a portion of said catalytic material contained in said semiconductor film and wherein said catalytic material comprises a metal selected from the group consisting of nickel, iron, cobalt, platinum and palladium.

58. The method of claim 57 wherein said light is a laser light.

59. The method of claim 57 wherein said irradiating is RTA.

60. The method of claim 54 wherein said CVD method is a plasma CVD.

* * * * *

UNITED STATES PATENT AND TRADEMARK OFFICE
CERTIFICATE OF CORRECTION

PATENT NO.   :   5,897,347
DATED        :   April 27, 1999
INVENTOR(S)  :   Shunpei YAMAZAKI et al.

It is certified that error appears in the above-identified patent and that said Letters Patent is hereby corrected as shown below:

On the title page, item
[30]     Foreign Application Priority Data

Feb. 15, 1993   [JP]   Japan .................... 5-48531
Feb. 15, 1993   [JP]   Japan .................... 5-48533
Feb. 15, 1993   [JP]   Japan .................... 5-48535

Signed and Sealed this

Second Day of May, 2000

Attest:

Q. TODD DICKINSON

*Attesting Officer*               *Director of Patents and Trademarks*

UNITED STATES PATENT AND TRADEMARK OFFICE
CERTIFICATE OF CORRECTION

PATENT NO. : 5,897,347  
DATED : April 27, 1999  
INVENTOR(S) : Yamazaki et al.

Page 1 of 23

It is certified that error appears in the above-identified patent and that said Letters Patent is hereby corrected as shown below:

The title page should be deleted to appear as per attached title page.

Please delete drawing sheets 1-22 and substitute drawing sheets 1-22 as per attached.

Signed and Sealed this

Twentieth Day of November, 2001

Attest:

*Attesting Officer*

NICHOLAS P. GODICI  
*Acting Director of the United States Patent and Trademark Office*

United States Patent [19]

Yamazaki et al.

[11] Patent Number: 5,897,347
[45] Date of Patent: *Apr. 27, 1999

[54] SEMICONDUCTOR, SEMICONDUCTOR DEVICE, AND METHOD FOR FABRICATING THE SAME

[75] Inventors: Shunpei Yamazaki, Tokyo; Yasuhiko Takemura, Kanagawa; Hongyong Zhang, Kanagawa; Toru Takayama, Kanagawa; Hideki Uochi, Atsugi, all of Japan

[73] Assignee: Semiconductor Energy Laboratory Co., Ltd., Kanagawa, Japan

[*] Notice: This patent issued on a continued prosecution application filed under 37 CFR 1.53(d), and is subject to the twenty year patent term provisions of 35 U.S.C. 154(a)(2).

This patent is subject to a terminal disclaimer.

[21] Appl. No.: 08/718,895

[22] Filed: Sep. 24, 1996

Related U.S. Application Data

[62] Division of application No. 09/196,856, Feb. 15, 1994, Pat. No. 5,639,698.

[30] Foreign Application Priority Data

| Feb. 15, 1993 | [JP] | Japan | 5-48531 |
| Feb. 15, 1993 | [JP] | Japan | 5-48533 |
| Feb. 15, 1993 | [JP] | Japan | 5-485354 |

[51] Int. Cl.$^6$ .................. H01L 21/00; H01L 21/322
[52] U.S. Cl. .......................... 438/166; 438/477
[58] Field of Search .................. 437/10, 11, 13, 437/40; 148/DIG. 1, DIG. 3, DIG. 16, DIG. 24, DIG. 60-61, DIG. 91-93; 117/8, 930; 438/166, 477

[56] References Cited

U.S. PATENT DOCUMENTS

| Re. 28,385 | 4/1975 | Mayer | 437/13 |
| Re. 28,386 | 4/1975 | Heiman et al. | 437/13 |
| 3,783,049 | 1/1974 | Sandera | 437/142 |
| 4,231,809 | 11/1980 | Schmidt | 437/13 |
| 5,010,037 | 4/1991 | Lin et al. | 117/930 |

(List continued on next page.)

FOREIGN PATENT DOCUMENTS

| 62-33417 | 2/1987 | Japan | 117/930 |
| 2140915 | 5/1990 | Japan | 437/21 |
| 5-58789 | 3/1993 | Japan | 117/930 |
| 5-190020 | 11/1993 | Japan | 117/930 |

OTHER PUBLICATIONS

C. Hayzelden et al., "*In Situ* Transmission Electron Microscopy Studies of Silicide-Mediated Crystallization of Amorphous Silicon" (3 pages).

A.V. Dvurechenskii et al., "Transport Phenomena in Amorphous Silicon Doped by Ion Implantation of 3d Metsls", *Akademikian Lavrentev Prospekt* 13, 630090 Novosibirsk 90, USSR, pp. 635–640.

T. Hempel et al., "Needle–Like Crystallization of Ni Doped Amorphous Silicon Thin Films", *Solid State Communications*, vol. 85, No. 11, pp. 921–924, 1993.

(List continued on next page.)

Primary Examiner—Jey Tsai
Assistant Examiner—Michael S. Lebentritt
Attorney, Agent, or Firm—Sixbey, Friedman, Leedom & Ferguson, P.C.; Gerald J. Ferguson, Jr.; Jeffrey L. Costellia

[57] ABSTRACT

Method of fabricating semiconductor devices such as thin-film transistors by annealing a substantially amorphous silicon film at a temperature either lower than normal crystallization temperature of amorphous silicon or lower than the glass transition point of the substrate so as to crystallize the silicon film. Islands, stripes, lines, or dots of nickel, iron cobalt, or platinum, silicide, acetate, or nitrate of nickel, iron, cobalt, or platinum, film containing various salts, particles, or clusters containing at least one of nickel, iron, cobalt, and platinum are used as starting materials for crystallization. These materials are formed on or under the amorphous silicon film.

60 Claims, 22 Drawing Sheets